(12) United States Patent
Nakamura et al.

(10) Patent No.: US 6,956,766 B2
(45) Date of Patent: Oct. 18, 2005

(54) MAGNETIC CELL AND MAGNETIC MEMORY

(75) Inventors: Shiho Nakamura, Kanagawa-ken (JP); Shigeru Haneda, Kanagawa-ken (JP); Yuichi Ohsawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 33 days.

(21) Appl. No.: 10/721,549

(22) Filed: Nov. 26, 2003

(65) Prior Publication Data

US 2004/0165425 A1 Aug. 26, 2004

(30) Foreign Application Priority Data

Nov. 26, 2002 (JP) ........................................ 2002-342447

(51) Int. Cl.⁷ .............................................. G11C 11/14
(52) U.S. Cl. .......................... 365/171; 365/158; 365/173
(58) Field of Search ................................ 365/171, 158, 365/145, 173

(56) References Cited

U.S. PATENT DOCUMENTS

| | | | | |
|---|---|---|---|---|
| 5,695,864 A | | 12/1997 | Slonczewski | 428/212 |
| 6,285,581 B1 | * | 9/2001 | Tehrani et al. | 365/173 |
| 6,469,926 B1 | | 10/2002 | Chen | 365/158 |
| 6,603,677 B2 | * | 8/2003 | Redon et al. | 365/158 |
| 6,639,830 B1 | * | 10/2003 | Heide | 365/158 |
| 6,714,444 B2 | * | 3/2004 | Huai et al. | 365/171 |

OTHER PUBLICATIONS

F. J. Albert, et al., Applied Physics Letters, vol. 77, No. 23, pp. 3809–3811, "Spin–Polarized Current Switching of a Co Thin Film Nanomagnet", Dec. 4, 2000.

J. Grollier, et al., Applied Physics Letters, vol. 78, No. 23, pp. 3663–3665, "Spin–Polarized Current Induced Switching in Co/Cu/Co Pillars", Jun. 4, 2001.

U.S. Appl. No. 10/401,865, filed Mar. 31, 2003, Nakamura et al.

U.S. Appl. No. 10/954,099, filed Sep. 30, 2004, Nakamura et al.

U.S. Appl. No. 10/901,325, filed Jul. 29, 2004, Saito et al.

"Novel Multilayer Configuration For Experiments of Spin Precession Induced By A DC Current", 2002 MMM Abstract p. 248, EQ–05 (47ᵗʰ Annual COnference of Magnetism & Maqnetic Materials held on Nov. 11–15, 2002).

* cited by examiner

Primary Examiner—Richard Elms
Assistant Examiner—Hien Nguyen
(74) Attorney, Agent, or Firm—Oblon, Spivak, McClelland, Maier & Neustadt, P.C.

(57) ABSTRACT

A magnetic cell comprises: a first ferromagnetic layer whose magnetization is substantially fixed in a first direction; a second ferromagnetic layer whose magnetization is substantially fixed in a second direction opposite to the first direction; a third ferromagnetic layer provided between the first and the second ferromagnetic layers, a direction of magnetization of the third ferromagnetic layer being variable; a first intermediate layer provided between the first and the third ferromagnetic layers; and a second intermediate layer provided between the second and the third ferromagnetic layers. The direction of magnetization of the third ferromagnetic layer can be determined under an influence of spin-polarized electrons upon the third ferromagnetic layer by passing a current between the first and the second ferromagnetic layers.

23 Claims, 42 Drawing Sheets recording
writing signal "0"

recording
writing signal "1"

reading
reading signal "0"

reading
reading signal "1"

MAGNETIC CELL AND MAGNETIC MEMORY

CROSS-REFERENCE TO RELATED APPLICATIONS

This application is based upon and claims the benefit of priority from the prior Japanese Patent Application No. 2002-342447, filed on Nov. 26, 2002; the entire contents of which are incorporated herein by reference.

BACKGROUND OF THE INVENTION

The present invention relates to a magnetic cell and a magnetic memory, and more particularly, it relates to a magnetic cell and a magnetic memory which can be written-in by passing spin-polarized electrons.

Conventionally, in order to control the direction of magnetization of a magnetic material, the method of applying a magnetic field to the magnetic material has been taken. For example, in the case of the hard disk drive, writing-in is carried out by reversing the magnetization direction of a medium by applying a magnetic field generated from a recording head. Moreover, in a solid-state magnetic memory, the magnetization direction of a cell is controlled by applying a current-induced magnetic field generated by passing a current to the wirings provided near the magnetoresistance effect elements including the cell. The magnetization direction control by the external magnetic fields has old history, and can be taken as an established technology.

On the other hand, in the recent progress of the nanotechnology, the miniaturization of the magnetic substance has been carried out rapidly, and it has been required to perform the magnetization control with nano-scale and locally. However, since the magnetic field fundamentally has the character to spread over a space, it is difficult to be made localized. As the size of a recording bit or a cell becomes minute, when selecting a specific recording bit or a specific cell and controlling the magnetization direction, the problem of a "cross talk" that a magnetic field reaches to a next bit or a next cell becomes remarkable. Moreover, if a generation source of the magnetic field is made small for the sake of making the magnetic field localized, the problem that the generating magnetic field can not be obtained enough will arise.

Recently, "Direct-current-driving magnetization reversal" in which the magnetization reversal is carried out by passing a current to a magnetic material is disclosed by F. J. Albert, et al., Appl. Phy. Lett. 77, 3809 (2000).

The magnetization reversal by a current is the phenomenon that the angular momentum of the spin-polarized electrons generated when the spin-polarized current passes magnetic layers cause reversal of magnetization by transmitting and acting on the angular momentum of the magnetic material whose magnetization is to be reversed. By using this phenomenon, it becomes possible to act on the magnetic material with nano-scale and also to record to a minuter magnetic material.

However, currently, there is a problem that the reversal current required to reverse a magnetization is as large as 10 mA through several mA when the size of a cell is in a range between 100 nm and several 10 nm. That is, the magnetic cell structure where required current for the magnetization reversal is as small as possible is required in order to prevent a destruction of the element by the current, and to prevent a generation of heat and to reduce power consumption.

SUMMARY OF THE INVENTION

According to an aspect of the invention, there is provided a magnetic cell comprising: a first ferromagnetic layer whose magnetization is substantially fixed in a first direction; a second ferromagnetic layer whose magnetization is substantially fixed in a second direction opposite to the first direction; a third ferromagnetic layer provided between the first and the second ferromagnetic layers, a direction of magnetization of the third ferromagnetic layer being variable; a first intermediate layer provided between the first and the third ferromagnetic layers; and a second intermediate layer provided between the second and the third ferromagnetic layers, the direction of magnetization of the third ferromagnetic layer being determined under an influence of spin-polarized electrons upon the third ferromagnetic layer by passing a current between the first and the second ferromagnetic layers.

According to other aspect of the invention, there is provided a magnetic cell comprising: a first magnetically fixed part including a first ferromagnetic layer whose magnetization is substantially fixed in a first direction; a second magnetically fixed part including a second ferromagnetic layer whose magnetization is substantially fixed in a second direction opposite to the first direction; a third ferromagnetic layer provided between the first and the second magnetically fixed part, a direction of magnetization of the third ferromagnetic layer being variable; a first intermediate layer provided between the first magnetically fixed part and the third ferromagnetic layer; and a second intermediate layer provided between the second magnetically fixed part and the third ferromagnetic layer, an easy axis of magnetization of the third ferromagnetic layer being substantially in parallel to the first direction, at least one of the first and the second magnetically fixed parts including a laminated structure where ferromagnetic layers and at least one nonmagnetic layer are laminated in turn and the ferromagnetic layers are antiferromagnetically coupled via the nonmagnetic layer, the first ferromagnetic layer adjoining the first intermediate layer, the second ferromagnetic layer adjoining the second intermediate layer, and the direction of magnetization of the third ferromagnetic layer being determined under an influence of spin-polarized electrons upon the third ferromagnetic layer by passing a current between the first and the second magnetically fixed parts.

According to other aspect of the invention, there is provided a magnetic memory comprising a memory cell where a plurality of magnetic cells are arranged in a matrix fashion, each of the magnetic cells being separated by an insulator from other memory cells, each of the magnetic cells having: a first ferromagnetic layer whose magnetization is substantially fixed in a first direction; a second ferromagnetic layer whose magnetization is substantially fixed in a second direction opposite to the first direction; a third ferromagnetic layer provided between the first and the second ferromagnetic layers, a direction of magnetization of the third ferromagnetic layer being variable; a first intermediate layer provided between the first and the third ferromagnetic layers; and a second intermediate layer provided between the second and the third ferromagnetic layers, the direction of magnetization of the third ferromagnetic layer being determined under an influence of spin-polarized electrons upon the third ferromagnetic layer by passing a current between the first and the second ferromagnetic layers.

According to other aspect of the invention, there is provided a magnetic memory comprising a memory cell where a plurality of magnetic cells are arranged in a matrix fashion, each of the magnetic cells being separated by an insulator from other memory cells, each of the magnetic cells having: a first magnetically fixed part including a first ferromagnetic layer whose magnetization is substantially fixed in a first direction; a second magnetically fixed part including a second ferromagnetic layer whose magnetization is substantially fixed in a second direction opposite to the first direction; a third ferromagnetic layer provided between the first and the second magnetically fixed part, a direction of magnetization of the third ferromagnetic layer being variable; a first intermediate layer provided between the first magnetically fixed part and the third ferromagnetic layer; and a second intermediate layer provided between the second magnetically fixed part and the third ferromagnetic layer,

- an easy axis of magnetization of the third ferromagnetic layer being substantially in parallel to the first direction,
- at least one of the first and the second magnetically fixed parts including a laminated structure where ferromagnetic layers and at least one nonmagnetic layer are laminated in turn and the ferromagnetic layers are antiferromagnetically coupled via the nonmagnetic layer,
- the first ferromagnetic layer adjoining the first intermediate layer,
- the second ferromagnetic layer adjoining the second intermediate layer, and
- the direction of magnetization of the third ferromagnetic layer being determined under an influence of spin-polarized electrons upon the third ferromagnetic layer by passing a current between the first and the second magnetically fixed parts.

BRIEF DESCRIPTION OF THE DRAWINGS

The present invention will be understood more fully from the detailed description given here below and from the accompanying drawings of the embodiments of the invention. However, the drawings are not intended to imply limitation of the invention to a specific embodiment, but are for explanation and understanding only.

In the drawings.

DETAILED DESCRIPTION.

Referring to drawings, some embodiments of the present invention will now be described in detail.

Figure 1:
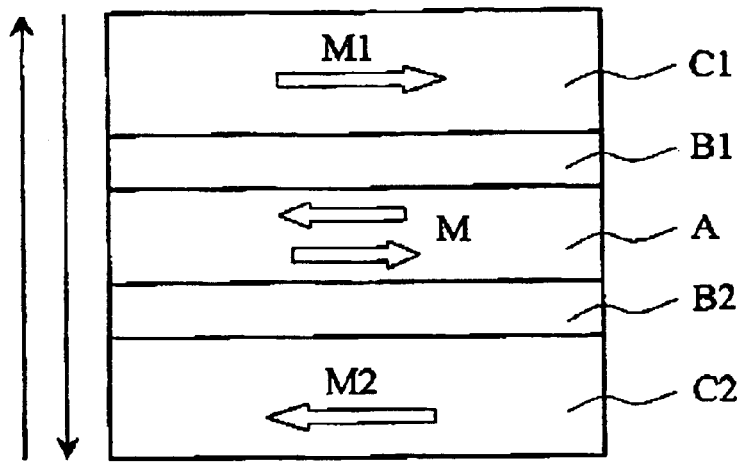
FIG. 1 is a schematic diagram which illustrates a fundamental cross-sectional structure of a magnetic cell according to the first embodiment of the present invention.

FIG. 1 is a schematic diagram which illustrates a fundamental cross-sectional structure of the magnetic cell according to the first embodiment of the present invention. This magnetic cell has, two magnetically fixed layers (pinned layer) C1 and C2 whose magnetization directions M1 and M2 are anti-parallel, a magnetic recording layer (free layer) A whose magnetization direction can be changed, and intermediate layers B1 and B2 between the magnetic recording layer A and the magnetically fixed layers.

The magnetization direction M of the magnetic recording layer A can be controlled by passing current I between the upper magnetically fixed layer C1 and the lower magnetically fixed layer C2. Specifically, the magnetization direction M of the magnetic recording layer A can be reversed by changing direction (polarity) of the flow of the current I. In recording information, "0" and "1" are assigned respectively, according to the magnetization direction M.

Figure 2:
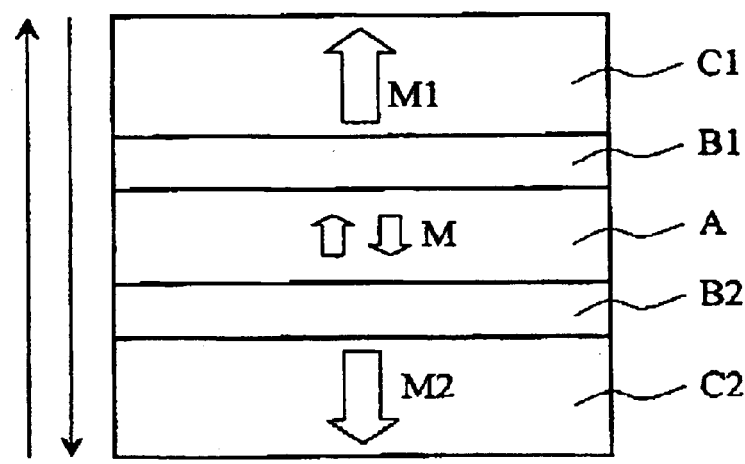
FIG. 2 is a schematic diagram showing a cross-sectional structure of the magnetic cell in which the magnetization is made to be perpendicular to the film plane.

And, in the magnetic cell of the present invention, the magnetization direction of each layer may be not only parallel to a film plane but also substantially perpendicular to a film plane. FIG. 2 is a schematic diagram showing a cross-sectional structure of the magnetic cell in which the magnetization directions are made to be perpendicular to the film plane. In this magnetic cell, the magnetizations M, M1, and M2 are made to be substantially perpendicular to the film plane. Also in this case, the magnetization direction M of the magnetic recording layer A can be controlled by passing the current I between the upper pinned layer C1 and the lower pinned layer C2.

Next, the mechanism of the "writing" in the magnetic cell of the invention will be explained.

Figure 3A:
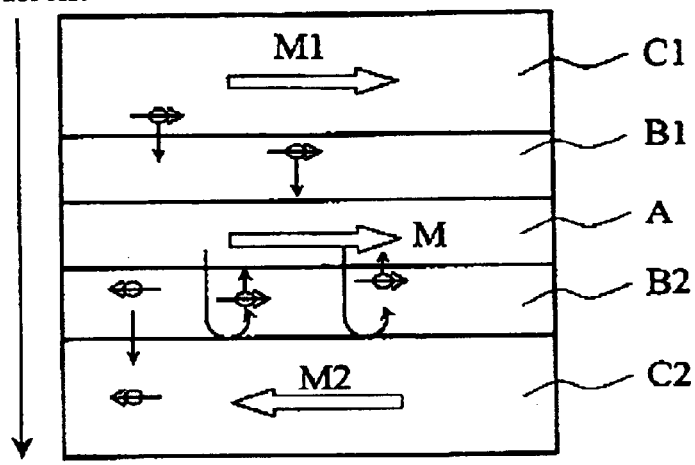
FIG. 3A and FIG. 3B show schematic section views for explaining the mechanism of the "writing" of the magnetic cell expressed in FIG. 1.
Figure 3B:
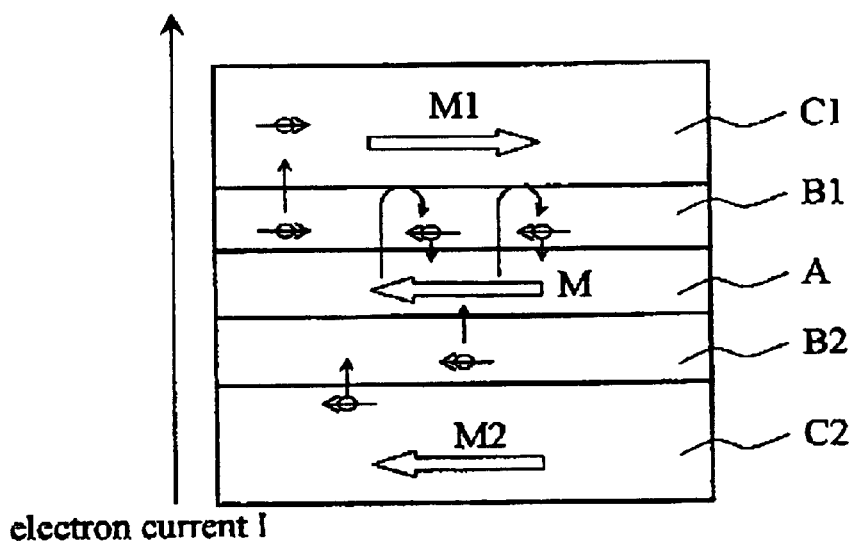

FIG. 3A and FIG. 3B are schematic section views for explaining the mechanism of the "writing-in" in the magnetic cell expressed in FIG. 1. The mechanism to write in the magnetic recording layer A by providing two magnetically fixed layers C1 and C2, and by passing the current I across these interfaces will be explained as follows. First, the case where both of the magnetoresistance effects through the intermediate layer B1 and the magnetoresistance effects through the intermediate layer B2 are of a normal type will be explained. Here, the "normal type" magnetoresistance effect corresponds to the case where the resistance becomes higher when the magnetizations of the magnetic layers on both sides of the intermediate layer are anti-parallel than that when they are parallel.

That is, in the normal type, the resistance between the magnetically fixed layers C1 and the magnetic recording layers A through the intermediate layer B1 becomes lower when the magnetization of the magnetically fixed layers C1 and the magnetization of the magnetic recording layers A are parallel than they are anti-parallel. Also, the resistance between the magnetically fixed layers C2 and the magnetic recording layers A through the intermediate layer B2 becomes lower when the magnetization of the magnetically fixed layers C2 and the magnetization of the magnetic recording layers A are parallel than they are anti-parallel.

First, in FIG. 3A, the electron which passes the magnetically fixed layer C1 which has magnetization M1 tends to have a spin of the magnetization direction M1. And, this electron flows to the magnetic recording layer A transmitting the angular momentum of the spin to the magnetic recording layer A, and acts on the magnetization M.

The magnetization M2 of the second magnetically fixed layer C2 is in the reverse direction to the magnetization M1. Therefore, the electron which has the spin of the same direction as the magnetization M1 (the rightward direction in this figure) is reflected at the interface between the second magnetically fixed layer C2 and the intermediate layer B2. This reflected spin of the opposite direction to the magnetization of the second magnetically fixed layer C2 also acts on the magnetic recording layer A.

That is, since the spin electron which has the same magnetization direction as the first magnetically fixed layer acts on the magnetic recording layer A twice, a write-in action of twice as much can be obtained substantially. Consequently, the writing in the magnetic recording layer A can be carried out with current smaller than before.

FIG. 3B expresses the case where the current I is reversed. In this case, the electron constituting the current I tends to have the spin with the same direction as the magnetization direction M2 (in the leftward direction in this figure) by the action of the magnetization M2 of the second magnetically fixed layer C2. This spin electron acts on the magnetization M of the magnetic recording layer A in the magnetic recording layer A. Then, the spin electron is reflected at the interface between the first magnetically fixed layer C1 having the reverse magnetization M1 to the magnetization M of the magnetic recording layer A and the intermediate layer B1. Then, the electron acts on the magnetic recording layer A again.

In the above, the case where the magnetoresistance effects between the magnetically fixed layers C1 and C2 and the magnetic record A through the intermediate layer B1 and B2, are of the normal type were explained.

Figure 4A:
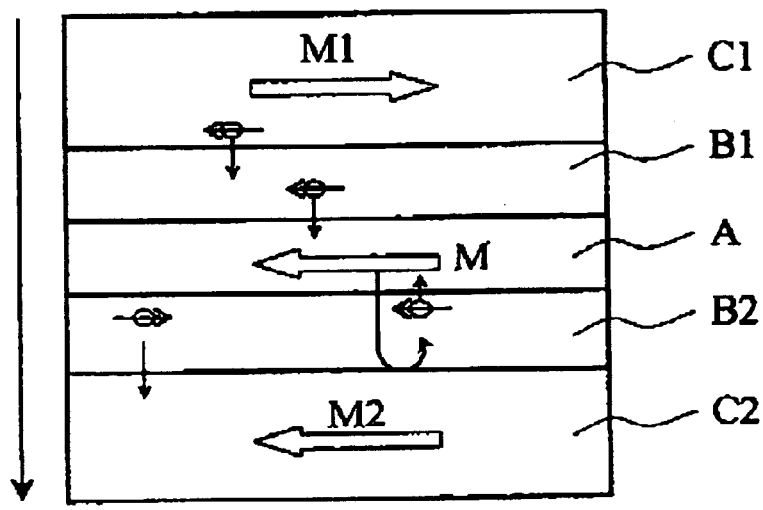
FIG. 4A and FIG. 4B show schematic section views for explaining the mechanism of "writing" in case of a reverse type magnetoresistance effect of a magnetic cell.
Figure 4B:
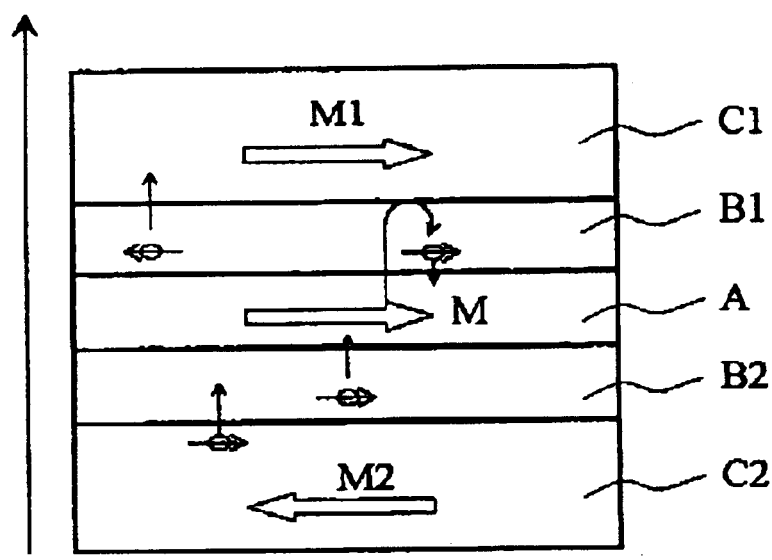

Next, the case where they are of a reverse type will be explained. FIG. 4A and FIG. 4B are schematic section views for explaining the mechanism of "writing-in" in case of a reverse type magnetoresistance effect of a magnetic cell. That is, in the reverse type, the resistance between the magnetically fixed layers C1 and the magnetic recording layers A through the intermediate layer B1 becomes higher when the magnetization of the magnetically fixed layers C1 and the magnetization of the magnetic recording layers A are parallel than they are anti-parallel. And, the resistance between the magnetically fixed layers C2 and the magnetic recording layers A through the intermediate layer B2 becomes lower when the magnetization of the magnetically fixed layers C1 and the magnetization of the magnetic recording layers A are parallel than they are anti-parallel.

When the magnetoresistance effects through the intermediate layers B1 and B2 are of reverse type, the spin electron which acts on the magnetic recording layer A from the magnetically fixed layer C1 has the reverse direction to the spin electron of FIG. 3A, as expressed in FIG. 4A. Also, the spin electron which acts on the magnetic recording layer A from the magnetically fixed layer C2 has the reverse direction to the spin electron of FIG. 3A. Consequently, as expressed in FIG. 4A, the magnetization direction M of the magnetic recording layer A becomes anti-parallel to that of the magnetically fixed layer C1, and parallel to that of the magnetically fixed layer C2.

On the other hand, when the electron current is passed towards the magnetically fixed layer C1 from the magnetically fixed layer C2, the magnetization direction M of the magnetic recording layer A becomes parallel to that of the magnetically fixed layer C1. As explained above, when both of the magnetoresistance effects through the intermediate layers B1 and B2 are of the normal type, or when both are of the reverse type, the magnetization direction M of the magnetic recording layer A is determined in response to the current direction.

However, when one of the magnetoresistance effects through the intermediate layers B1 and B2 is of the normal type and the other is of the reverse type, it is disadvantage for writing in the magnetic recording layer A because the degree of spin-polarization of the electron flowing into the magnetic recording layer A becomes small.

For example, when the magnetoresistance effect between the magnetically fixed layer C1 and the magnetic recording layer A through the intermediate layer B1 is of the normal type and the magnetoresistance effect between the magnetically fixed layer C2 and the magnetic recording layer A through the intermediate layer B2 is of the reverse type, the direction of a spin electron acting on the magnetic recording layer A from the intermediate layer B1 becomes different from that from the intermediate layer B2. So, in this case, the effect of the present invention can hardly be acquired.

As explained above, according to this embodiment, the directions of the spins acting on the magnetic recording layer A turn into the same directions finally by making the magnetization M1 and M2 of the two magnetically fixed layers anti-parallel, and a twice as much action is obtained. Consequently, it becomes possible to reduce the current for reversal of the magnetization of the magnetic recording layer A.

The same mechanism as the mechanism of the "writing-in" explained above can be said about the magnetic cell where the direction of the magnetization is controlled to be perpendicular to the film plane, as expressed in FIG. 2.

Figure 5A:
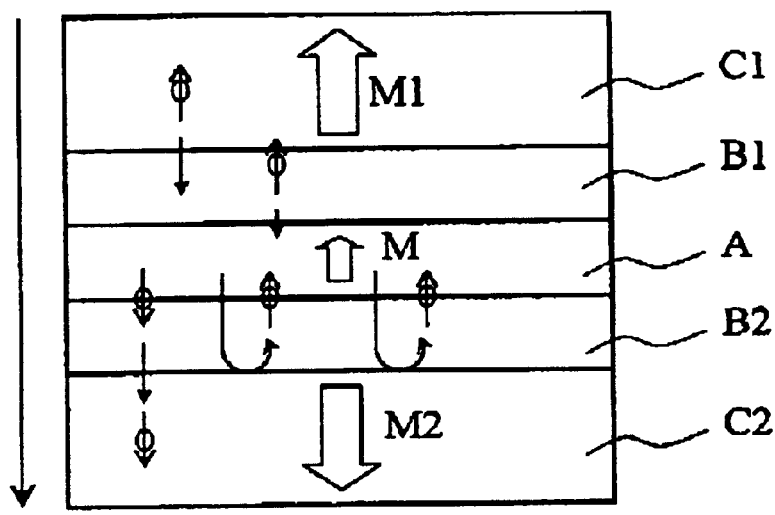
FIG. 5A and FIG. 5B show schematic section views for explaining the mechanism of the "writing" in the magnetic cell expressed in FIG. 2.
Figure 5B:
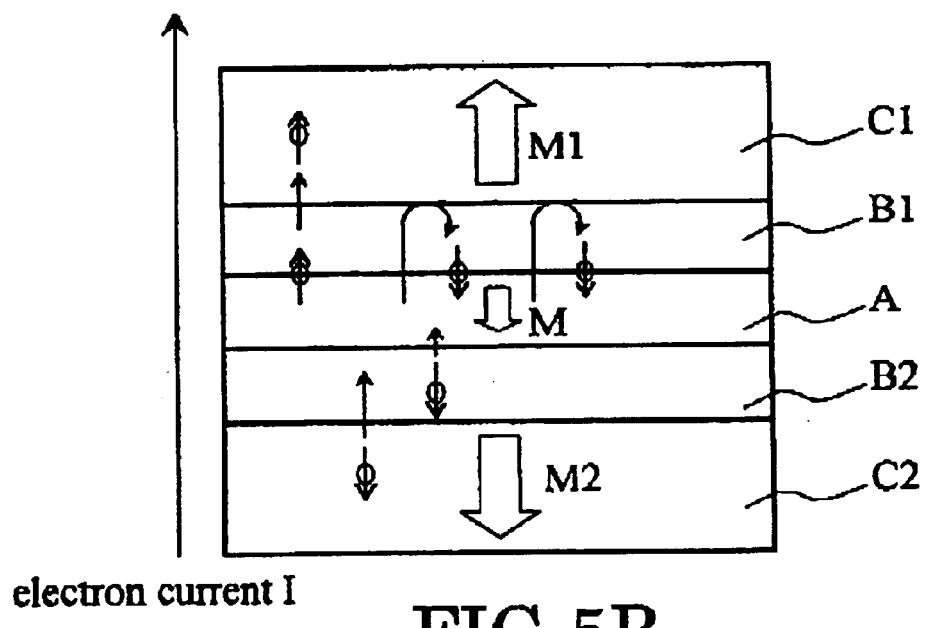

FIG. 5A and FIG. 5B show schematic section views for explaining the mechanism of the "writing-in" in the magnetic cell expressed in FIG. 2. The same symbols are given to the same elements as what were mentioned above with reference to FIG. 1 through FIG. 4B about these figures, and detailed explanation will be omitted.

As expressed in FIG. 5A and FIG. 5B, also when the magnetization direction is made to be perpendicular to the film plane, the directions of the spins acting on the magnetic recording layer A turn into the same directions finally by making the magnetizations M1 and M2 of two magnetically fixed layers anti-parallel, and a twice as much action is obtained. As the result, it becomes possible to reduce the current for reversal of the magnetization of the magnetic recording layer A.

Next, the mechanism of "read-out" in the magnetic cell of this embodiment will be explained. In the magnetic cell of this embodiment, a detection of the magnetization direction M of the magnetic recording layer A can be performed using the "magnetoresistance effect" where the resistance varies by relative direction of the magnetization of each layer.

Figure 6:
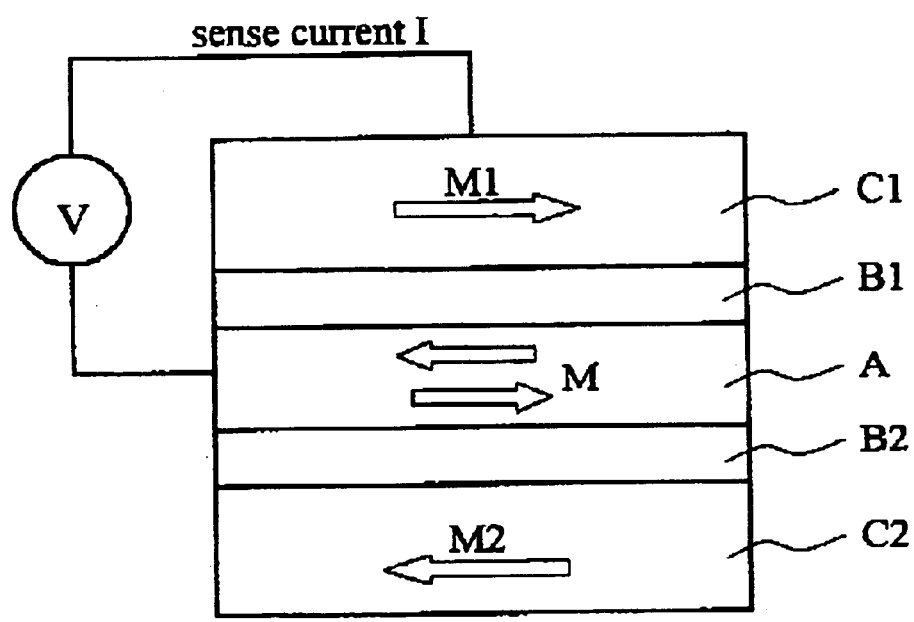
FIG. 6 is a schematic diagram for explaining the mechanism of the reading the magnetic cell of this embodiment.

FIG. 6 is a schematic diagram for explaining the mechanism of the reading out the magnetic cell of this embodiment. That is, when using the magnetoresistance effect, the sense current I is passed between one of the magnetically fixed layers C1 and C2, and the magnetic recording layer, and the magnetoresistance is measured. Although the case where the magnetoresistance is measured between the first magnetically fixed layer C1 and the magnetic recording layer A is illustrated in FIG. 6, the magnetoresistance may be measured between the second magnetically fixed layer C2 and the magnetic recording layer A.

Figure 7A:
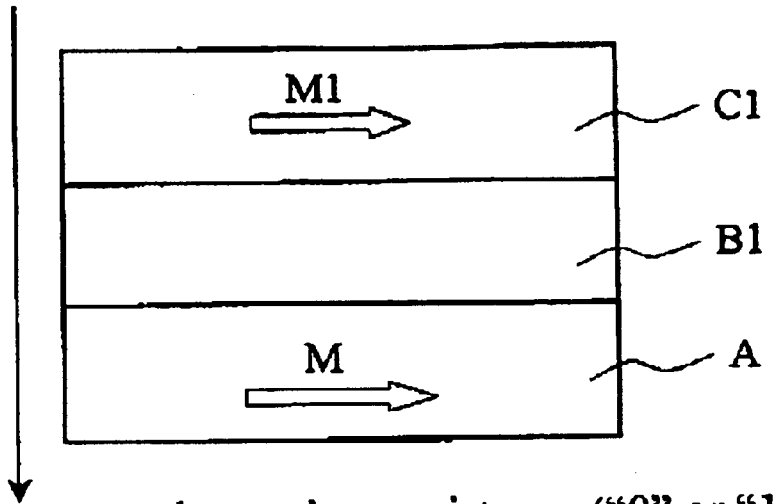
FIG. 7A and FIG. 7B are schematic diagrams for explaining the change of the magnetoresistance by the change of the relative direction of the magnetization.
Figure 7B:
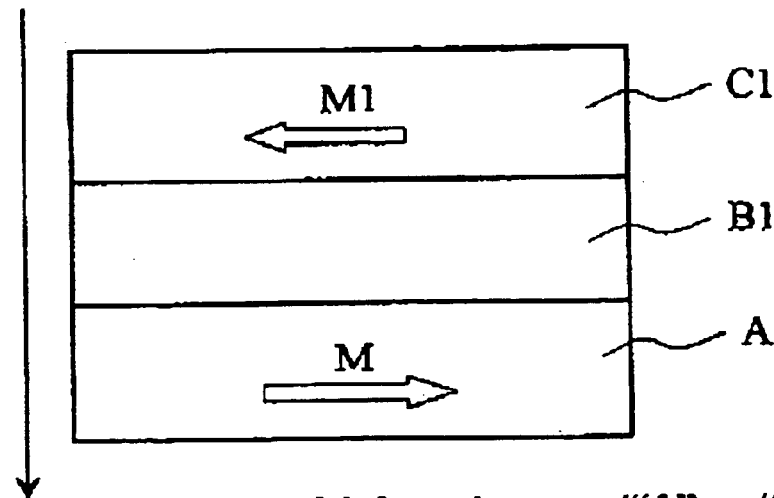

FIG. 7A and FIG. 7B are schematic diagrams for explaining the change of the magnetoresistance by the change of the relative direction of the magnetization. FIG. 7A shows the case where the magnetization direction M1 of the magnetically fixed layer C1 and the magnetization direction M of the magnetic recording layer A are the same directions. In this case, the magnetoresistance detected by the sense current I passing through these layers is relatively small in the normal type, and it is relatively large in the reverse type.

On the other hand, FIG. 7B shows the case where the magnetization direction M1 of the magnetically fixed layer C1 and the magnetization direction M of the magnetic recording layer A are anti-parallel. In this case, the magnetoresistance detected by the sense current I passed through these layers is relatively large in the normal type, and it is relatively small in the reverse type. It becomes possible to carry out record read-out of the data with two values by assigning "0" and "1" to these different resistances respectively.

On the other hand, there is a method of detecting the magnetoresistance by passing the sense current through the both ends of the magnetic cell. That is, the magnetoresistance is detected by the sense current being passed between the first magnetically fixed layer C1 and the second magnetically fixed layer C2. However, in the present invention, a pair of the magnetizations M1 and M2 of the magnetically fixed layers C1 and C2 is anti-parallel and both of the magnetoresistance effects through the intermediate layers B1 and B2 are of the normal type or of the reverse type. Therefore, the magnetoresistance effect detected will become same values regardless of the magnetization direction M of the magnetic recording layer A, when "symmetrical structure on the magnetic recording layer A", i.e. the quantities of the spin dependence scatterings of the magnetically fixed layers C1 and C2 are equal, or the degrees of spin-polarized of the electron which acts on the magnetic recording layer from the magnetically fixed layers C1 and C2 are equal. Then, it is necessary to adopt "asymmetrical structure on the magnetic recording layer A." FIG. 8 is a schematic section view showing the first example of the asymmetrical structure.

As an example of the asymmetrical structure, the size of the magnetization M1 and M2 can be changed by differentiating the thicknesses, materials, etc. of the magnetically fixed layers C1 and C2. In the case of the example expressed in FIG. 8, the contribution of spin dependent bulk scattering by the magnetically fixed layer C2 is made larger than that by C1, by making the second magnetically fixed layer C2 thicker than the first magnetically fixed layer C1. Then, when "reading" by passing the sense current between the magnetically fixed layers C1 and C2 is carried out, the magnetoresistance effect detected vary depending on the direction of the magnetization M of the magnetic recording layer A.

Figure 8:
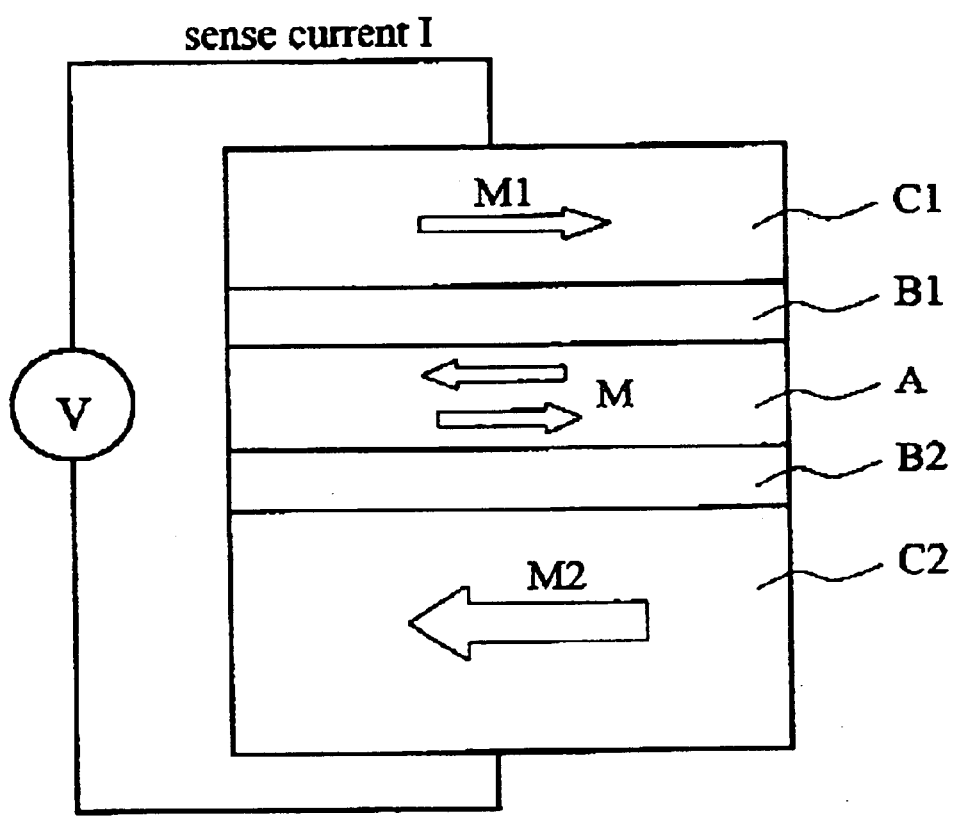
FIG. 8 shows a schematic section view showing the first example of the asymmetrical structure.

However, the quantities of the spin dependence scatterings by the magnetically fixed layers C1 and C2 may be changed by changing materials of the first and the second magnetically fixed layers C1 and C2 instead of changing the thicknesses of those, as expressed in FIG. 8.

Figure 9A:
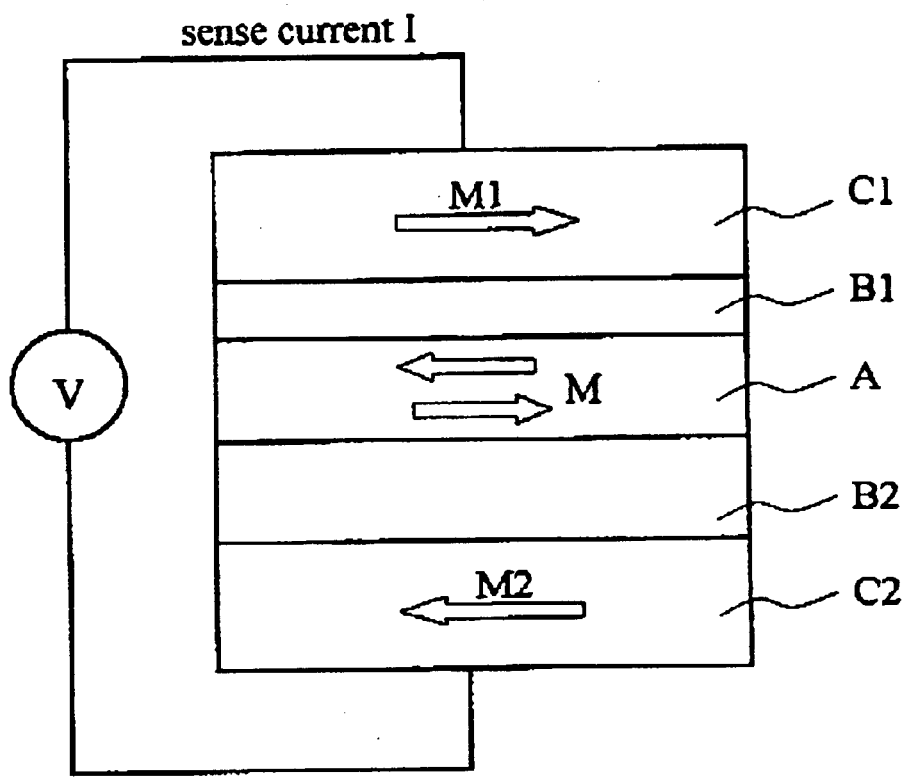
FIG. 9A shows a schematic section view showing the second example of the asymmetrical structure.

FIG. 9A shows a schematic section view showing the second example of the asymmetrical structure.

In the case of this example, the thicknesses of the intermediate layers B1 and B2 are different from each other. That is, the intermediate layer B1 is made to have the thickness with which the magnetoresistance effect is easy to be detected, and the other intermediate layer B2 is made to have the thickness with which the magnetoresistance effect is hard to be detected. In this case, it is desirable to make the thickness of the intermediate layer B1 in a range between 0.2 nm and 10 nm, and make the thickness of the intermediate layer B2 in a range between 3 nm and 50 nm.

Then, the magnetoresistance effect between the magnetically fixed layer C1 and the magnetic recording layers A through the intermediate layer B1 can mainly be detected, and it will become easy to detect the magnetization M of the magnetic recording layer A.

Figure 9B:
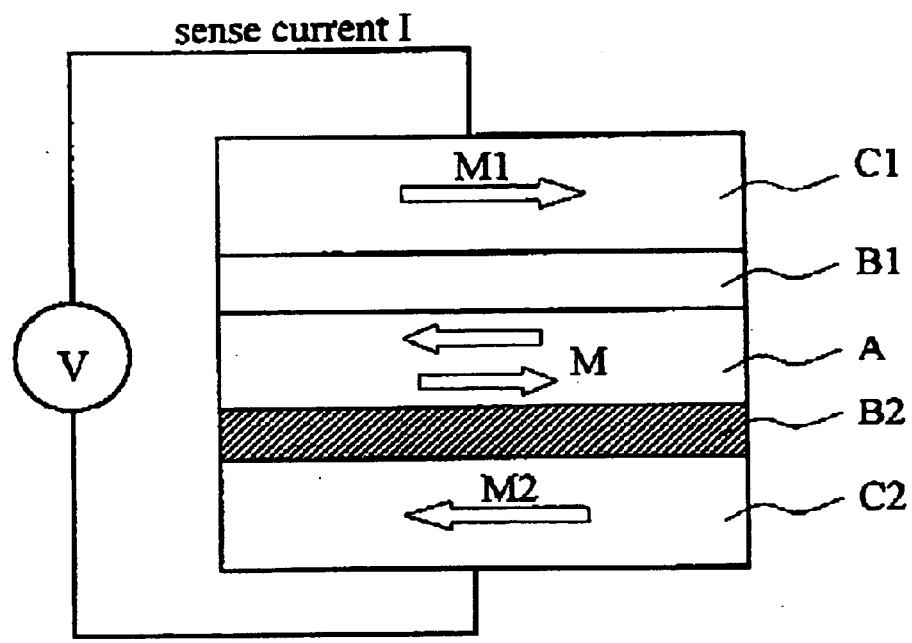
FIG. 9B shows a schematic section view showing the third example of the asymmetrical structure.

FIG. 9B shows a schematic section view showing the third example of the asymmetrical structure. In this example, the resistances of the intermediate layers B1 and B2 may be differentiated. In order to differentiate the resistances, it is effective to differentiate the materials and compositions of the intermediate layers B1 and B2 each other, or to add elements to one of the intermediate layers. Furthermore, one of the intermediate layer B1 and B2 may be formed with electric conduction material, such as copper (Cu), and the other may be formed with an insulator. If the intermediate layer B1(or B2) is formed with a thin insulator, the so-called tunneling magnetoresistance effect (TMR) will be obtained, and a big reproduction signal output can be obtained when the magnetization of the magnetic recording layer A is read out.

Figure 10:
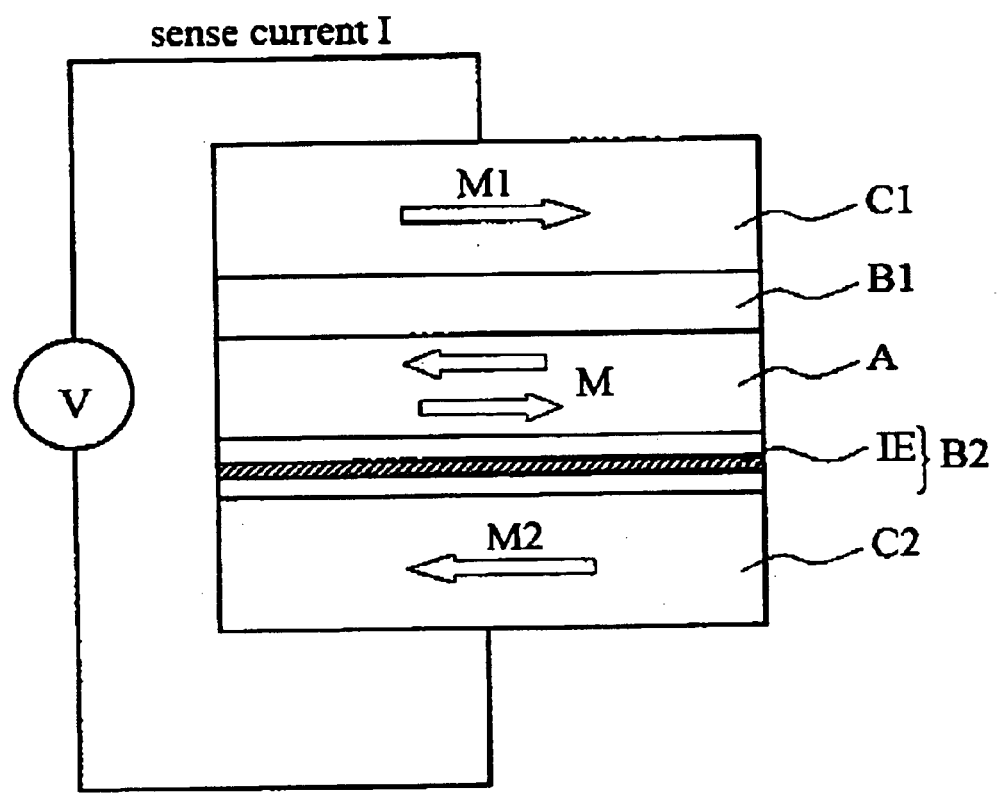
FIG. 10 shows a schematic section view showing the fourth example of the asymmetrical structure.

FIG. 10 shows a schematic section view showing the forth example of the asymmetrical structure.

In this example, the middle substance layer IE is inserted in the intermediate layer B2. This middle substance layer IE has a role of increasing the magnetoresistance effect. A discontinuous insulating thin film can be used as the middle substance layer IE, for example. That is, it becomes possible to increase the magnetoresistance effect by inserting the insulating thin film which has a pinhole etc. in the intermediate layer.

As such a discontinuous insulating thin film, an oxide or a nitride of an alloy of nickel (Ni) and copper (Cu), the oxide or a nitride of an alloy of nickel (Ni) and gold (Au), an oxide or a nitride of an alloy of aluminum (Al) and copper (Cu), etc. can be used, for example.

A phase separation of the compounds, such as an oxide and a nitride of these alloys, is carried out by bringing them close to the equilibrium with heating etc. That is, the compounds separate into a phase whose resistance is low and which is hard to become compounds (oxidization, nitride, etc.), such as Au and Cu, and a phase whose resistance is high and which is easy to become compounds, such as Ni and Al. Therefore, the discontinuous insulating thin film in which pinholes exist can be formed by controlling composition, temperature, or film deposition energy. Thus, the current pass can be narrowed, and the spin dependent scattering can be easily detected because of the higher resistance. Consequently, a big magnetoresistance effect is obtained.

By inserting such a middle substance layer IE in either of the intermediate layer B1 or B2, the magnetoresistance effect between the magnetically fixed layer and the magnetic recording layer which are on the both sides of the middle substance layer IE increases, and becomes easy to be detected.

Figure 11:
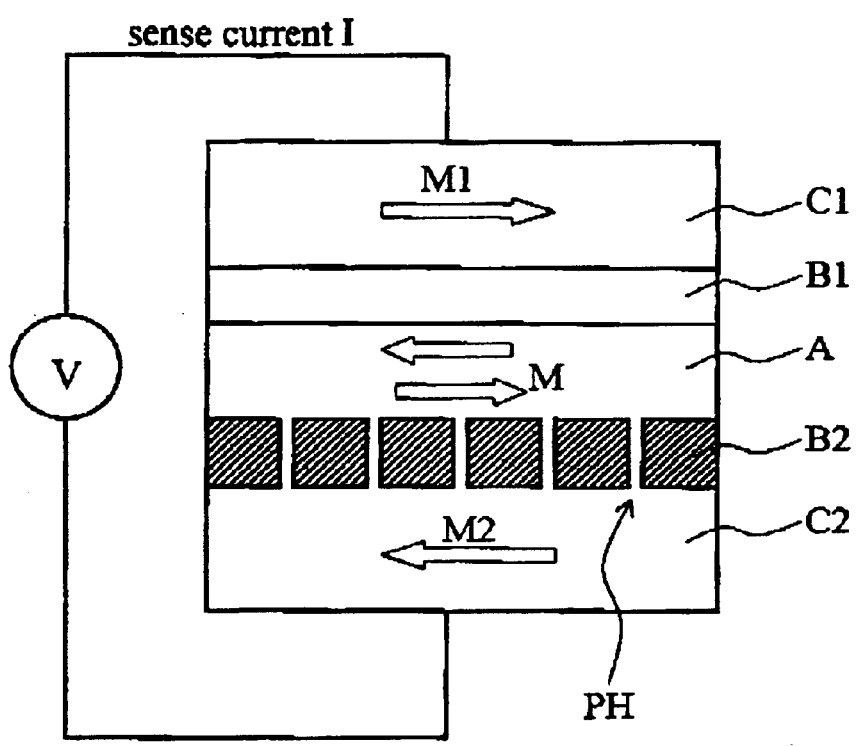
FIG. 11 shows a schematic section view showing the fifth example of the asymmetrical structure.

FIG. 11 shows a schematic section view showing the fifth example of asymmetrical structure.

That is, in this example, the intermediate-layer B2 is an insulating layer which has pinholes PH. The pinholes PH are embedded by the material of the magnetically fixed layer or the magnetic recording layer of the both sides.

Thus, by connecting the magnetically fixed layer C2 (or C1) and the magnetic recording layer A through the pinholes PH, the so-called "magnetic point contact" is formed and a very large magnetoresistance effect is obtained. Therefore, the direction of the magnetization M of the magnetic recording layer A can be easily found by detecting the magnetoresistance effect between the magnetic layers of the both sides through these pinholes PH.

Here, it is desirable for the diameters of the openings of the pinholes PH to be less than about 20 nm. And, the shape of the pinholes PH can be various kinds of shape, such as a cone shape, cylindrical, a globular shape, the shape of multiple weights, and the shape of a multiple pillar. And, one or more pinholes PH may be exist. However, it is desirable for the pinholes PH to In the above, the example of the asymmetrical structure for reading the direction of the magnetization of the recording layer A easily by the magnetoresistance effect was explained, referring to FIG. 7 through FIG. 10. Such asymmetrical structures can be similarly applied to the magnetic cell with perpendicular magnetization type expressed in FIG. 2, and the same effect can be obtained.

Next, how to make the directions of the magnetizations M1 and M2 of two magnetically fixed layers C1 and C2 be anti-parallel in the magnetic cell of the invention will be explained.

First, the method of making the magnetizations M1 and M2 to be anti-parallel by carrying out magnetostatic coupling between the magnetically fixed layers C1 and C2 can be mentioned as a first method.

Figure 12:
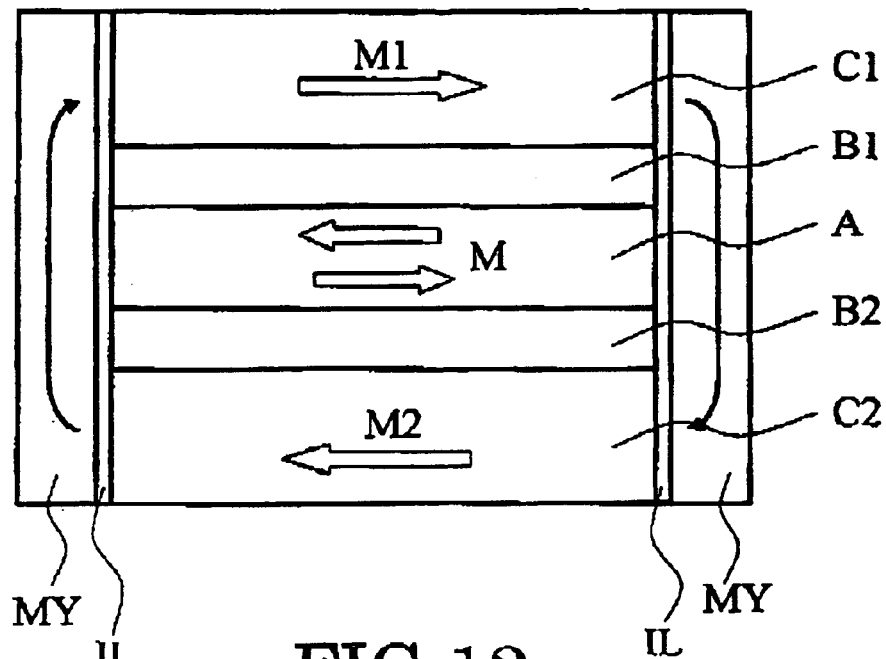
FIG. 12 shows a schematic section view showing the magnetostatic coupling between the magnetically fixed layers C1 and C2.

FIG. 12 shows a schematic section view showing the magnetostatic coupling between the magnetically fixed layers C1 and C2. In the case of this example, the magnetic yokes MY are provided on the both sides of the magnetic cell through the insulating layers IL. The magnetic fields expressed with the arrows are formed in the magnetic yokes MY, and the closed loop magnetic domain through these magnetic yokes MY and the magnetically fixed layers C1 and C2 are formed. Thus, if the magnetostatic coupling between the magnetically fixed layers C1 and C2 is carried out through the magnetic yokes MY, the magnetization M1 and the magnetization M2 can be made to be anti-parallel by the closed loop magnetic domain.

In this case, the directions of the magnetizations M1 and M2 of the magnetically fixed layers can be controlled by differentiating the thicknesses of two magnetically fixed layers C1 and C2, and applying an external pulse magnetic field.

Moreover, it becomes possible to control the direction of the magnetization of the magnetically fixed layer by forming an antiferromagnetic layer in contact with the outside of one magnetically fixed layer and giving unidirectional anisotropy.

Figure 13:
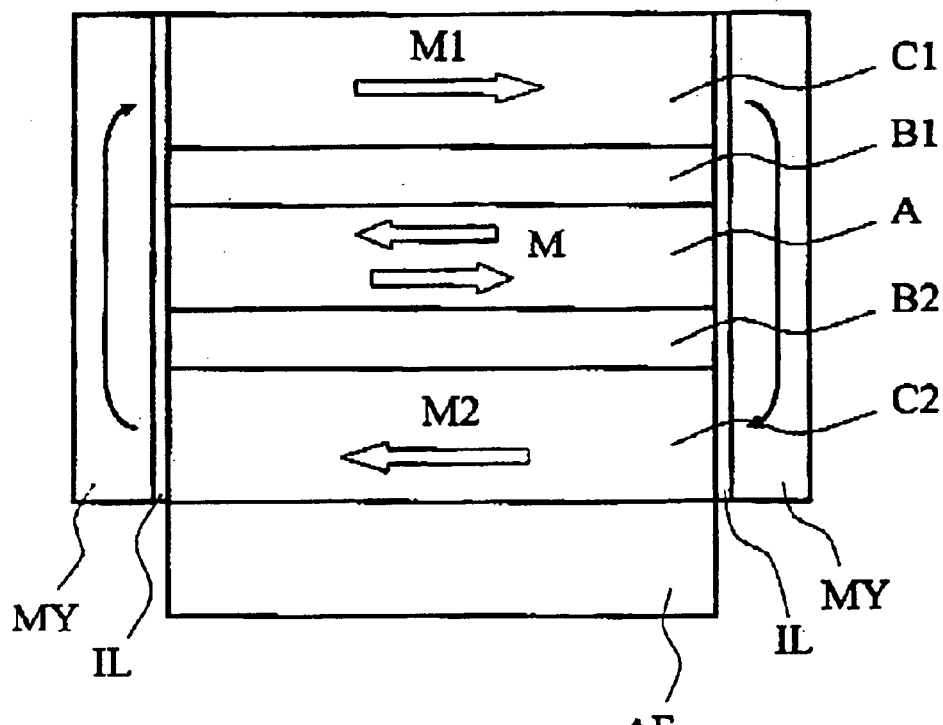
FIG. 13 shows a schematic section view showing the magnetic cell provided the antiferromagnetic layer.

FIG. 13 is a schematic section view showing the magnetic cell provided the antiferromagnetic layer. That is, the direction of the magnetization M2 is fixed by the exchange coupling between the antiferromagnetic layer AF provided under the magnetically fixed layer C2 and the magnetically fixed layer C2. And the magnetization M1 of the magnetically fixed layer C1 which forms a magnetostatic coupling with the magnetically fixed layer C2 through the magnetic yokes MY serves as a reverse direction to the magnetization M2.

Moreover, the magnetizations of the magnetically fixed layers C1 and C2 may be fixed by antiferromagnetic layers, respectively.

Figure 14:
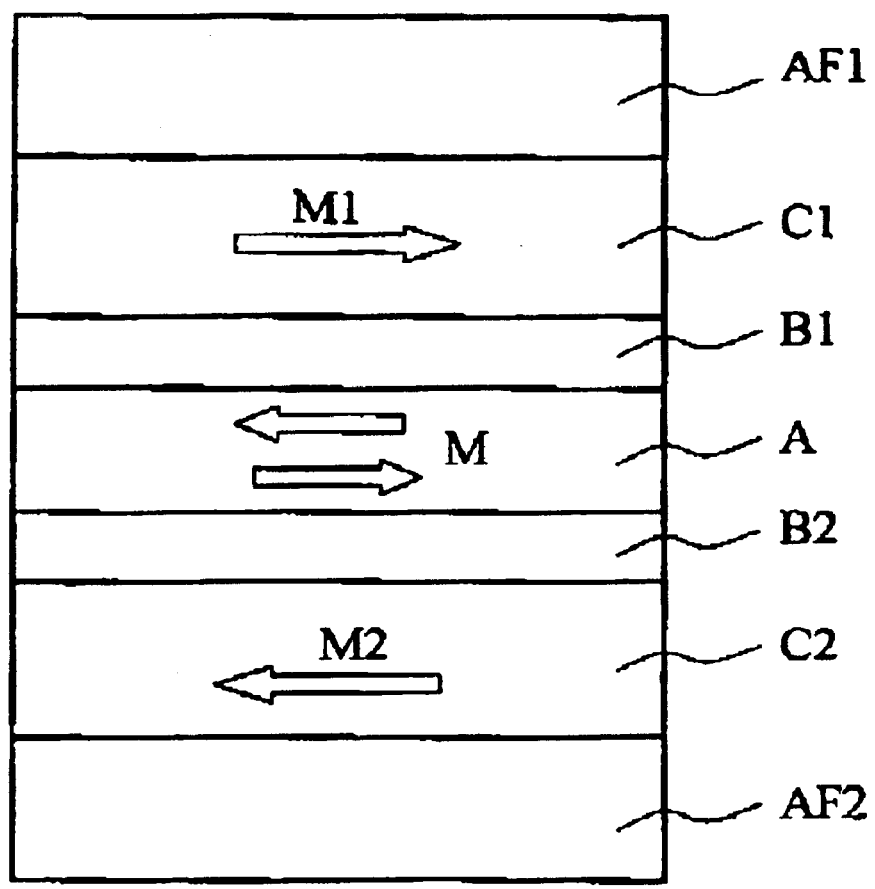
FIG. 14 shows a schematic section view showing the magnetic cell where the magnetizations of the magnetically fixed layers C1 and C2 are fixed by the antiferromagnetic layer, respectively.

FIG. 14 is a schematic section view showing the magnetic cell where the magnetizations of the magnetically fixed layers C1 and C2 are fixed by the antiferromagnetic layers, respectively. That is, the antiferromagnetic layer AF1 is provided adjacent to the magnetically fixed layer C1, and the antiferromagnetic layer AF2 is provided adjacent to the magnetically fixed layer C2. And the magnetizations M1 and M2 are fixed to be anti-parallel by the next antiferromagnetic layers AF1 and AF2, respectively.

Such structure can be easily formed by, selecting materials of the antiferromagnetic layers AF1 and AF2 appropriately so that their blocking temperatures of the antiferromagnetic layers AF1 and AF2 may he different from each other. That is, after forming the laminated structure expressed in FIG. 14, the magnetic cell is heated being applied the magnetic field. After that, the magnetic cell is cooled. Then, the magnetization of the antiferromagnetic layer with a high blocking temperature is fixed. Then, the magnetic cell is cooled further, after reversing the magnetic field. Then, the magnetization of the other antiferromagnetic layer with a low blocking temperature is fixed to be anti-parallel.

Figure 15:
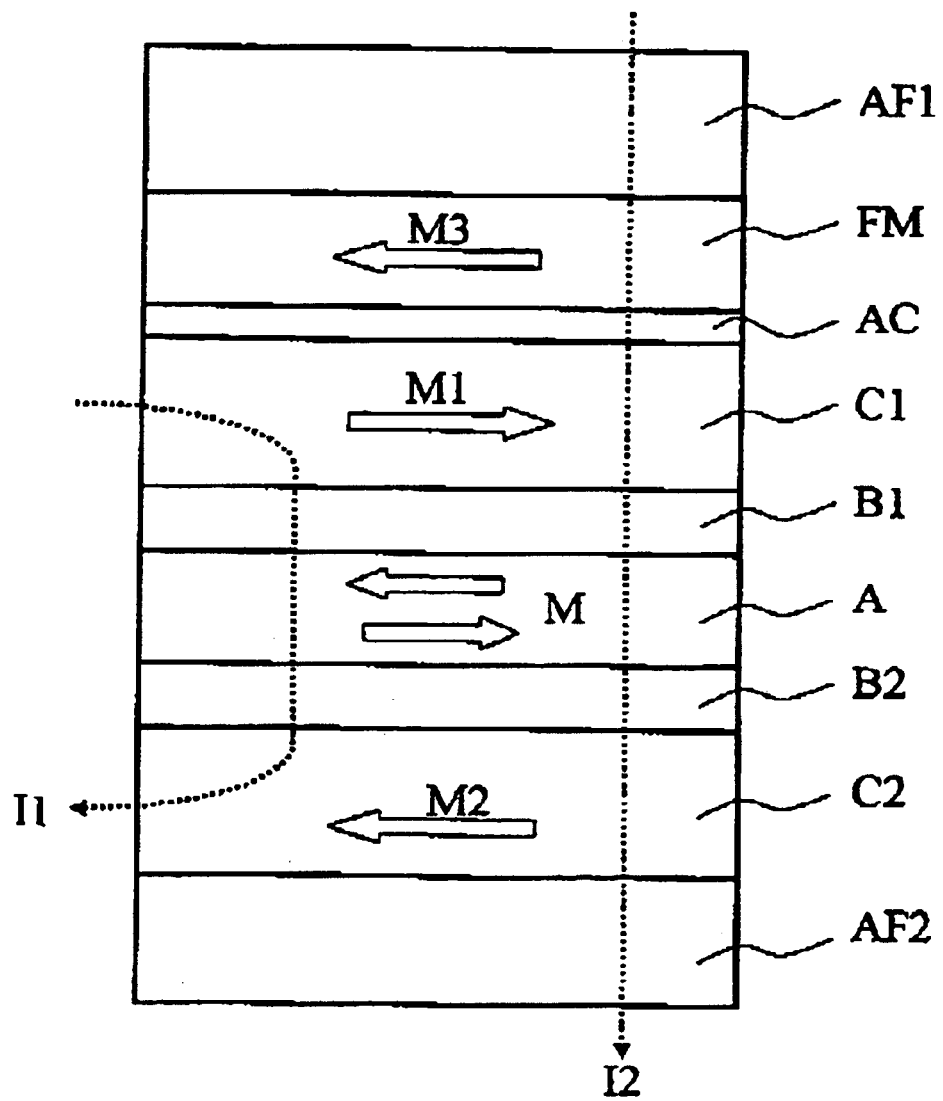
FIG. 15 shows a schematic section view showing the magnetic cell where the magnetizations of the magnetically fixed layers C1 and C2 are fixed by the antiferromagnetic layer, respectively.

FIG. 15 also shows a schematic section view showing the magnetic cell where the magnetizations of the magnetically fixed layers C1 and C2 are fixed by the antiferromagnetic layers, respectively. That is, in this example, the antiferromagnetic layer AF2 is provided the outside the magnetically fixed layer C2, and the magnetic layer FM and the antiferromagnetic layer AF1 are provided outside the other magnetically fixed layer C1 through the non-magnetic layer AC.

In this case, the non-magnetic layer AC is made to have a thickness with which the magnetically fixed layer C1 arid the magnetic layer FM are antiferromagnetically exchange coupled. And, ruthenium (Ru), copper (Cu), etc. can be used as a material of the non-magnetic layer AC.

According to the usual process of giving unidirectional anisotropy by heat-treating in the magnetic field, the directions of the magnetizations of the magnetic layers FM and C2 which are adjacent to the antiferromagnetic layers AF1 and AF2 turn into the same directions. Since the magnetically fixed layer C1 is carrying out the antiferromagnetic coupling with the magnetic layer FM, the magnetization M1 can be fixed to have the reverse direction to the magnetization M3 of the magnetic layer FM.

In addition, in the case of this structure, it is desirable to pass the writing current I in the recording layer A between the magnetically fixed layers C1 and C2, as expressed with the arrow I1 in this figure (or the reverse direction to this arrow). However, from the viewpoint of actual use, it is easier to pass the current between the antiferromagnetic layers AF1 and AF2 using the electrodes provided on the antiferromagnetic layer AF1 and under the antiferromagnetic layer AF2 which is not shown as expressed with the arrow I2 in this figure (or the reverse direction to this arrow). The recording layer A can also be written-in with such a current.

Figure 16:
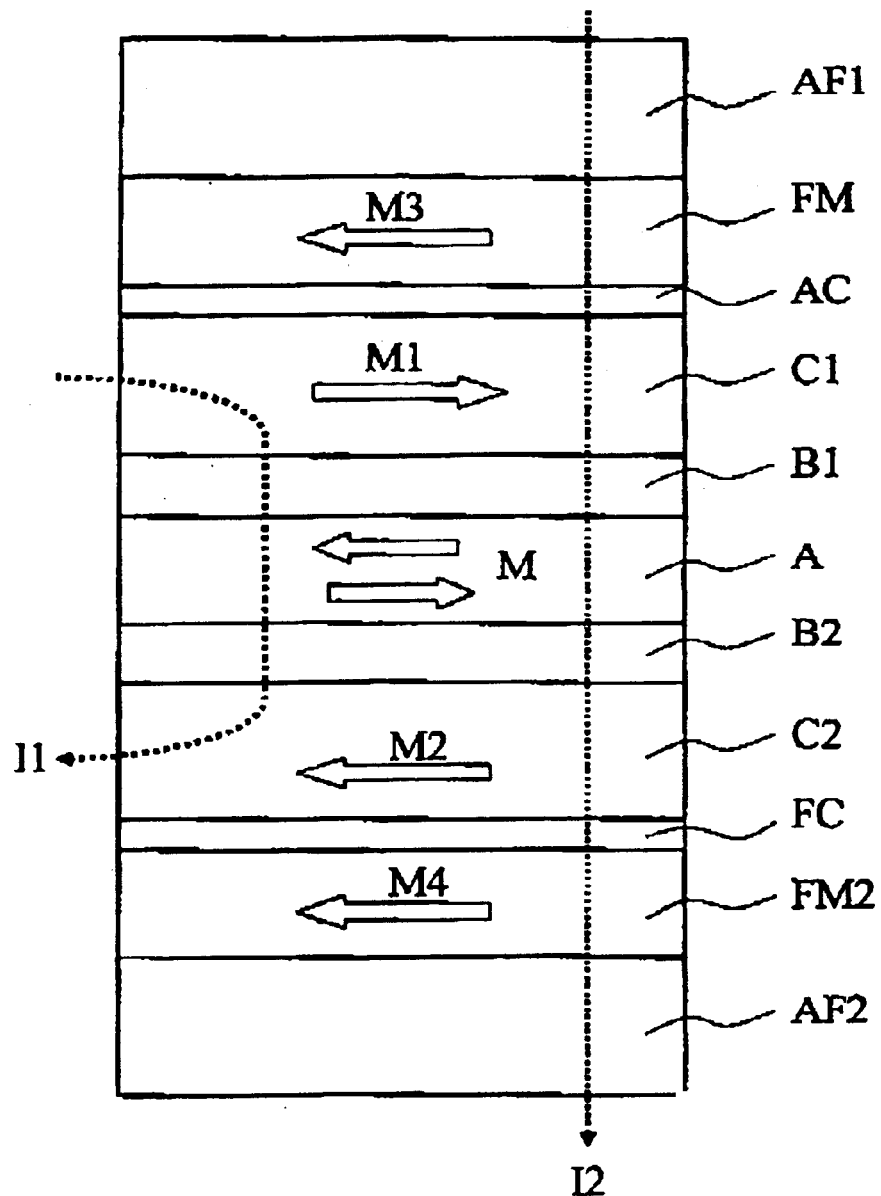
FIG. 16 shows a schematic section view showing another example of the magnetic cell where the magnetizations of the magnetically fixed layers C1 and C2 are fixed by the antiferromagnetic layer, respectively.

FIG. 16 also shows a schematic section view showing the other example of the magnetic cell where the magnetizations of the magnetically fixed layers C1 and C2 are fixed by the antiferromagnetic layers, respectively.

That is, in this example, the magnetic layers FM1 and FM2 and the antiferromagnetic layers AF1 and AF2 are provided outside the magnetically fixed layers C1 and C2 through the non-magnetic layers AC and FC.

The non-magnetic layer AC has the thickness with which the antiferromagnetic exchange coupling between the magnetic layers of the both sides. On the other hand, the non-magnetic layer FC has the thickness with which the coupling between the magnetic layers of the both sides becomes ferromagnetically.

Figure 17:
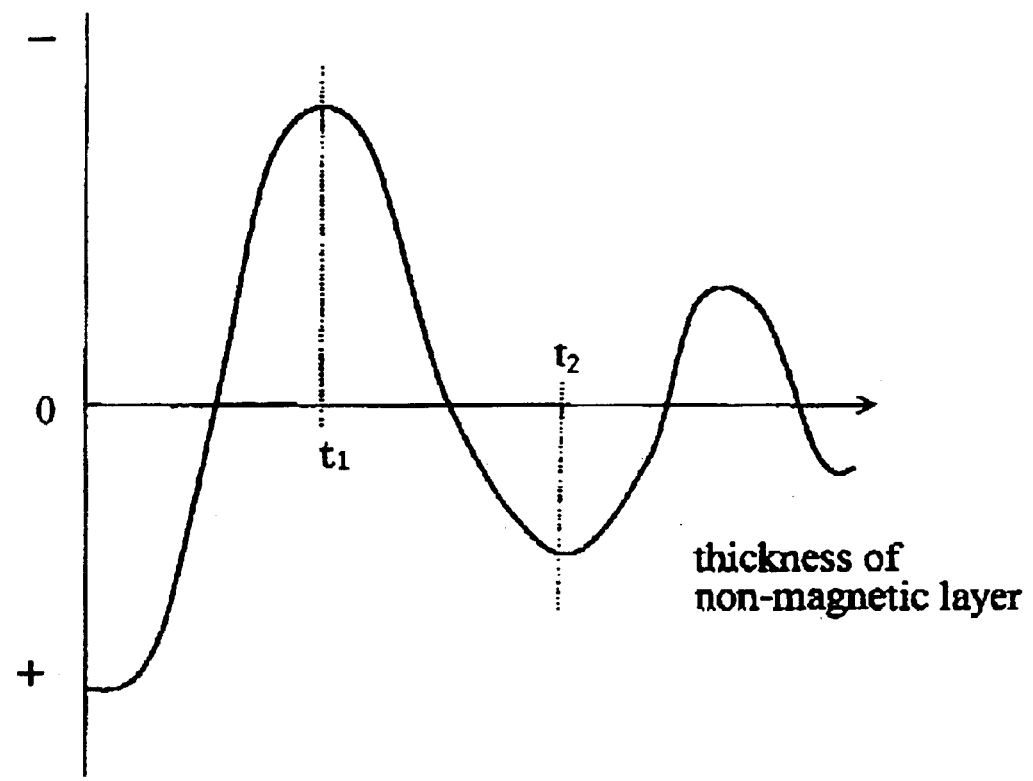
FIG. 17 is a graphical representation showing the exchange interaction between two ferromagnetic layers through the non-magnetic layer on the non-magnetic layer thickness.

Generally, the interlayer exchange coupling between two ferromagnetic layers through the non-magnetic layer oscillates between positive (ferromagnetic coupling) and negative (antiferromagnetic coupling) depending on the thickness of the non-magnetic layer, as expressed in FIG. 17. Therefore, it is desirable to set the thicknesses of the non-magnetic layers AC and FC so that two peaks may be corresponded to the different symbols in FIG. 16. For example, t1 should be made into the thickness of the non-magnetic layer AC, and t2 should be made into the thickness of the non-magnetic layer FC, in FIG. 17.

In such a structure, the magnetizations of the magnetic layers FM1 and FM2 which are adjacent to the antiferromagnetic layers AF1 and AF2 can be made to have the same directions by giving the unidirectional anisotropy by the antiferromagnetic layers AF1 and AF2, and finally the magnetizations of the magnetically fixed layers C1 and C2 can be fixed to be anti-parallel.

Or, the magnetizations of the magnetically fixed layers C1 and C2 may be fixed by the hard magnet provided adjacent to these layers. Or, the hard magnet may be used for the magnetically fixed layer C1 or C2. Magnetic materials, such as cobalt platinum (CoPt), iron platinum (FePt), and cobalt chromium platinum (CoCrPt), can be used as the hard magnet in this case.

In addition, in the case of this structure, it is desirable to pass the writing current I in the recording layer A between the magnetically fixed layers C1 and C2, as expressed with the arrow I1 in this figure (or the reverse direction to this arrow). However, from the viewpoint of actual use, it is easier to pass the current between the antiferromagnetic layers AF1 and AF2 using the electrodes provided on the antiferromagnetic layer AF1 and under the antiferromagnetic layer AF2 which is not shown as expressed with the arrow I2 in this figure (or the reverse direction to this arrow). The recording layer A can also be written-in with such a current.

In the above, the method of making the magnetizations M1 and M2 of the magnetically fixed layers C1 and C2 being anti-parallel in the magnetic cell of the invention was explained.

Now, the invention can be adapted in not only the case that one magnetic recording layer A is provided but also the case that a plurality of magnetic recording layers A is provided.

Figure 18:
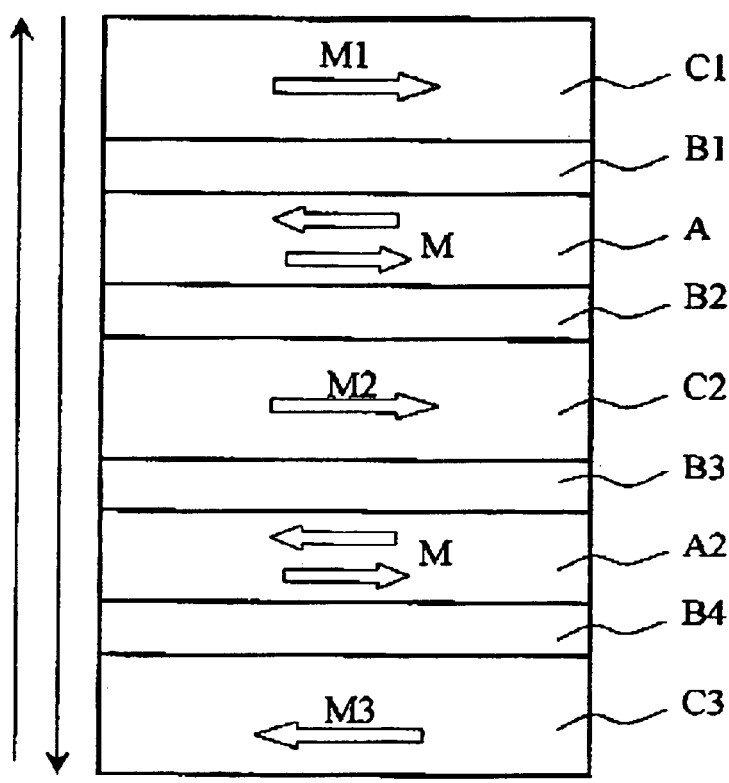
FIG. 18 shows a schematic section view showing the magnetic cell provided the two magnetic recording layers.

FIG. 18 shows a schematic section view showing the magnetic cell provided the two magnetic recording layers. That is, in this magnetic cell, the magnetically fixed layer C1, the intermediate layer B1, the magnetic recording layer A1, intermediate layer B2, the magnetically fixed layer C2, the intermediate layer B3, the magnetic recording layer A2, the intermediate layer B4, and the magnetically fixed layer C3 are laminated in this order. Namely, this magnetic cell has the structure where the magnetic cells illustrated in FIG. 1 are formed in series at the top and bottom of the magnetically fixed layer C2 sharing the magnetically fixed layer C2. Thus, a reproduction output signal can be increased by laminating the two recording layers A1 and A2 in series.

And, in FIG. 18, if the magnetization reversal currents of the magnetic recording layers A1 and A2 are differentiated by differentiating the thicknesses and/or materials of the magnetic recording layers A1 and A2, multi-valued recording will be attained. Moreover, the multi-valued record with more kinds of data can also be attained by laminating the three or more magnetic recording layers In series. In addition, the magnetization of the magnetically fixed layer C2 can be fixed more effectively by inserting the antiferromagnetic layer in the C2 layer and giving the unidirectional anisotropy.

In the invention, the magnetically fixed layer C1 (and/or C2 ) can be made into a plurality of layers, or the magnetic recording layer A can be made into a plurality of layers. Especially, when a laminated film with an antiferromagnetic coupling of ferromagnetic layer/non-magnetic layer/ferromagnetic layer is used as the magnetically fixed layer C1 (or C2 ), the magnetization reversal of the magnetic recording layer A can be attained with smaller current. The structure mentioned above about FIG. 15 can be mentioned as this example.

That is, in this figure, the laminated structure which consists of the magnetic layer FM, the non-magnetic layer AC, and the magnetically fixed layer. C1 can be regarded as "the magnetically fixed structure P1." When the magnetization direction of the magnetically fixed layer C1 being adjacent to the intermediate layer B1 of the magnetically fixed structure P1 is anti-parallel to the magnetization direction of the magnetically fixed layer C2, the effect of the invention is acquired, as expressed in FIG. 14.

In this structure, the magnetization directions of the outmost ferromagnetic layers (the magnetic layer FM of the magnetically fixed structure P1 and the magnetically fixed layer C2 ) is parallel. This results in a merit that a formation process becomes easy, since the same material is used for the antiferromagnetic by which the unidirectional anisotropies are introduced to the two outmost ferromagnetic layers, and onetime annealing process can generate the unidirectional anisotropies into the both two outmost ferromagnetic layers.

Figure 19:
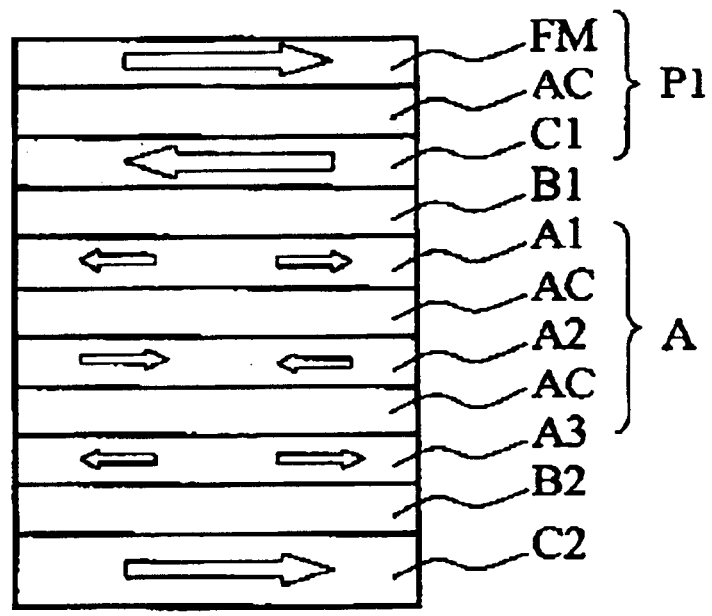
FIG. 19 shows a schematic section view showing an example where the magnetically fixed layer and the magnetic recording layer form the laminated structures.

FIG. 19 shows a schematic section view showing an example where the magnetically fixed layer and the magnetic recording layer A are laminated structures, respectively.

That is, the laminated structure which consists of the magnetic layer FM/the non-magnetic layer AC/the magnetically fixed layer C1 whose magnetizations are coupled antiferromagnetically is provided as the magnetically fixed structure P1. Furthermore, the laminated structure which consists of the magnetic layer A1/the non-magnetic layer AC/the magnetic layer A2/the non-magnetic layer AC/the magnetic layer A3 with antiferromagnetic coupling between two adjacent magnetic layers across non-magnetic layer is provided as the magnetic recording layer A.

In this structure, when the magnetization direction of the magnetically fixed layer C1 which is adjacent to the intermediate layer B1 is anti-parallel to the magnetization direction of the magnetically fixed layer C2, and the magnetization directions of the magnetic layers A1 and A2 which are adjacent to the intermediate layers B1 and B2 respectively of the magnetic recording layers A are parallel, the effect of the invention is acquired.

The effective saturated magnetization per unit volume of the magnetic recording layer can be reduced by making the magnetic recording layer A to be the laminated structure with antiferromagnetic coupling. That is, since the magnetic energy of the magnetic recording layer A can be reduced, the critical current required for the magnetization reversal, i.e., for writing-in, can be lowered.

And, in this structure, the magnetization directions of two outermost magnetic layers (the magnetic layer FM and magnetically fixed layer C2 of the magnetically fixed structure P1) arc parallel by providing the magnetically fixed structure P1. This results in a merit that a formation process becomes easy, since the same material is used for the antiferromagnetic layers which are not illustrated, by which the unidirectional anisotropies are introduced to the two outmost ferromagnetic layers, and onetime annealing process can generate the unidirectional anisotropies into the both two outmost ferromagnetic layers.

Figure 20:
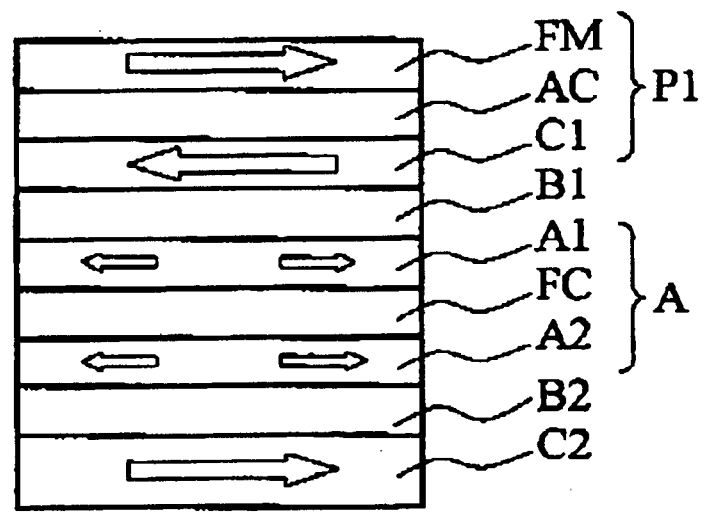
FIG. 20 shows a schematic section view showing an example where the magnetically fixed layer and the magnetic recording layer form the laminated structures, respectively.

FIG. 20 is also a schematic section view showing an example where the magnetically fixed layer and the magnetic recording layer A are laminated structures, respectively. That is, the laminated structure which consists of the Magnetic layer FM/non-magnetic layer AC/the magnetically fixed layer C1 whose magnetizations combine anti-parallel is provided as the magnetically fixed structure P1. And, the laminated structure which consists of the magnetic layer A1/the non-magnetic layer FC/the magnetic layer A2 with ferromagnetic coupling is provided as the magnetic recording layer A.

In this structure, when the magnetization direction of the magnetically fixed layer C1 which is adjacent to the intermediate layer B1 is anti-parallel to the magnetization direction of the magnetically fixed layer C2, and the magnetization directions of the magnetic layers A1 and A2 which are adjacent to the intermediate layers B1 and B2 respectively of the magnetic recording layers A are parallel, the effect of the invention is acquired.

The effective saturated magnetization per unit volume of the magnetic recording layer can be reduced by making the magnetic recording layer A to be the laminated structure with ferromagnetic coupling. That is, since the magnetic energy of the magnetic recording layer A can be reduced, the critical current required for the magnetization reversal, i.e., for writing-in, can be lowered.

And, in this structure, the magnetization directions of two outermost magnetic layers (the magnetic layer FM and magnetically fixed layer C2 of the magnetically fixed structure P1) are parallel by providing the magnetically fixed structure P1. This results in a merit that a formation process becomes easy, since the same material is used for the antiferromagnetic layers which are not illustrated, by which the unidirectional anisotropies are introduced to the two outmost ferromagnetic layers, and onetime annealing process can generate the unidirectional anisotropies into the both two outmost ferromagnetic layers.

Figure 21:
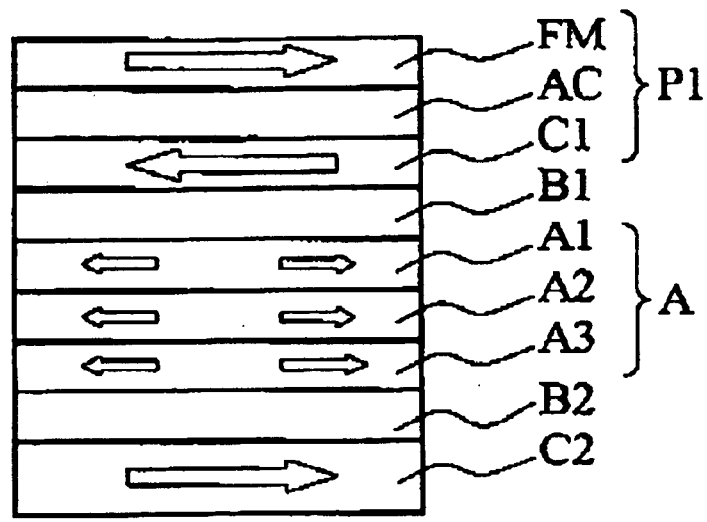
FIG. 21 shows a schematic section view showing an example where the magnetically fixed layer and the magnetic recording layer form the laminated structures, respectively.

FIG. 21 also shows a schematic section view showing an example where the magnetically fixed layer and the magnetic recording layer A are laminated structures, respectively. That is, the laminated structure which consists of the magnetic layer FM/non-magnetic layer AC/the magnetically fixed layer C1 whose magnetizations couple anti-parallel is provided as the magnetically fixed structure P1. And, the laminated structure which consists of the Magnetic layer A1/the magnetic layer A2/the magnetic layer A3 is provided as the magnetic recording layer A.

In this structure, when the magnetization direction of the magnetically fixed layer C1 which is adjacent to the intermediate layer B1 is anti-parallel to the magnetization direction of the magnetically fixed layer C2 which is adjacent to the intermediate layer B2 and the magnetization directions of the magnetic layers A1, A2 and A3 of the magnetic recording layers A are parallel the effect of the invention is acquired.

In the magnetic recording layer A which has the laminated structure with ferromagnetic coupling, the magnetization reversal current can be reduced because a permalloy with small saturation magnetization etc. can be used for the central magnetic layer (A2), and material with large spin asymmetry, such as CoFe, can be used for outside magnetic layers (A1, A3). That is, the effect that the critical current of writing-in can be lowered is acquired.

And, in this structure, the magnetization directions of two outermost magnetic layers (the magnetic layer FM and magnetically fixed layer C2 of the magnetically fixed structure P1) are parallel by providing the magnetically fixed structure P1. This results in a merit that a formation process becomes easy, since the same material is used for the antiferromagnetic layers which are not illustrated, by which the unidirectional anisotropies are introduced to the two outmost ferromagnetic layers, and onetime annealing process can generate the unidirectional anisotropies into the both two outmost ferromagnetic layers.

Figure 22:
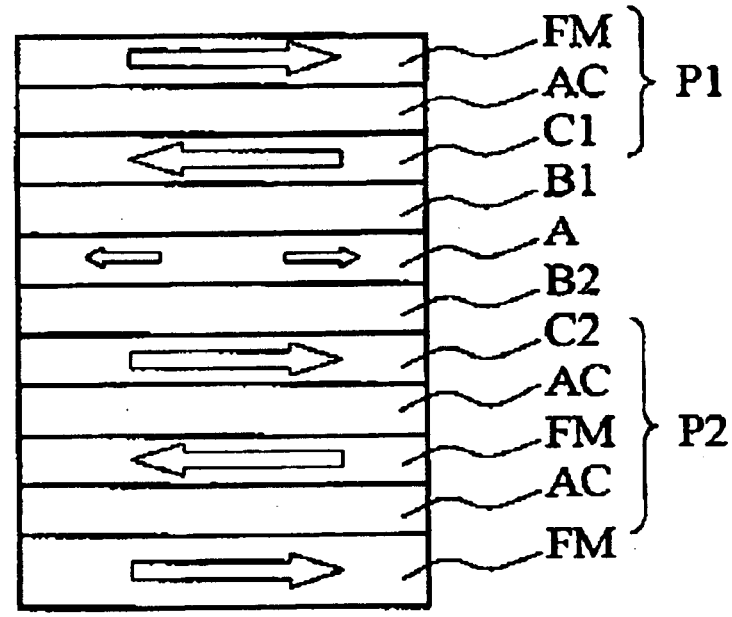
FIG. 22 shows a schematic section view showing the example in which two magnetically fixed structures are provided.

FIG. 22 shows a schematic section view showing the example in which two magnetically fixed structures are provided. That is, the laminated structure which consists of the magnetic layer FM/non-magnetic layer AC/the magnetically fixed layer C1 whose magnetizations couple anti-parallel is provided as the magnetically fixed structure P1. And, the laminated structure which consists of the magnetically fixed layer C2 the non-magnetic layer AC/the magnetic layer FM/the non-magnetic layer AC/the magnetic layer FM whose magnetizations couple anti-parallel is provided as the magnetic recording layer A.

In this structure, when the magnetization direction of the magnetically fixed layer C1 which is adjacent to the intermediate layer B1 of the magnetically fixed structure P1 is anti-parallel to the magnetization direction of the magnetically fixed layer C2 which is adjacent to the intermediate layer B2 of the magnetically fixed structure P2, the effect of the invention is acquired. And, in this structure, the total number of the magnetic layers which constitute the magnetically fixed structure P1 is even, and the total number of the magnetic layers which constitute P2 is odd.

Thus, the magnetization directions of two outermost magnetic layers (the magnetic layer FM of the top of the magnetically fixed structure P1 and the magnetic layer FM of the bottom of the magnetically fixed structure P2) are fixed to be parallel. This results in a merit that a formation process becomes easy, since the same material is used for the antiferromagnetic layers which are not illustrated, by which the unidirectional anisotropies are introduced to the two outmost ferromagnetic layers, and onetime annealing process can generate the unidirectional anisotropies into the both two outmost ferromagnetic layers.

Figure 23:
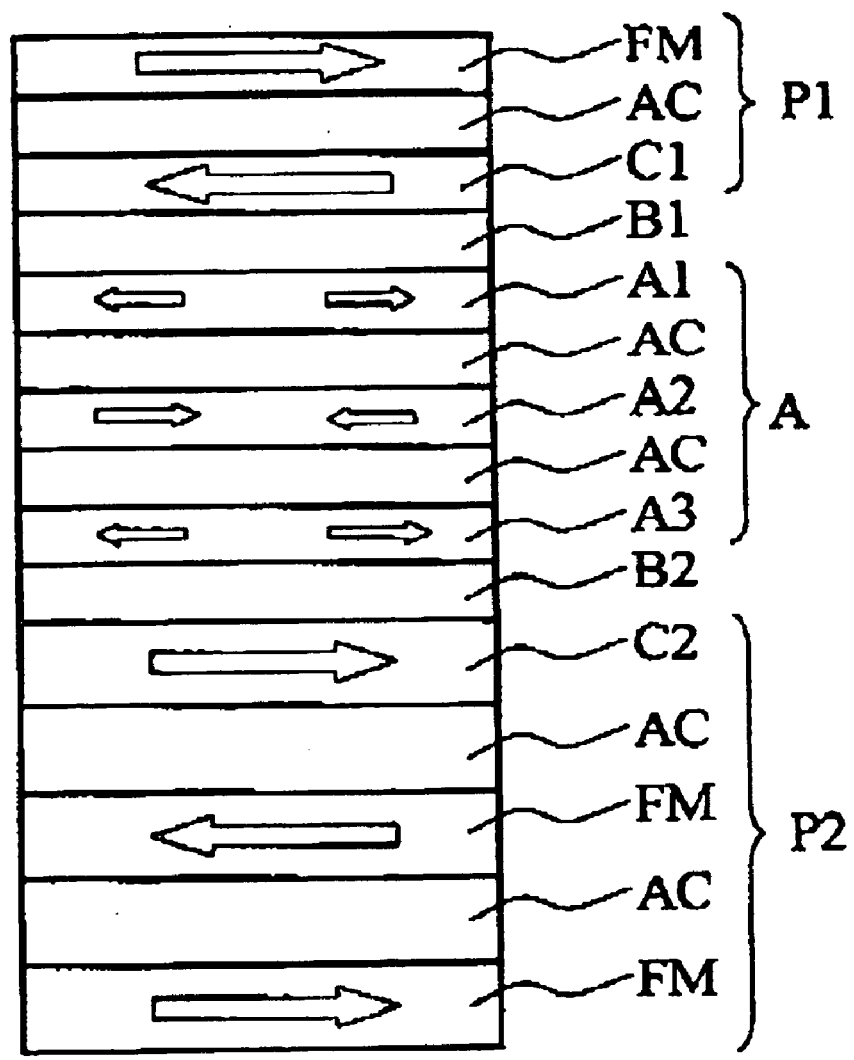
FIG. 23 shows a schematic section view showing an example where the magnetic recording layer is also the laminated structure in addition to the two magnetically fixed structures.

FIG. 23 shows a schematic section view showing an example where the magnetic recording layer is also the laminated structure in addition to the two magnetically fixed structures. That is, the laminated structure which consists of the magnetic layer FM/non-magnetic layer AC/the magnetically fixed layer C1 whose magnetizations couple anti-parallel is provided as the magnetically fixed structure P1. And, the laminated structure which consists of the magnetically fixed layer C2/the non-magnetic layer AC/the magnetic layer FM/the non-magnetic layer AC/the magnetic layer FM whose magnetizations couple anti-parallel is provided as the magnetically fixed structure P2. And, the laminated structure which consists of the magnetic layer A1/the non-magnetic layer AC/the magnetic layer A2 the non-magnetic layer AC/the magnetic layer A3 which carry out antiferromagnetic couplings is provided as the magnetic recording layer A.

In this structure, when the magnetization direction of the magnetically fixed layer C1 which is adjacent to the intermediate layer B1 of the magnetically fixed structure P1 is anti-parallel to the magnetization direction of the magnetically fixed layer C2 which is adjacent to the intermediate layer B2 of the magnetically fixed structure P2, and the magnetization directions of the magnetic layers A1 and A3 which are adjacent to the intermediate layers B1 and B2 respectively of the magnetic recording layers A are parallel, the effect of the invention is acquired. And, in this structure, the total number of the magnetic layers which constitute the magnetically fixed structure P1 is even, and the total number of the magnetic layers which constitute P2 is odd. Thus, the magnetization directions of two outermost magnetic layers (the magnetic layer FM of the top of the magnetically fixed structure P1 and the magnetic layer FM of the bottom of the magnetically fixed structure P2) are fixed to be parallel. This results in a merit that a formation process becomes easy, since the same material is used for the antiferromagnetic layers which are not illustrated, by which the unidirectional anisotropies are introduced to the two outmost ferromagnetic layers, and onetime annealing process can generate the unidirectional anisotropies into the both two outmost ferromagnetic layers.

Figure 24:
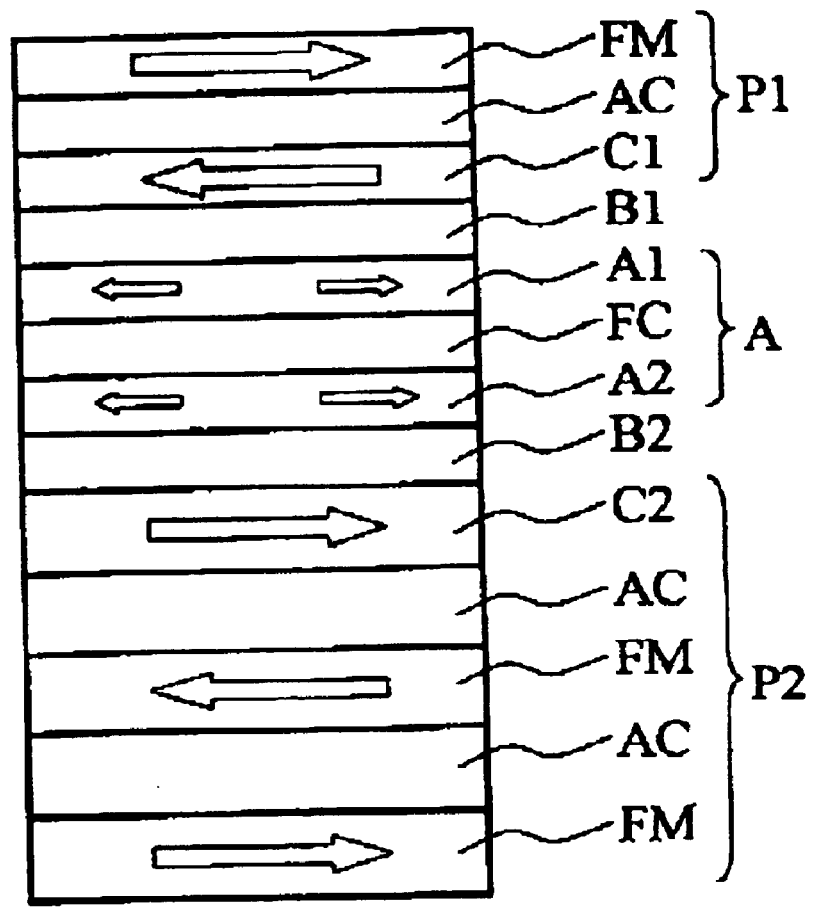
FIG. 24 shows also a schematic section view showing an example where the magnetic recording layer is the laminated structure in addition to the two magnetically fixed structures.

FIG. 24 also shows a schematic section view showing an example where the magnetic recording layer is the laminated structure in addition to the two magnetically fixed structures. That is, the laminated structure which consists of the magnetic layer FM/non-magnetic layer AC/the magnetically fixed layer C1 whose magnetizations couple anti-parallel is provided as the magnetically fixed structure P1. And, the laminated structure which consists of the magnetically fixed layer C2/the non-magnetic layer AC/the magnetic layer FM/the non-magnetic layer AC/the magnetic layer FM whose magnetizations couple anti-parallel is provided as the magnetically fixed structure P2. And, the laminated structure which consists of the magnetic layer A1/the non-magnetic layer FC/the magnetic layer A2 which carry out antiferromagnetic couplings is provided as the magnetic recording layer A.

In this structure, when the magnetization direction of the magnetically fixed layer C1 which is adjacent to the intermediate layer B1 of the magnetically fixed structure P1 is anti-parallel to the magnetization direction of the magnetically fixed layer C2 which is adjacent to the intermediate layer B2 of the magnetically fixed structure P2 and the magnetization directions of the magnetic layers A1 and A2 of the magnetic recording layers A are parallel, the effect of the invention is acquired. And, also in this structure, the total number of the magnetic layers which constitute the magnetically fixed structure P1 is even, and the total number of the magnetic layers which constitute P2 is odd. Thus, the magnetization directions of two outermost magnetic layers (the magnetic layer FM of the top of the magnetically fixed structure P1 and the magnetic layer FM of the bottom of the magnetically fixed structure P2) are fixed to be parallel. This results in a merit that a formation process becomes easy, since the same material is used for the antiferromagnetic layers which are not illustrated, by which the unidirectional anisotropies are introduced to the two outmost ferromagnetic layers, and onetime annealing process can generate the unidirectional anisotropies into the both two outmost ferromagnetic layers.

Figure 25:
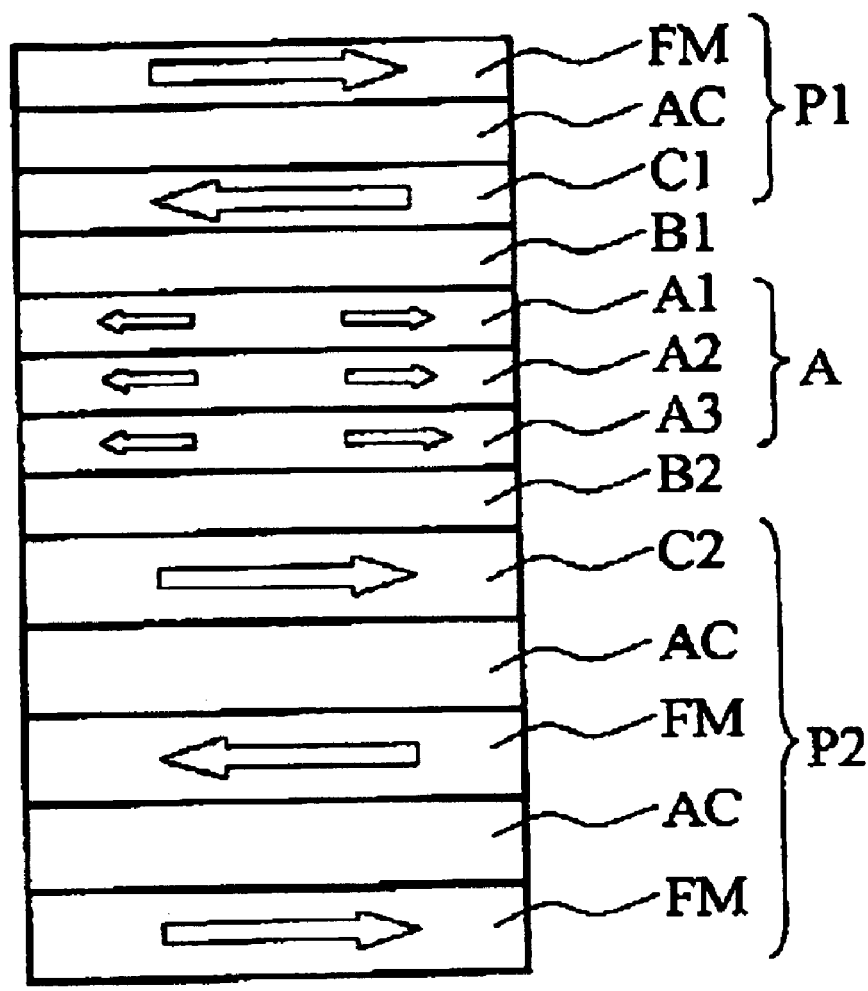
FIG. 25 shows a schematic section view showing an example where the magnetic recording layer is the laminated structure in addition to the two magnetically fixed structures.

FIG. 25 also shows a schematic section view showing an example where the magnetic recording layer is the laminated structure in addition to the two magnetically fixed structures. That is, the laminated structure which consists of the magnetic layer FM/non-magnetic layer AC/the magnetically fixed layer C1 whose magnetizations combine anti-parallel is provided as the magnetically fixed structure P1. And, the laminated structure which consists of the magnetically fixed layer C2/the non-magnetic layer AC/the magnetic layer FM/the non-magnetic layer AC/the magnetic layer FM whose magnetizations combine anti-parallel is provided as the magnetically fixed structure P2. And, the laminated structure which consists of the magnetic layer A1/the magnetic layer A2/the magnetic layer A3 is provided as the magnetic recording layer A.

In this structure, when the magnetization direction of the magnetically fixed layer C1 which is adjacent to the intermediate layer B1 of the magnetically fixed structure P1 is anti-parallel to the magnetization direction of the magnetically fixed layer C2 which is adjacent to the intermediate layer B2 of the magnetically fixed structure P2 and the magnetization directions of the magnetic layers A1, A2 and A3 of the magnetic recording layers A are parallel, the effect of the invention is acquired.

And, also in this structure, the total number of the magnetic layers which constitute the magnetically fixed structure P1 is even, and the total number of the magnetic layers which constitute P2 is odd. Thus, the magnetization directions of two outermost magnetic layers (the magnetic layer FM of the top of the magnetically fixed structure P1 and the magnetic layer FM of the bottom of the magnetically fixed structure P2) are fixed to be parallel. This results in a merit that a formation process becomes easy, since the same material is used for the antiferromagnetic layers which are not illustrated, by which the unidirectional anisotropies are introduced to the two outmost ferromagnetic layers, and onetime annealing process can generate the unidirectional anisotropies into the both two outmost ferromagnetic layers.

In the invention shown in FIG. 15 and FIGS. 19–25, it is possible to reverse the magnetization of the magnetic recording layer with current smaller than that for the cell with a single layer of the same thickness by adopting the laminated structures with antiferromagnetic coupling as magnetically fixed structures P1 and P2 as explained referring to examples.

Furthermore, it is also possible to reduce the leak magnetic field generated from the edge of the magnetic layer and avoid the problems, such as a cross talk, by using the laminated structure with antiferromagnetic coupling.

Especially, as for the magnetically fixed layer which is far apart form the substrate, it is easy to generate the leak magnetic field since the size of the in-plane direction of this layer is inevitable to be small because of a micro fabrication. The magnetic bias due to this leak magnetic field makes the reversal current larger than the case where there is no magnetic field bias in any direction, by shifting the reversal current.

In contrast, by adopting the magnetically fixed structure by the laminated film with antiferromagnetic coupling, the shift of the reversal current is prevented and the reversal current can be kept being low in either reversal direction.

As explained above, in the invention, it becomes possible to control the magnetization of the magnetic recording layer with small current, and also to read-out the magnetic cell. Therefore, magnetic memories, such as probe storage and a solid-state memory with small power consumption and high reliability can be produced by arranging a plurality of magnetic cells of the invention, as explained later in detail.

Next, each element which constitutes the magnetic cell of the invention will be explained in full detail.

As a material of the magnetically fixed layers C1 and C2 and the magnetic recording layer A, iron (Fe), cobalt (Co), nickel (Ni), the alloy including at least one element selected from the group consisting of iron (Fe), cobalt (Co), nickel (Ni), manganese (Mn), and chromium (Cr) or the group consisting of iron (Fe), cobalt (Co), nickel (Ni), manganese (Mn), and chromium (Cr), a NiFe system alloy called a "permalloy", a CoNbZr system alloy, a FeTaC system alloy, a CoTaZr system alloy, a FeAlSi system alloy, a FeB system alloy, a soft magnetism material such as a CoFeB system alloy, the Heusler alloy, a magnetic semiconductor, or half metal magnetic material oxides or half metal magnetic material nitride such as $CrO_2$, $Fe_3O_4$, and $La_{1-x}Sr_xMnO_3$ can be used.

As the "magnetic semiconductor", a magnetic element at least one of iron (Fe), cobalt (Co), nickel (Ni), chromium (Cr), and manganese (Mn), and elements consisting of compound semiconductors or oxide semiconductors can be used. Specifically, (Ga, Cr)N, (Ga, Mn)N, MnAs, CrAs, (Ga, Cr)As, ZnO:Fe, (Mg, Fe)O, etc. can be mentioned, for example.

In the invention, the material with the magnetic characteristic which suits the use can be chosen appropriately in these materials and used as materials of magnetically fixed layers C1 and C2 and the magnetic recording layer A. However, it is desirable to combine materials of each layer so that both of the magnetoresistance effect through the intermediate layer B1 and the magnetoresistance effect through the intermediate layer B2 may be of the normal type or of the reverse type. The combinations will be explained later.

And, continuous magnetic materials, or complex structures formed by particulates which are consisted of magnetic materials in non-magnetic matrix being deposited or formed, can be used as materials for these magnetism layers. As such a complex structure, the so-called "granular magnetic material" can be mentioned, for example.

When at least one of the magnetically fixed layers C1 arid C2 forms a multilayer, such as the magnetic layer/the non-magnetic layer/the magnetic layer, the magnetic layer/the non-magnetic layer/the magnetic layer/the non-magnetic layer/the magnetic layer, or the magnetic layer/the magnetic layer, it is desirable to make the magnetization direction of the magnetically fixed layer C1 (or C2) which is adjacent directly to the intermediate layer B1 (or B2) to be anti-parallel to the magnetization direction of the magnetically fixed layer C2 (or C1) which is adjacent to the intermediate layer B2.

The Inventors found out that the magnetization reversal of the magnetic recording layer A can be carried out with smaller current when the magnetically fixed layer C1 (or C2) is the laminated structure of the ferromagnetic layer/the non-magnetic layer/the ferromagnetic layer with antiferromagnetic coupling between two adjacent ferromagnetic layers. It is thought that this is based on the spin dependent scattering and reflection effects of the non-magnetic layer which arises antiferromagnetic coupling. Moreover, the shift of the characteristic to the magnetic field can be prevented by using such a laminated film of three layers for the magnetically fixed layer C1 (or C2).

In the structure expressed in FIG. 15 etc., the ferromagnetic layer FM through the non-magnetic layer AC are magnetically fixed in addition to the magnetically fixed layer C2. Then, in the example mentioned later, these three layers may be collectively called the "magnetically fixed layer."

Furthermore, as a material of the magnetic recording layer A, the laminated structure of double layer consisting of [(Co or CoFe alloy)/(the permalloy alloy or nickel which consists of NiFe or NiFeCo)], or the triple layer consisting of [(Co or CoFe alloy)/(permalloy alloy or nickel which consists of NiFe or NiFeCo)/(Co or CoFe alloy)] can be used. It is desirable for the thickness of Co or CoFe of outside to be in a range between 0.2 nm and 1 nm in the magnetic layer which has multilayer structure.

According to this structure, the magnetization reversal can be obtained with smaller current. Moreover, the magnetic recording layer A may be a multilayer where the magnetic layers are laminated. In this case, all of the magnetization of each magnetic layer which constitutes this multilayer may be in the same direction, or the magnetizations of two magnetic layers of the outside which contact the two intermediate layers B1 and B2 of the plurality of magnetic layers which constitute the magnetic recording layer A directly may be parallel. It is difficult to acquire the effect of the invention when the magnetizations of two magnetic layers of the outside which touch the two intermediate layers B1 and B2 are anti-parallel.

In either case, it is also advantageous for the writing-in of the magnetization to the magnetic recording layer A to make the magnetization easy axis of the magnetic recording layer A in parallel (or in anti-parallel) to the magnetization axes of the magnetization M1 and M2 of the magnetically fixed layers C1 and C2.

On the other hand, as a material of the intermediate layers B1 and B2, copper (Cu), gold (Au), silver (Ag), ruthenium (Ru), an alloy including at least one element selected from the group consisting of copper (Cu), gold (Au), silver (Ag), and ruthenium (Ru), an insulator consisting of a oxide, a nitride, or a fluoride including at least one element selected from the group consisting of Aluminum (Al), titanium (Ti), tantalum (Ta), cobalt (Co), nickel (Ni), silicon (Si), and iron (Fe) can be used. Elements of different kinds, such as oxygen, may be added in the electric conduction layer. And, the elements of different kinds may form the discontinuous high resistance thin film.

Furthermore, pinholes may be formed in an insulating layer and the magnetic layer may reach them. Moreover, It is desirable to use the materials with which both of the magnetoresistance effects become of the normal type or both of the magnetoresistance effects become of the reverse type, as the materials of the intermediate layer B1 and B2.

The combination of the material of the intermediate layer and the materials of the magnetic layers of the both sides decides whether the magnetoresistance effect becomes of the normal type or of the reverse type.

In the invention, it is not desirable to use the combinations of materials with which one is of the normal type and the other is of the reverse type. Here, as mentioned above, the "normal type" corresponds the case where the resistance becomes large when the magnetization directions of magnetic layers provided on both sides of the intermediate layer are anti-parallel. And, the "reverse type" corresponds the case where the resistance becomes stall when the magnetization directions of magnetic layers provided on both sides of the intermediate layer are anti-parallel. The reason why it is not desirable to use the combinations or normal type and reverse type is as the following:

That is, in the reverse type, the reverse spin to the spin of the normal type contributes to the conduction (tunneling is also included). Therefore, the resistance becomes small when the magnetization directions of magnetic layers provided on both sides of the intermediate layer are anti-parallel. However, since the electron with reverse spin contributes to the conduction (tunneling is also included), the write-in direction becomes reverse direction to the normal type.

Therefore, when passing current towards the magnetic recording layer A from the magnetically fixed layer C1 (or C2), the magnetization of the magnetic recording layer A is anti-parallel to the magnetization of the magnetically fixed layer C1 (or C2). And, when passing current towards the magnetically fixed layer C1 (or C2) from the magnetic recording layer A, the magnetization of the magnetic recording layer A is parallel to the magnetization of the magnetically fixed layer C1 (or C2).

Therefore, the effect of the invention can not be acquired when one of the intermediate layers B1 and B2 is of the normal type and the other is of the reverse type, combining with the materials of the magnetic layers of the both sides. That is, in this invention, it is necessary to make the magnetization directions of the outer magnetically fixed layers C1 and C2 anti-parallel, and to combine the materials of the magnetic layers with the intermediate layers appropriately so that both of the magnetoresistance effect through the intermediate layer B1 and the magnetoresistance effect through the intermediate layer B2 may be of the normal type or both may be of the reverse type.

As the materials of the intermediate layer B1 and B2 for obtaining the normal type magnetoresistance effect, copper (Cu), silver (Ag), gold (Au), and these compounds, insulator with hole filled with alumina, magnesium oxide (MgO), nitride aluminum (Al—N), oxidization nitride silicon (Si—O—N), or copper (Cu), and insulator with hole filled with magnetic materials can be mentioned.

In addition to the above materials as the materials of the intermediate layer B1 and B2, as the materials of the magnetically fixed layers C1 and C2, Co, Fe, Ni, CoFe, alloy containing Mn or Cr, and so-called metal system ferromagnetic material such as CoFeB or Heusler alloy can be mentioned. Then, the normal type magnetoresistance effect is obtained between the magnetically fixed layer C1 and the magnetic recording layer A and between the magnetically fixed layer C2 and the magnetic recording layer A.

Moreover, when using the magnetic material of the oxide system such as $CrO_2$, $Fe_3O_4$, and $La_{1-x}Sr_xMnO_3$ for the magnetic layers, the normal type magnetoresistance effect is obtained only when the materials of the magnetically fixed layers C1 and C2 and the material of the magnetic recording layer A are the same.

As the materials of the intermediate layers B1 and B2 for obtaining the reverse type magnetoresistance effect, oxidization tantalum (Ta—O) etc. can be mentioned. When the so-called metal system ferromagnetic materials mentioned above are used as materials of the magnetically fixed layers C1 and C2 and the magnetic recording layer A, the reverse type magnetoresistance effect is obtained by combining with the intermediate layers B1 and B2 of the oxidization tantalum.

Furthermore, as the combination of the magnetic layer/the intermediate layer/the magnetic layer from which the reverse type magnetoresistance effect is obtained, the combination of the metallic magnetic layer/the oxide insulator intermediate layer/the oxide magnetic layer can be mentioned.

For example, $Co/SrTiO_3/La_{0.7}Sr_{11.3}MnO_3$, and $Co_9Fe/SrTiO_3/La_{0.7}Sr_{0.3}MnO_3$.etc can be used. Moreover, the combination of the magnetite/the insulator intermediate layer/the perovskite system oxide magnetic material of $Fe_3O_4/CoCr_2O_4/La_{0.7}Sr_{0.3}MnO_3$.etc can be mentioned as the combination of the magnetic layer/the intermediate layer/the magnetic layer from which the reverse magnetoresistance effect is obtained. Furthermore, the combination of $CrO_2$/Cr oxide insulator/Co can be mentioned as a combination of the magnetic the layer/the intermediate layer/the magnetic layer from which the reverse type magnetoresistance effect is obtained.

On the other hand, it is desirable to use iron manganese (FeMn), platinum manganese (PtMn), palladium manganese (PdMn), palladium platinum manganese (PdPtMn), iridium manganese (IrMn), platinum iridium manganese (PtIrMn), etc. as a material of the antiferromagnetic layer AF for fixing the magnetizations of the magnetically fixed layers C1 and C2. Moreover, it is desirable to use the material including at least one of copper (Cu), gold (Au), silver (Ag) and ruthenium (Ru), or the alloy containing these materials as the non-magnetic layer for fixing the magnetizations by exchange coupling between ferromagnetic layers.

It is desirable to make the thicknesses of the magnetically fixed layers C1 and C2 in a range between 0.6 nm and 100 nm, and to make the thickness of the magnetic recording layer A in a range between 0.2 nm and 50 nm. Moreover, it is desirable to make the thicknesses of the intermediate layers B1 and B2 of the conductor in a range between 0.2 nm and 20 nm, and to make the thicknesses of the intermediate layers B1 and B2 containing insulator in a range between 0.2 nm and 50 nm.

On the other hand, as for the plane shape of the magnetic element, for example, It is desirable to make the plane shape of the record magnetic layer C to form into a shape of a rectangular, an elongated hexagonal, an ellipse, a rhomboid or a parallelogram. As for the aspect ratio, it is desirable to set it in a range about from 1:1 to 1:5 so that a uniaxial magnetic anisotropy can be introduced without forming the edge domains.

However, in the case of the cell in a doughnut shape, it is desirable to shape the form where a magnetic vortex domain is easy to be formed exceptionally.

It is desirable to make the length of one side of the longitudinal direction of the magnetic recording layer A in a range between 5 nm and 1000 nm.

In addition, although the examples where the sizes of the directions of a film plane in the magnetically fixed layers C1 and C2 and that in the magnetic recording layer A are the same are expressed in FIG. 1, etc, the invention is not limited to these examples. That is, the magnetic cell may be formed having different size of each layer, for connecting wirings or for controlling the magnetization direction. Moreover, the shape of each layer of the magnetic cell may be different from each other.

As explained above, in the magnetic cell of the invention, the magnetization can be written in the magnetic recording layer A with small write-in current by the spin-polarized current. Furthermore, the magnetization of the magnetic recording layer A can also be read out by the magnetoresistance effect. And the magnetic cell of the invention has the advantage that the formation of an array or the integration is easy, for its small size.

Since the magnetic cell of the invention is minute and has a write-in function and a read-out function, it can be applied to various kinds of uses. Next, the example where the magnetic cells of the invention are arranged and used for a recording-reproducing equipment will be explained.

Figure 26:
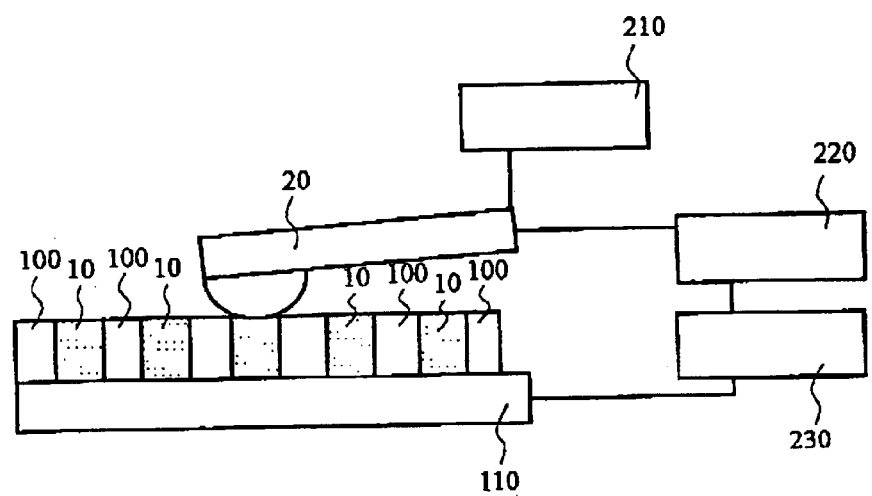
FIG. 26 is a schematic diagram showing the magnetic memory using the magnetic cells of the invention.

FIG. 26 is a schematic diagram showing the magnetic memory using the magnetic cell of this example. That is, this example is a probe storage which applies the magnetic cell of the invention to the so-called "patterned media" and accesses it with the probe.

The recording medium has the structure where the magnetic cells 10 of the invention are arranged in the plane of the insulators 100 with high resistance in a matrix fashion, on the conductive substrate 110. In the magnetic memory, a probe 200 is formed on the surface of a medium for selecting these magnetic cells, and a drive mechanism 210 for controlling the relative location between the probe 200 and the surface of the medium, a power supply 220 for applying current or voltage to the magnetic cells 10 from the probe 200 and a detector circuit 230 for detecting the internal magnetization state of the magnetic cells as changes of resistances are provided.

In the example expressed in FIG. 26, although the drive mechanism 210 is connected to the probe 200, since the relative position of the probe to the medium should just change, the drive mechanism 210 may be provided in the medium side. As expressed in this figure, a plurality of magnetic cells 10 of the invention is made to arrange on the conductive substrate 110, and it is considered as the patterned medium. And writing and recording are performed by passing the current through the magnetic cells 10 between the conductive probe 200 and the substrate 110. Moreover, although the cells 10 share only the bottom electrode in the substrate 110 in the example expressed in FIG. 26, the cells 10 may share the layers of their cells as expressed in FIG. 27. In such structure, the manufacturing process becomes simpler and the characteristics can be uniformed further.

The selection of one of the magnetic cell from the magnetic cells 10 is performed by changing the relative location between the conductive probe 200 and the patterned medium. It is necessary for the conductive probe 200 only to be connected to a magnetic cell 10 electrically. The conductive probe 200 may touch the magnetic cell 10, or does not need to touch the magnetic cell 10. When the conductive probe 200 does not touch the magnetic cell 10, recording and reproduction can be performed using the tunnel current flowing between the magnetic cell 10 and the probe 200 or the current by the field emission.

The recording in the magnetic cell 10 is performed by the current flowing to the magnetic cell 10 from the probe 200 which accessed the magnetic cell, or the current flowing from the magnetic cell 10 to the probe 200. When the magnetization reversal current determined with the size, structure, composition, etc. of the magnetic cells 10 is Ts, the recording can be performed by passing the write-in current Iw larger than Is to the cells. The direction of the magnetization recorded is the same as the direction of the magnetization of the magnetically fixed layer through which the electron current passes first, in the case where the magnetic cell consists of the normal type and normal type combination. Therefore, the writing of "0" or "1" can be appropriately performed by reversing the electronic flow, i.e., the polarity of the current.

The reproduction is performed by the current flowing from the probe 200 accessing to the magnetic cells 10, or the current flowing to the probe 200, as well as the record. However, when reproducing, the reproduction current Ir smaller than the magnetization reversal current Is is passed. And the record state of the magnetic recording layer A is judged by detecting the voltage or the resistance (when the voltage is applied, by detecting the current). Therefore, in the magnetic memory of this example, the recording is attained by passing larger current Iw than Ir.

Figure 28:
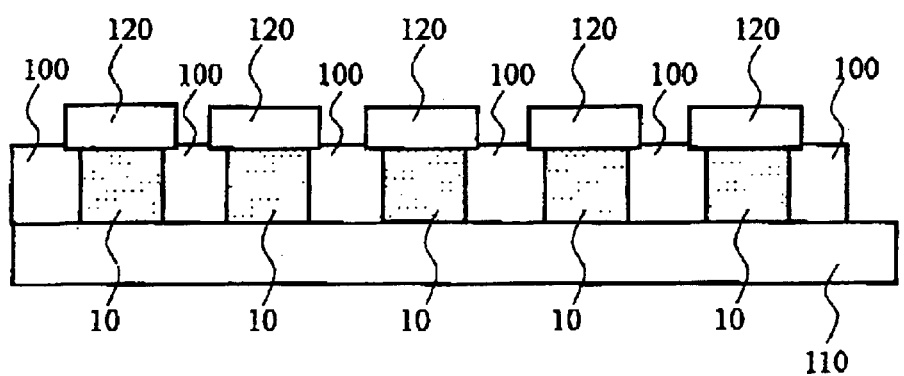
FIG. 28 shows a schematic section view showing the second example of the magnetic memory using the magnetic cells of the invention.

FIG. 28 is a schematic section view showing the second example of the magnetic memory using the magnetic cells of the invention.

That is, the magnetic memory of this example has the structure where the parallel arrangement of a plurality of the magnetic cells 10 is arranged on the electrode layer (lower wiring) 110. The magnetic cells 10 are electrically isolated with the insulators 100. The wirings 120 which are so-called the bit line and the word line are connected to each magnetic cell 10. The specific magnetic cell 10 can be selected by specifying the bit line and the word line.

The record to the magnetic cells 10 is performed by the current passing from the wirings 120 to the magnetic cells 10, or the current passing from the magnetic cells 10 to the wirings 120. It becomes possible to record by passing through the cells the write-in current Iw larger than the magnetization reversal current is which is determined with the size, structure, composition, etc. of the magnetic cells 10. The direction of the magnetization recorded is the same as the direction of the magnetization of the magnetically fixed layer through which the electron current passes first, in the case where the magnetic cell consists of the normal type and normal type combination. Therefore, the writing of "0" and "1" can be performed by reversing the electronic flow, i.e., the polarity of the current.

The reproduction is performed by the current passing from the wirings which accessed to the magnetic cells 10 or the current passing to the wirings, as well as the record. But, when reproducing, the reproduction current Ir smaller than Is is passed. And the record state is judged by detecting the voltage or the resistance (when the voltage is applied, by detecting the current). Therefore, also in the magnetic memory of this example, the recording is attained by passing the larger current Iw than Ir.

EXAMPLES

Hereafter, the embodiment of the invention will be explained in more detail, referring to examples.

First Example

Figure 29A:
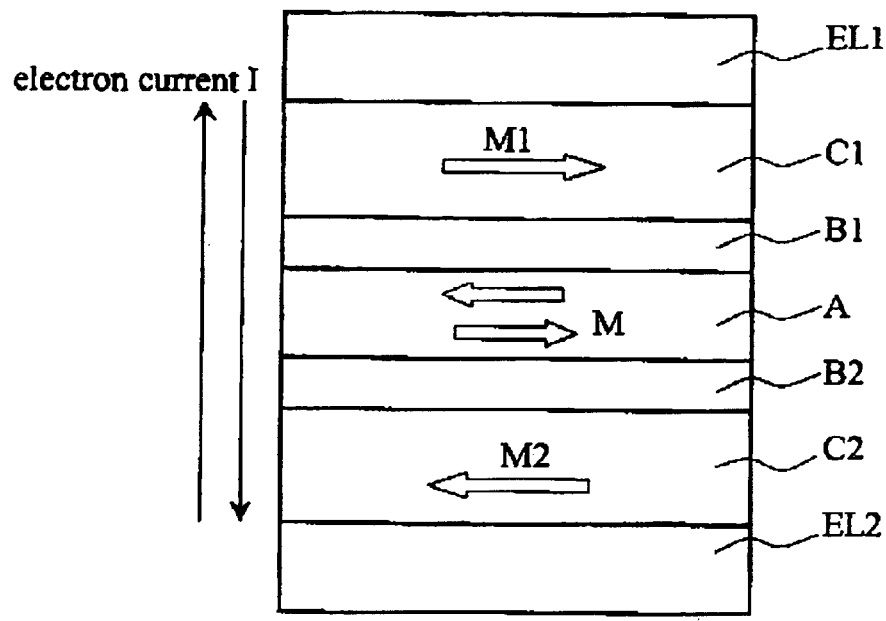
FIG. 29A is a schematic diagram showing the principal part section structure of the magnetic cell of this example.
Figure 29B:
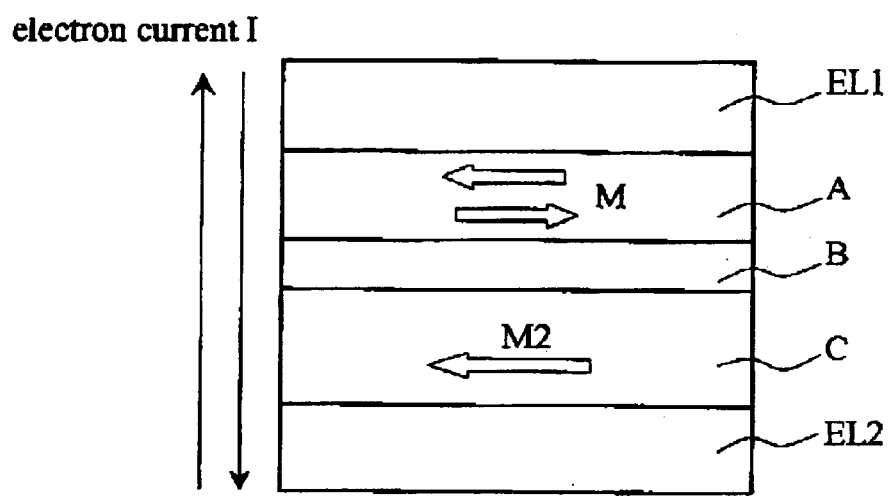
FIG. 29B is a schematic diagram showing the principal part section structure of the magnetic cell of the comparative example.

FIG. 29A is a schematic diagram showing the principal cross-sectional structure of the magnetic cell of this example, and FIG. 29B is a schematic diagram showing the principal cross-sectional structure of the magnetic cell of the comparative example.

That is, the magnetic cell of this example (sample I) has the structure where the electrode EL 1, the magnetically fixed layer C1, the intermediate layer B1, the magnetic recording layer A, intermediate-layer B2, the magnetically fixed layer C2, and the electrode EL 2 are laminated. Moreover, the magnetic cell of the comparative example (sample II) has the structure where the electrode EL 1, the magnetic recording layer A, the intermediate layer B, the magnetically fixed layer C, and the electrode EL2 are laminated. The material and the thickness of each layer are as the following:

Sample I: EL1(Cu)/C1(Co:20 nm)/B1(Cu:10 nm)/A(Co: 3 nm)/B2(Cu:6 nm)/C2(Co:20 nm)/EL2 (Cu)

Sample II:EL1(Cu)/A(Co:3 nm)/B(Cu:6nm)/C (Co: 20 nm)/EL2 (Cu)

The laminated structure is formed on the lower electrode EL2 by ultrahigh-vacuum sputtering equipment. And the resist was applied after forming the tantalum (Ta) protective film which is not illustrated on the cell. Then, EB (electron beam) dwaring was carried out, the mask was formed, and the cell was processed by the ion milling. The processing size of the cell was 100 nm×50 nm.

The value of the magnetization reversal current of the magnetic recording layer A was obtained from the change of the resistance to the amount of the current perpendicularly passed to the film plane about the obtained sample. As a result, the average value of the positive/negative reversal current was 3.1 mA at Sample I and 1.4 mA at Sample II. And, although the asymmetry over positive/negative current was seen at Sample II, this asymmetry was canceled at Sample I.

That is, by providing the two magnetically fixed layers C1 and C2 whose magnetizations were anti-parallel, the magnetization reversal current of the recording layer A decrease and the improvement of the symmetry of the write-in current was found. It is thought that the symmetry of the write-in current was improved because the magnetic cell became more symmetrical against the polarity of the current by providing the magnetically fixed layers C1 and C2 of the antiferromagnetic arrangement with the anti-parallel magnetization directions.

Second Example

Next, the example of the magnetic cell of the structure expressed in FIG. 15 will be explained as the second example of the invention. In addition, in this example, the magnetic cell of the laminated structure which was reversed the upper and lower sides to FIG. 15 was made as an experiment.

First, the lower electrode EL 1 which consists of tantalum (Ta) and copper (Cu) was formed on the wafer by using the ultrahigh-vacuum sputtering equipment. PtMn 20 nm (the antiferromagnetic layer AF1), CoFe 5 nm (the magnetic layer FM), Ru 1 nm (the non-magnetic layer AC), CoFe 2 nm (the magnetically fixed layer C1), Cu 3 nm (the intermediate layer B1), CoFe 2 nm (the magnetic recording layer A), Cu 3 nm (the intermediate-layer B-2), CoFe 4 nm (the magnetically fixed layer C2), and PtMn 20 nm (the antiferromagnetic layer AF2) were formed on the bottom electrode EL 1. Furthermore, the laminated film which consists of copper (Cu) and tantalum (Ta) was formed on the cell.

Unidirectional anisotropy was given by annealing this wafer in a magnetic field at 270 degrees C. for 10 hours in a magnetic field vacuum furnace. One wafer was taken out at this time, the vibrating sample magnetometer (VSM) performed hysteresis loop measurement of the magnetic field dependence of magnetization, and anti-parallel magnetization fixing to C1 and C2 was checked. EB resist was applied to this film, EB drawing was carried out, and the mask with predetermined form was formed in lift-off. Next, the region which is not covered with the mask was etched by the ion-milling equipment. Here, the amount of etching can be grasped correctly by monitoring the mass of the sputtering particle by using quadruple mass spectrometer.

The mask was removed after the etching, $SiO_2$ film was then formed thereon, the surface was smoothed and the face of tantalum (Ta) was exposed by using the ion milling. The upper electrode was formed on this tantalum face. Thus, the element shown in FIG. 6 was made.

According to the process explained above, the directions of the magnetizations of the magnetically fixed layers C1 and C2 provided at the upper and lower sides of the magnetic recording layer A can be fixed anti-parallel.

Third Example

The magnetic cell having the structure expressed in FIG. 15 was made as an experiment by the same process as the second example. Also in this example, the magnetic cell having the laminated structure which is reversed the upper and lower sides to FIG. 15 was made as an experiment. The material and thickness of each layer are as the following:

AF1 (PtMn:20 nm)/FM1(CoFe:5 nm)/AC(Ru:1 nm)/C1 (CoFe:2 nm )/B1(Cu:3 nm)/A(CoFe:2 nm)/B2(Cu:3 nm)/C2 (CoFe:2 nm)/FC(Cu:5 nm)/FM2 (CoFe:5 nm)/AF2 (PtMn:20 nm)

Also in this structure, the directions of the magnetizations of the magnetically fixed layers C1 and C2 were able to be fixed anti-parallel with the same process as what was mentioned above about the second example.

Fourth Example

Next, samples (sample II through sample V) whose magnetoresistance effects are detected easily were formed by giving asymmetry two intermediate layers B1 and B2 as the fourth example of the invention. And the resistance change accompanying the current drive magnetization reversals were evaluated and studied, compared with the sample (sample I) whose intermediate layer is symmetrical. The structures of the center parts of the magnetic cells of samples are as the followings:

Sample I:
C1(CoFe:10 nm)/B1(Cu:8 nm)/A(CoFe:3 nm)/B2(Cu:8 nm)/C2(CoFe:10 nm)

Sample II:
C1(CoFe:10 nm)/B1(Cu:8 nm)/A(CoFe:3 nm)/B2(Cu:4 nm)/C2 (CoFe:10 nm)

Sample III:
C1 (CoFe:10 nm)/B1(Cu:8 nm)/A(CoFe:3 nm)/B2(Cu:2 nm)/IE (Al—Cu—O:0.6 nm)/B2(Cu:2 nm)/C2(CoFe:10 nm)

Sample IV:
C1(CoFe:10 nm)/B1(Cu:8 nm)/A(CoFe:3 nm)/B2($Al_2O_3$-CoFe: 3nm)/C2 (CoFe:10 nm)

Sample V:
C1(CoFe:20 nm)/B1(Cu:8 nm)/A(CoFe:3 nm)/B2(Cu:8 nm)/C2 (CO:2 nm)

In sample J, the intermediate layers B1 and B2 are symmetrical. In sample II, the thickness of the intermediate layers B1 and B2 are asymmetry (FIG. 9). In sample III, the very thin oxide layer (IE) is inserted into the intermediate-layer B2 (FIG. 10). In sample IV, as the intermediate-layer B2, CoFe is precipitated in alumina by simultaneous deposition of alumina and CoFe, and forms the point contacts of magnetic materials (FIG. 11). In sample V, the thicknesses and compositions of the magnetically fixed layers C1 and C2 are asymmetry (FIG. 8).

In Sample IV, annealing for taking the lattice adjustment at the point contacts was carried out. And, the two magnetically fixed layers C1 and C2 were fixed anti-parallel by the same method as the second example, by providing the PtMn/CoFe/Ru layers on the bottom of the each sample and the PtMn layer on the top of the each sample.

The changes of the resistances accompanying the magnetization reversals of the magnetic recording layers A were obtained by sweeping the current flowing perpendicular to the layer plane. The results were as the followings:

| Sample number | rate or resistance change |
|---|---|
| Sample I | <0.1% |
| Sample II | 0.4% |
| Sample III | 5.0% |
| Sample IV | 20% |
| Sample V | 0.6% |

From this result, it turned out that the efficiency of the detection became high in the samples with asymmetrical, and especially, the sensitivity of the signal detection became higher in the samples in which asymmetries were given to the intermediate layer B1 and B2 .

The Fifth Example

Next, the magnetic cells which have the same structure as the sample IV of the fourth example were arranged on the substrate and the matrix of 32 pieces×32 pieces of the cells was formed as expressed in FIG. 26 as the fifth example of the invention. The 32 pieces×32 pieces of the matrixes were arranged, and the recording and reproduction medium of 1M (mega) bit in total was formed. And the magnetic memory, where the recording and reproduction was performed to this recording and reproduction medium, with the 32 pieces×32 pieces of the probes was manufactured. That is, one probe corresponds to one set of the matrix in the magnetic memory or this example.

Figure 30:
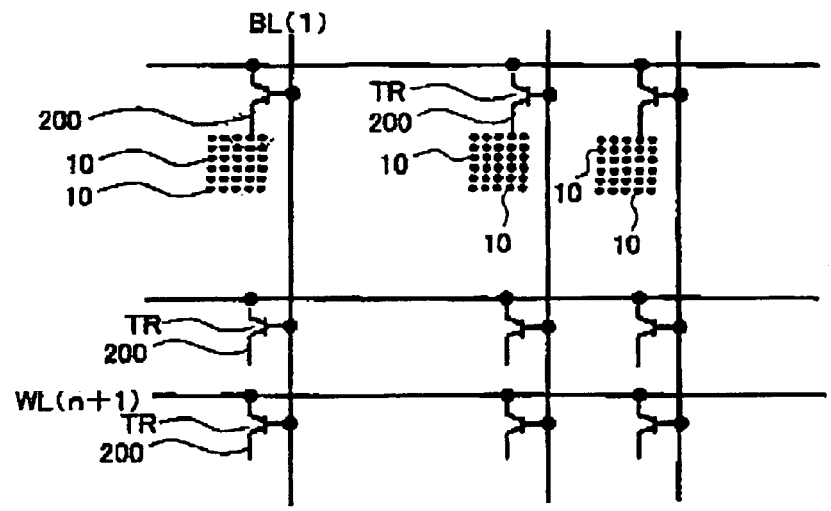
FIG. 30 is a schematic diagram showing the probing in the fifth example.

The probing is performed as expressed in FIG. 30. An XY drive mechanism provided with the medium can make each probe 200 select the cell. However, if the location changes relatively, the drive mechanism 210 provided with the probe 200 may select the cell. Moreover, since the probes 200 were multiplied, each probe was connected with the so-called word line WL and the so-called bit line BL, and the probes 200 can be selected by specifying the word line WL and the bit line BL.

The recording and reproduction to the magnetic cells 10 was performed by the current poured from the probes 200 which accessed the magnetic cells. Here, by passing the current of plus 1.2 mA and minus 1.2 mA, "0" and "1" signal were written in, respectively. Moreover, for reproduction, the voltage of the cell at the time of passing the current of 0.5 mA or less was read, and the large and small voltages obtained were assigned to "0" and "1." For comparison, writing-in was performed with the write-in current of plus 0.5 mA and minus 0.5 mA, and reading was performed with the reproduction current of 0.4 mA or less. As a result, when the write-in current was plus 1.2 mA and minus 1.2 mA, writing-in can be performed, but when the write-in current was plus 0.5 mA and minus 0.5 mA, writing-in cannot be performed.

The Sixth Example

Next, the example of making the magnetic memory using the magnetic cell which has the same structure as the sample III of the fourth example will be explained as the sixth example of the invention.

First, the lower bit lines and the transistors were beforehand formed on the wafer. The magnetic cell array was formed by the same method as the process mentioned above about the second example. Then, the word lines were formed on the magnetic cell array, and the magnetic memory where the electrodes of the magnetic cells were connected to the bit lines and the word lines was formed as expressed in FIG. 31.

The selection of the magnetic cells 10 is performed by specifying the word lines WL and the bit lines BL which were connected with the magnetic cells. That is, the transistors TR are made into ON by specifying the bit lines BL, and the current is passed through the magnetic cells 10 between the word lines WL and the electrodes. Here, it becomes possible to record by passing the write-in current Iw larger than the magnetization reversal current Is which depends on the size, structure, composition, etc. of the magnetic cell through the cell. The average value of Is of the magnetic cell made in this example was 1.8 mA. Therefore, when the absolute value of the write-in current is larger than 1.8 mA, it becomes possible to write in. And, the reading current must not exceed 1.8 mA.

In addition, although the probe or the transistor was used for selecting the cells in the fifth example and the sixth example, other switching elements may be used. It is more desirable to use other switching elements which have low resistance at the time of ON. Moreover, diodes may be used.

The Seventh Example

Next, the sample of the following was made by transforming the structure of the magnetic recording layer A of the sample I in the first example by the same manufacturing method as the first example as the seventh example of the invention:

EL1(Cu)/C1(Co:20 nm)/B1(Cu:10 nm)/A(Co:0.6 nm)/A(Ni:1.8 nm )/A(Co:0.6 nm)/B2(Cu:6 nm)/C2 (Co:20 nm)/EL2(Cu)

That is, the laminated structure of Co(0.6 nm)/Ni(1.8 nm)/Co(0.6 nm) was adopted as the magnetic recording layer A. About the magnetization reversal characteristic of this sample, the reversal current was 1.1 mA and the reversal current reduced more compared with the sample I of the first example. This is considered because the magnetic energy of the magnetic recording layer A is reduced.

The Eighth Example

Next, the magnetic cell having the structure expressed in FIG. 15 was manufactured as the eighth example of the invention. First, two kinds of magnetic cells (the sample A10, the sample B10) manufactured in this example will be explained.

The sample A10 has the "anti-parallel dual pin structure" which is the structure where PtMn (20 nm) as the antiferromagnetic layer AF2, $Co_9Fe_1$ (20 nm) as the magnetically fixed layer C2, Cu (4 nm) as the intermediate-layer B2, $Co_9Fe_1$ (2.5 nm) as the magnetic recording layer A, Cu (6 nm) as the intermediate layer B1, $Co_9Fe_1$ (4 nm) as the magnetically fixed layer C1, Ru (1 nm) as the non-magnetic layer AC, $Co_9Fe_1$ (4 nm) as the magnetic layer FM, PtMn (15 nm) as the antiferromagnetic layer AF and the upper electrode which is not illustrated are laminated in this order on the lower electrode which is not illustrated. In this structure, both of the magnetoresistance effect (MR) through the intermediate layer B1 and that through the intermediate layer B2 are of the normal type MR. Three kinds of samples with element size (60 nm×110 nm, 80 nm×165 nm, and 110 nm×240 nm) were produced.

On the other hand, the sample B10 has the structure where PtMn (20 nm) as the antiferromagnetic layer AF2, Co9Fe1 (10 nm) as the magnetically fixed layer C2, $Al_2O_3$ (0.8 nm) as the intermediate-layer B2, $Co_9Fe_1$ (2.5 nm) as the magnetic recording layer A, Cu (6 nm) as the intermediate layer B1, $Co_9Fe_1$ (4 nm) as the magnetically fixed layer C1, Ru (1 nm) as the non-magnetic layer AC, $Co_9Fe_1$ (4 nm) as the magnetic layer FM, PtMn (15 nm) as the antiferromagnetic layer AF and the upper electrode which is not illustrated are laminated in this order on the lower electrode which is not illustrated.

In this structure, both of the magnetoresistance effect (MR) through the intermediate layer B1 and that through the intermediate layer B2 were of the normal type MR although the materials of the intermediate layer B1 and the intermediate layer B2 were different from each other. Three kinds of samples with element size (60 nm×110 nm, 80 nm×165 nm, and 110 nm×240 nm) were produced, as the sample A10.

The sample A10 was manufactured with the following procedure.

First, the lower electrode was formed on the wafer.

Then, the wafer was put in to the ultrahigh-vacuum sputtering equipment, and sputtering cleaning of the surface was carried out. Then, the multilayer film having the structure of PtMn(20 nm)/$Co_9Fe_1$ (20 nm)/Cu(4 nm)/$Co_9Fe_1$ (2.5 nm)/Cu(6 nm)/$Co_9Fe_1$ (4 nm)/Ru(1 nm) /$Co_9Fe_1$ (4 nm)/

PtMn (15 nm) was deposited. This multilayer film was picked out from equipment.

Next, the wafer was put in to the vacuum magnetic field furnace, and annealing in the magnetic field was performed at 270 degrees C. for 10 hours. Thus the exchange biases were given to the magnetically fixed layers C1 and C2. Next, the resist was applied and the electron beam exposure was carried out with EB (electron beam) drawing equipment. Then, the mask patterns corresponding to the element sizes mentioned above were formed. The element was formed by milling these patterns to the top of the magnetically fixed layer C2 with ion-milling equipment.

The form of the element was set up so that the lateral direction of the element might become in parallel with the direction of the exchange bias of the magnetically fixed layers C1 and C2. And $SiO_2$ was embedded in the surroundings of this element, the top electrode was formed, and the magnetic cell was completed.

The sample B10 was manufactured with the following procedure.

First, the lower electrode was formed on the wafer. Then, the wafer was put in to the ultrahigh-vacuum sputtering equipment. Then, the multilayer film having the structure of PtMn(20 nm)/CoFe(10 nm)/A1 was deposited. Next, $Al_2O_3$ was formed by introducing oxygen into the sputtering equipment and oxidizing aluminum (Al). Here, the aluminum oxide whose composition is not $Al_2O_3$ but a composition lacking some oxygen may be formed. This is the same about other examples explained in this text.

Then, after evacuation of oxygen, the multilayer film having the structure of PtMn (20 nm)/$Co_9Fe_1$ (20 nm)/Cu (4 nm)/$Co_9Fe_1$ (2.5 nm)/Cu (6 nm)/$Co_9F$ $e_1$ (4 nm)/Ru(1 nm)/$Co_9Fe_1$ (4 nm) PtMn (15 nm) was deposited on the $Al_2O_3$. And, this multilayer film was picked out from equipment.

Next, the resist was applied and the electron beam exposure was carried out with EB (electron beam) drawing equipment. Then, the mask patterns corresponding to the element sizes mentioned above were formed. The element was formed by milling these patterns to the top of the magnetically fixed layer C2 with ion-milling equipment.

The form of the element was set up so that the lateral direction of the element might become in parallel with the direction of the exchange bias of the magnetically fixed layers C1 and C2. And $SiO_2$ was embedded in the surroundings of this element, the top electrode was formed, and the magnetic cell was completed.

Furthermore, the sample C10, the sample D10, the sample E10, and the sample F10 were produced for comparison. The structures of these samples are as the followings.

The sample C10 has the structure where PtMn (20 nm) as the antiferromagnetic layer AF2, $Co_9Fe_1$ (10 m) as the magnetically fixed layer C2, TaO1.4 (1 nm) as the intermediate-layer B2, $Co_9Fe_1$ (2.5 nm) as the magnetic recording layer A, Cu (6 nm) as the intermediate layer B1, $Co_9Fe_1$ (4 nm) as the magnetically fixed layer C1, Ru (1 nm) as the non-magnetic layer AC, $Co_9Fe_1$ (4 nm) as the magnetic layer FM, PtMn (15 nm) as the antiferromagnetic layer AF and the upper electrode are laminated in this order on the lower electrode. In this structure, the magnetoresistance effect (MR) through $TaO_{1.4}$ of the intermediate layer B2 was of the reverse type and that through Cu of the intermediate layer B2 was of the normal type MR. Therefore, this structure was unsuitable as the magnetic cell of the invention.

The sample D10 has the "single pin structure" which is the structure where PtMn (20 nm) as the antiferromagnetic layer AF2, $Co_9Fe_1$ (20 nm) as the magnetically fixed layer, Cu (4 nm) as the intermediate-layer, $Co_9Fe_1$ (2.5 nm) as the magnetic recording layer, and the upper electrode are laminated in this order on the lower electrode.

The sample E10 has the "single pin structure" which is the structure where PtMn (20 nm) as the antiferromagnetic layer AF2, $Co_9Fe_1$ (20 nm) as the magnetically fixed layer, $Al_2O_3$ (0.8 nm) as the intermediate-layer, $Co_9Fe_1$ (2.5 nm) as the magnetic recording layer, and the upper electrode are laminated in this order on the lower electrode.

The sample F10 has the structure where $Co_9Fe_1$ (2.5 nm) as the magnetic recording layer, Cu (6 nm) as the intermediate-layer, $Co_9Fe_1$ (4 nm) as the magnetically fixed layer, Ru(1 nm) as the non-magnetic layer, $Co_9Fe_1$ (4 nm) as the magnetic layer, PtMn (15 nm) as the antiferromagnetic layer and the upper electrode are laminated in this order on the lower electrode.

The dependencies of the differential resistances on the current were measured by passing current of plus 10 mA through minus 10 mA between the upper electrodes and the bottom electrodes of sample A10 with the size 60 nm×110 nm and the sample B10 with the size 60 nm×110 nm.

Figure 32:
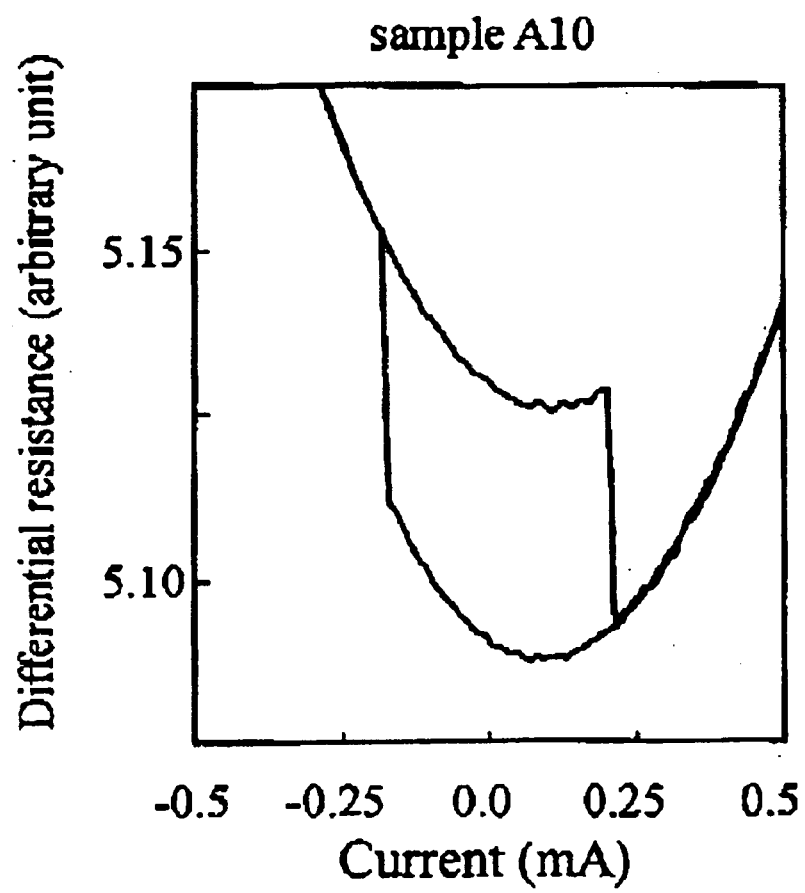
FIG. 32 is a graphical representation showing the differential resistance of the sample A10.

FIG. 32 is a graphical representation showing differential resistance of the sample A10.

Figure 33:
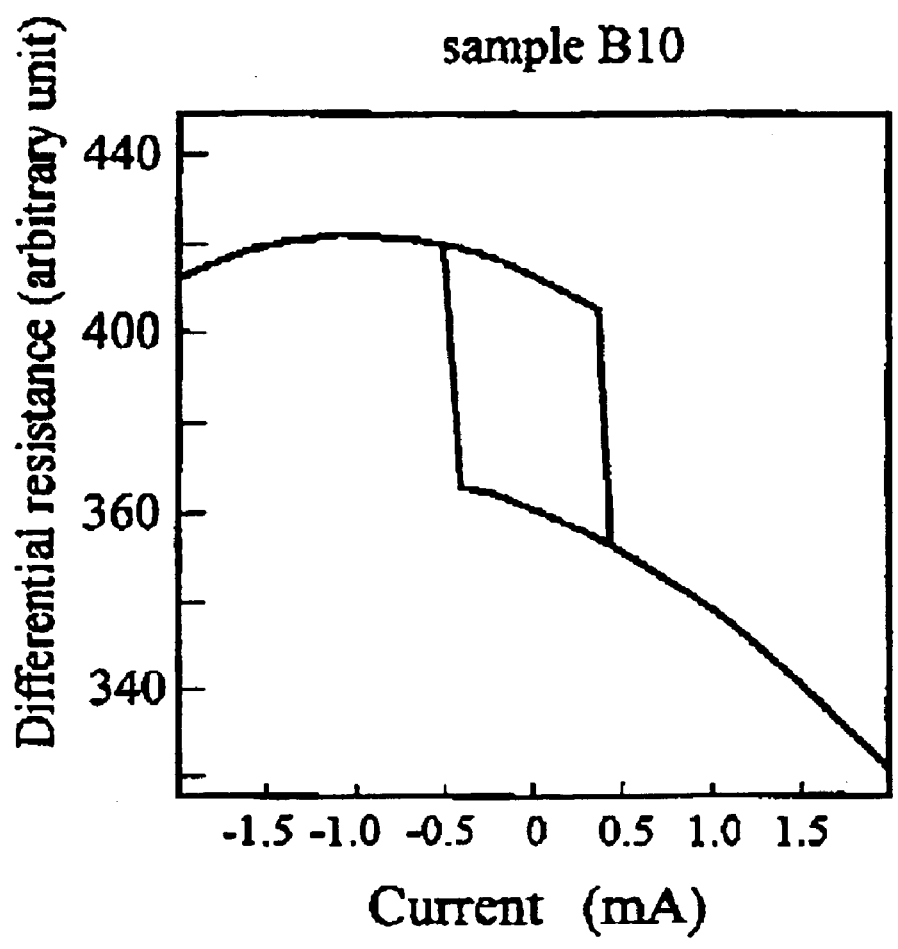
FIG. 33 is a graphical representation showing the differential resistance of the sample B10.

FIG. 33 is a graphical representation showing differential resistance of the sample B10.

The direction of the current in case the electron flows from the magnetically fixed layer C2 to the magnetically fixed layer C1 was defined as plus. The convex curve was obtained in the sample A10 (FIG. 32), and the convex curve was obtained in the sample B10 (FIG. 33). And both in the sample A10 and in the sample B10, the region of high resistance and the region of low resistance appeared with the change of the current. These results show that the magnetization of the magnetic recording layer A is reversed by the polarity of the current passed in the magnetic cell and the writing-in of a signal can be carried out.

Figure 34:
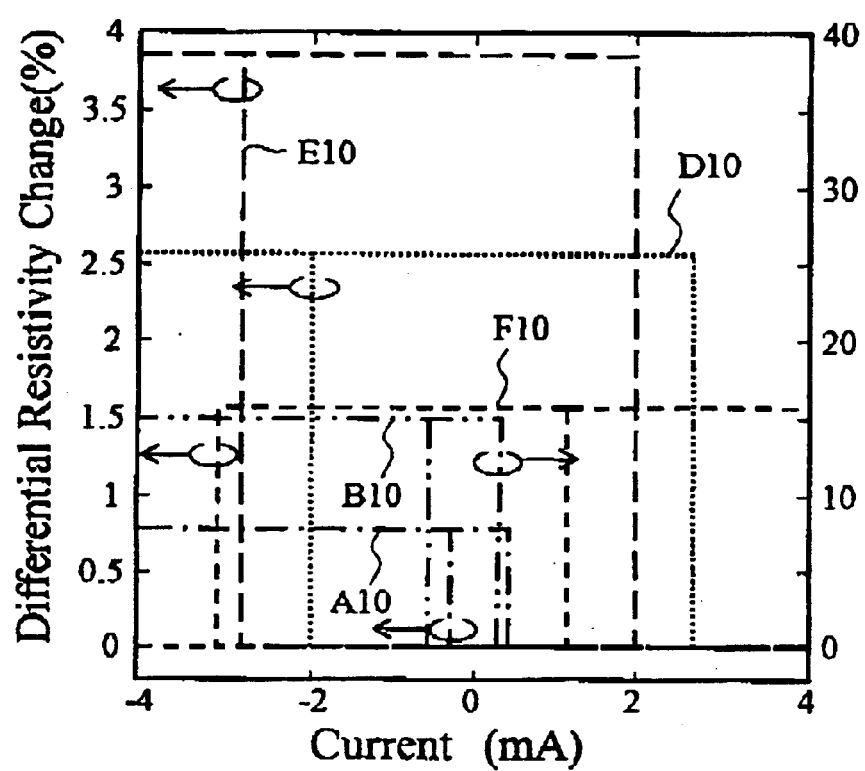
FIG. 34 is a graphical representation showing differential resistance change which removed the curvilinear component of the background in FIGS. 32 and 33, and was further normalized by differential resistance of a low resistance state.

FIG. 34 is a graphical representation showing the differential resistivity change obtained by canceling the curves of the background expressed in FIGS. 32 and 33 and by normalizing the differential resistances with the regions of low resistances. The results of the samples D10, E10, and F10 with the same size were also expressed in FIG. 34. This figure shows that the currents for the magnetization reversals of samples A10 and B10 are very smaller than other samples.

In the sample C10, the reversal of the magnetization was not observed with the current of plus 10 mA through minus 10 mA. That is, it turned out that the magnetization reversal current of the sample C10 is larger than 10 mA.

The result shows that the critical current for the magnetization reversal (Ic) of the samples A10 and B10 are lower than those of the samples C10, D10, E10, and F10, and the samples A10 and B10 can be write-in with lower current.

Figure 35:
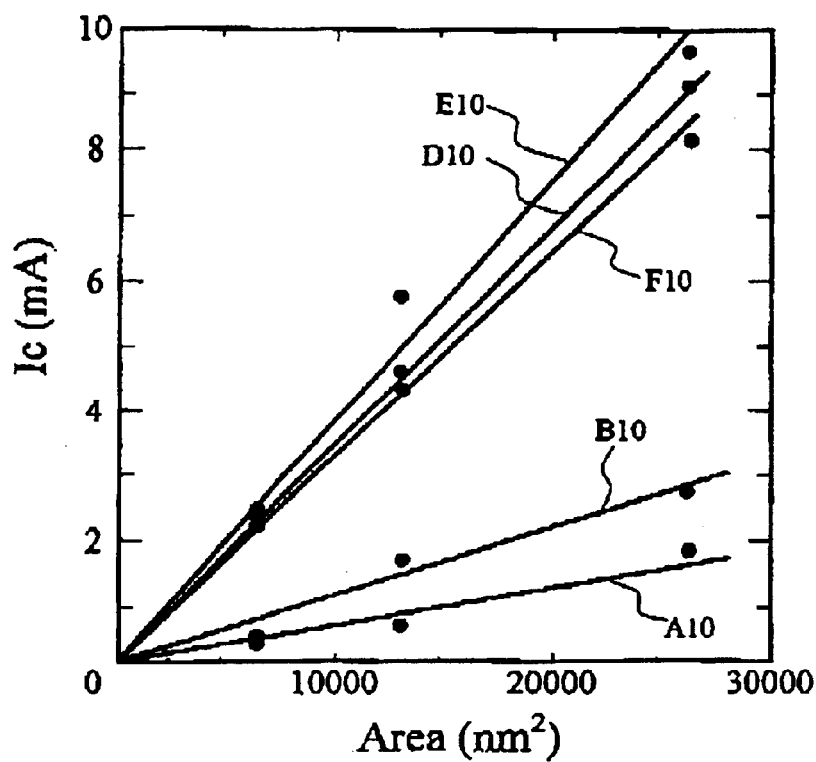
FIG. 35 is a graphical representation showing the relation between the average value of the critical magnetization reversal current Ic, and cell size.

FIG. 35 is a graphical representation showing the relation between the average of the critical magnetization reversal current Ic, and the cell size. Here, the average of the critical current Ic is a value which averaged critical current Ic+ in the case of recording on a low resistance state from a high resistance state in FIG. 32, and critical current Ic− in the case of recording on a high resistance state from a low resistance state.

In all samples, the critical currents Ic are mostly in proportion to the size of the cell. And it turned out that the samples A10 and B10 can be written-in with smaller current density than the samples D10, E10, and F10.

The result showed that the structure expressed in FIG. 15 can be written-in with low power consumption.

In addition, it was checked that the same tendency as the above is acquired even when MgO, SiO$_2$, Si—O—N, or SiO$_2$ or Al$_2$O$_3$ which has holes filled with magnetic materials or conductive metals (Cu, Ag, Au) is used for the intermediate-layer B2 of the sample B10.

The Ninth Example

Next, the magnetic cells (the sample A20 and the sample B20) expressed in FIG. 19 and FIG. 20 were manufactured as the ninth example of the invention.

The sample A20 (FIG. 19) has the structure where PtMn (20 nm), Co$_9$Fe$_1$ (20 nm) as the magnetically fixed layer C2, Al$_2$O$_3$ (0.8 nm) as the intermediate-layer B2, Co$_9$Fe$_1$ (1 nm) as the magnetic recording layer A3, Ru (1 nm) as the non-magnetic layer AC, Co$_9$Fe$_1$ (1 nm) as the magnetic recording layer A2, Ru (1 nm) as the non-magnetic layer AC, Co$_9$Fe$_1$ (1 nm) as the magnetic recording layer A1, Cu (6 nm) as the intermediate layer E1, Co$_9$Fe$_1$ (4 nm) as the magnetically fixed layer C1, Ru (1 nm) as the non-magnetic layer AC, Co$_9$Fe$_1$ (4 nm) as the magnetic layer FM, PtMn (15 nm) and the upper electrode are laminated in this order on the lower electrode. That is, the sample A20 has the "anti-parallel dual pin structure". Three kinds of samples with element size (60 nm×110 nm, 80 nm×165 nm, and 110 nm×240 nm) were produced.

On the other hand, the sample B20 (FIG. 20) has the structure where PtMn (20 nm), Co$_9$Fe$_1$ (20 nm) as the magnetically fixed layer C2, Cu (4 nm) as the intermediate-layer B2, Co$_9$Fe$_1$ (1.25 nm) as the magnetic recording layer A2, Cu (0.3 nm) as the non-magnetic layer FC, Co$_9$Fe$_1$ (1.25 nm) as the magnetic recording layer A1, Cu (6 nm) as the intermediate layer B1, Co$_9$Fe$_1$ (4 nm) as the magnetically fixed layer C1, Ru (1 nm) as the non-magnetic layer AC, Co$_9$Fe$_1$ (4 nm) as the magnetic layer FM, PtMn (15 nm) and the upper electrode are laminated in this order on the lower electrode. That is, the sample B20 also has the "anti-parallel dual pin structure". The sample B20 had the same element size as the sample A20.

The sample A20 was manufactured with the following method.

First, the lower electrode was formed on the wafer. Then, the wafer was put in to the ultrahigh-vacuum sputtering equipment. And, PtMn(20 nm)/Co$_9$Fe$_1$ (20 nm)/Al was deposited. Next, the oxygen plasma was generated within the sputtering equipment, and Al$_2$O$_3$ was formed by oxidizing aluminum. On this Al$_2$O$_3$, the multilayer film having the structure of the Co$_9$Fe$_1$ (1 nm)/Ru (1 nm)/Co$_9$Fe$_1$ (1 nm)/Ru (1 nm)/Co$_9$Fe$_1$ nm)/Cu (6 nm )/Co$_9$Fe$_1$ (4 nm)/Ru/(1 nm)/ Co$_9$Fe$_1$ (4 nm)PtMn(15 nm) was laminated. This multilayer film was picked out from equipment.

Next, the resist was applied and the electron beam exposure was carried out with EB (electron beam) drawing equipment. Then, the mask patterns corresponding to the element sizes mentioned above were formed. The element was formed by milling these patterns to the top of the Al$_2$O$_3$ with ion-milling equipment. The form of the element was set up so that the lateral direction of the element might become in parallel with the direction of the exchange bias of the magnetically fixed layers. And SiO2 was embedded in the surroundings of this element, the top electrode was formed, and the magnetic cell was completed.

The sample B20 was manufactured with the same method as the sample A20.

The sample C20, the sample D20 and the sample E20 were produced for comparison.

Figure 36:
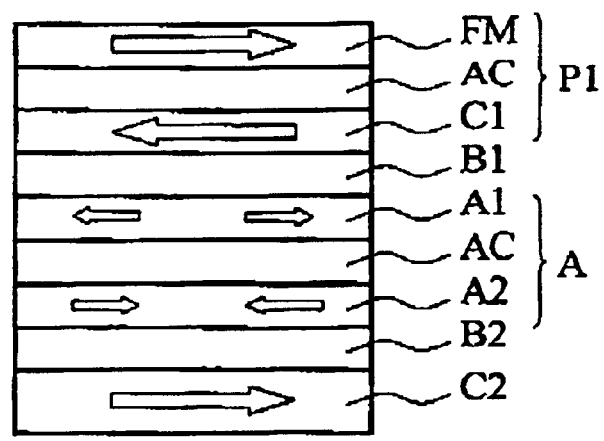
FIG. 36 is a schematic diagram showing the cross-sectional structure of the sample C20.

FIG. 36 is a schematic diagram showing the cross-sectional structure of the sample C20.

The sample C20 has the structure where PtMn (20 nm), Co$_9$Fe$_1$ (20 nm) as the magnetically fixed layer C2, Al$_2$O$_3$ (0.8 nm) as the intermediate-layer B2, Co$_9$Fe$_1$ (1 nm) as the magnetic recording layer A2, Ru (1 nm) as the non-magnetic layer AC, Co$_9$Fe$_1$ (1 nm) as the magnetic recording layer A1, Cu (6 nm) as the intermediate layer B1, Co$_9$Fe$_1$ (4 nm) as the magnetically fixed layer C1, Ru (1 nm) as the non-magnetic layer AC, Co$_9$Fe$_1$ (4 nm) as the magnetic layer FM, PtMn (15 nm) and the upper electrode are laminated in this order on the lower electrode. That is, although the sample C20 has the "anti-parallel dual pin structure", the magnetization of the magnetic layer A1 which is adjacent to the intermediate layers B1 and the magnetization of the magnetic layer A2 which is adjacent to the intermediate layers B2 are anti-parallel. Therefore, this structure is unsuitable as the magnetic cell of the invention.

The sample D20 has the "single pin structure" which is the structure where PtMn (20 nm), Co$_9$Fe$_1$ (20nm) as the magnetically fixed layer C1, Al$_2$O$_3$ (0.7 nm) as the intermediate-layer B2, Co$_9$Fe$_1$ (1 nm) as the magnetic recording layer A3, Ru (1 nm) as the non-magnetic layer AC, Co$_9$Fe$_1$ (1 nm) as the magnetic recording layer A2, Ru (1 nm) as the non-magnetic layer AC, Co$_9$Fe$_1$ (1 nm) as the magnetic recording layer A1, and the upper electrode are laminated in this order on the lower electrode.

The sample E20 has the "single pin structure" which is the structure where PtMn (20 nm), Co$_9$Fe$_1$ (20 nm) as the magnetically fixed layer C1, Cu (4 nm) as the intermediate-layer B2, Co$_9$Fe$_1$ (1.25 nm) as the magnetic recording layer A2, Cu (0.3 nm) as the non-magnetic layer FC, Co$_9$Fe$_1$ (1.25 nm) as the magnetic recording layer A1, and the upper electrode are laminated in this order on the lower electrode.

Figure 37:
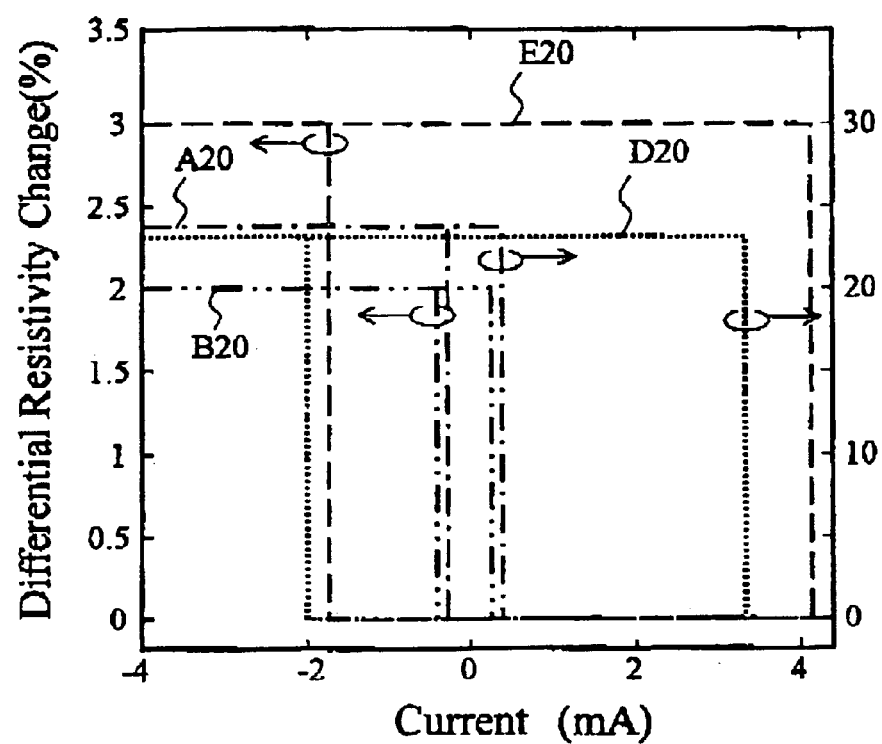
FIG. 37 is the graphical representation which expresses the dependence of the differential resistivity change on the current about the samples A20, B20, D20, and E20 with the size 60 nm×110 nm.

FIG. 37 is a graphical representation which expresses the dependencies of the differential resistances on the current in the sample A10, B20, D20 and E20 whose size are 60 nm×110 nm. This figure shows that the currents for the magnetization reversals of samples A10 and B10 are smaller than those of samples D20 and E20. In addition, since the cell of the sample C20 was destroyed electrically before the magnetizations of the magnetic layers A1 and A2 were reversed, the magnetization reversal was not observed.

Figure 38:
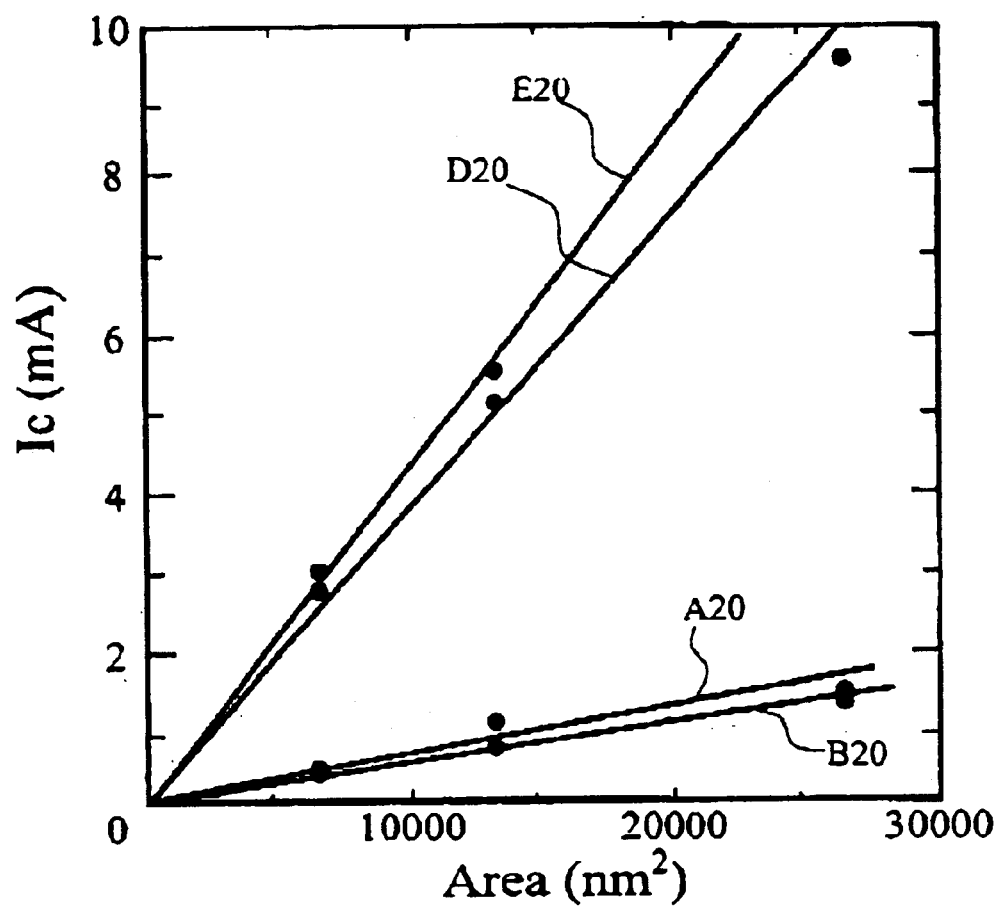
FIG. 38 is a graphical representation showing the relation between the average value of critical current Ic and cell size.

This figure shows that the critical currents for the magnetization reversals of samples A20 and B20 are smaller than those of samples C20, D20 and E20. And it turned out that the samples A20 and B20 can be written-in with smaller current density than the samples C20, D20, and E20, FIG. 38 is a graphical representation showing the relation between the average of the critical magnetization reversal current Ic, and the cell size. In all samples, the critical currents Ic are mostly in proportion to the size of the cell. And it turned out that the samples A20 and B20 can be written-in with smaller current density than the samples D20 and E20.

The result showed that the structures expressed in FIGS. 19 and 20 were suitable for the magnetic cell which can be written in by low power consumption.

In addition, it was checked that the same tendency as the above is acquired even when MgO, SiO2, Si—O—N, or SiO$_2$ or Al$_2$O$_3$ which has holes filled with magnetic materials or conductive metals (Cu, Ag, Au) is used for the intermediate-layer B2 of the sample A20 and the intermediate-layer B2 of the sample B20.

The Tenth Example

Next, the magnetic cells (samples A30 and B30) having the structure expressed in FIG. 22 was manufactured as the tenth example of the invention.

The sample A30 has the "anti-parallel dual pin structure" which is the structure where PtMn (20 nm), $Co_9Fe_1$ (4 nm) as the magnetic layer FM, Ru (1 nm) as the non-magnetic layer AC, $Co_9Fe_1$ (4 nm) as the magnetically fixed layer C2, Cu (3 nm) as the intermediate-layer B2, $Co_9Fe_1$ (2.5 nm) as the magnetic recording layer A, Cu (6 nm) as the intermediate layer B1, Co9Fe1 (4 nm as the magnetically fixed layer C1, Ru (1 nm) as the non-magnetic layer AC, $Co_9Fe_1$ (4 nm) as the magnetic layer FM, PtMn (15 nm) and the upper electrode are laminated in this order on the lower electrode. That is, the sample A30 has the anti-parallel dual pin structure. Three kinds of samples with element size (60 nm×110 nm, 80 nm×165 nm, and 110 nm×240 nm) were produced.

On the other hand, The sample B30 has the "anti-parallel dual pin structure" which is the structure where PtMn (20 nm), $Co_9Fe_1$ (4 nm) as the magnetic layer FM, Ru (1 nm) as the non-magnetic layer AC, $Co_9Fe_1$ (4 nm) as the magnetic layer FM, Ru (1 nm) as the non-magnetic layer AC, $Co_9Fe_1$ (4 nm) as the magnetically fixed layer C2, Cu (6 nm) as the intermediate-layer B2, $Co_9Fe_1$ (2.5 nm) as the magnetic recording layer A, Cu (0.8 nm) as the intermediate layer B1, $Co_9Fe_1$ (4 nm) as the magnetically fixed layer C1, Ru (1 nm) as the non-magnetic layer AC, Co9Fe1 (4 nm) as the magnetic layer FM, PtMn (15 nm) and the upper electrode are laminated in this order on the lower electrode. That is, the sample B30 also has the anti-parallel dual pin structure. The sample B30 had the same element size as the sample A30. In this structure, both of the magnetoresistance effect (MR) through the intermediate layer B1 and that through the intermediate layer B2 were of the normal type MR although the materials of the intermediate layer B1 and the intermediate layer B2 were different from each other.

The sample A30 was manufactured with the following procedure.

First, the $SiO_2$ layer and the Ta layer were grown up on the lower electrode in this order. The resist was applied on it and the mask pattern was drawn with the EB drawing equipment.

Next, the resist in this pattern was removed and the hole corresponding to the element size was made in Ta layer by the ion milling. Furthermore, the slightly bigger hole than the element size was made in SiO2 layer under the Ta layer by reactive ion etching, and the surface of the lower electrode was exposed.

Then, the wafer was put in to the ultrahigh-vacuum sputtering equipment, and sputtering cleaning of the surface was carried out.

Then, the multilayer film having the structure of Ru/PtMn (20 nm)/$Co_9Fe_1$ (4 nm)/Ru(1 nm)/$Co_9Fe_1$ (4 nm)/Ru(1 nm)/$Co_9F$ $e_1$ (4 nm)/Cu(3 nm)/$Co_9Fe_1$ (2.5 nm)/Cu (6 nm)/$Co_9Fe_1$ (4 nm)/Ru(1 nm)/$Co_9Fe_1$ (4 nm)/PtMn(15 nm) was deposited. And, the upper electrode was formed on it. Next, the wafer was put in to the vacuum magnetic field furnace, and annealing in the magnetic field was performed at 270 degrees C. (centigrade) for 12 hours. Thus the exchange biases were given to the magnetically fixed layers. The form of the element was set up so that the lateral direction of the element might become in parallel with the direction of the exchange bias of the magnetically fixed layers C1 and C2.

The sample B30 was manufactured with the following method.

First, the $SiO_2$ layer and the Ta layer were grown up on the lower electrode in this order. The resist was applied on it and the mask pattern was drawn with the EB drawing equipment. Next, the resist in this pattern was removed and the hole corresponding to the element size was made in Ta layer by the ion milling. Furthermore, the slightly bigger hole than the element size was made in $SiO_2$ layer under the Ta layer by reactive ion etching, and the surface of the lower electrode was exposed. Then, the wafer was put in to the ultrahigh-vacuum sputtering equipment, and sputtering cleaning of the surface was carried out. And, Ru/PtMn (20 nm)/$Co_9Fe_1$ (4 nm)/Ru(1 nm)/$Co_9Fe_1$ (4 nm)/Ru(1 nm)/$Co_9F$ $e_1$ (4nm)/Cu(6 nm)/$Co_9Fe_1$ (2.5 nm)/Al was grown up on it. After introducing oxygen in the chamber and oxidizing aluminum, the air was exhausted to the ultrahigh vacuum again. Then, remaining $Co_9Fe_1$ (4 nm)/Ru(1 nm)/$Co_9Fe_1$ (4nm)/PtMn (15 nm) was deposited in this order. And, the upper electrode was formed on it. Next, the wafer was put in to the vacuum magnetic field furnace, and annealing in the magnetic field was performed at 270 degrees C. for 12 hours. Thus the exchange biases were given to the magnetically fixed layers. The form of the element was set up so that the lateral direction of the element might become in parallel with the direction of the exchange bias of the magnetically fixed layers.

Furthermore, the sample C30, the sample D30 and the sample E30 were produced for comparison.

The sample C30 has the structure where PtMn (20 nm), $Co_9Fe_1$ (4 nm)/Ru(1 nm)/$Co_9Fe_1$ (4 nm)/Ru (1 nm)/$Co_9Fe_1$ (4 nm) as the magnetically fixed structure P2, Cu (6 nm) as the intermediate-layer B2, $Co_9Fe_1$ (2.5 nm) as the magnetic recording layer A, TaO (1 nm) as the intermediate layer B1, $Co_9Fe_1$(4 nm)/Ru (1 nm)/$Co_9Fe_1$ (4 nm) as the magnetically fixed structure P1, PtMn 15 nm) and the upper electrode are laminated in this order on the lower electrode. This structure is the anti-parallel dual pin structure. However, this comparison sample does not suit the invention, because TaO of the intermediate layer B1 is of the reverse type MR though Cu of the Intermediate-layer B2 is of the normal type MR.

The sample D30 has the "single pin structure" which is the structure where PtMn (20 nm), $Co_9Fe_1$ (4 nm)/Ru (1 nm)/$Co_9Fe_1$ (4 nm)/Ru (1 nm)/$Co_9Fe_1$ (4 nm) as the magnetically fixed structure P2, Cu (3 nm) as the intermediate-layer B2, $Co_9Fe_1$ (2.5 nm) as the magnetic recording layer A and the upper electrode are laminated in this order on the lower electrode.

The sample E30 has the "single pin structure" which is the structure where PtMn (20 nm), PtMn (20 nm), $Co_9Fe_1$ (4 nm)/Ru(1 nm)/$Co_9Fe_1$ (4 nm)/Ru(1 nm)/$Co_9Fe_1$ (4 nm) as the magnetically fixed structure P2, $Al_2O_3$ (0.8 nm) as the intermediate-layer, $Co_9Fe_1$ (2.5 nm) as the magnetic recording layer, and the upper electrode are laminated in this order on the lower electrode.

Figure 39:
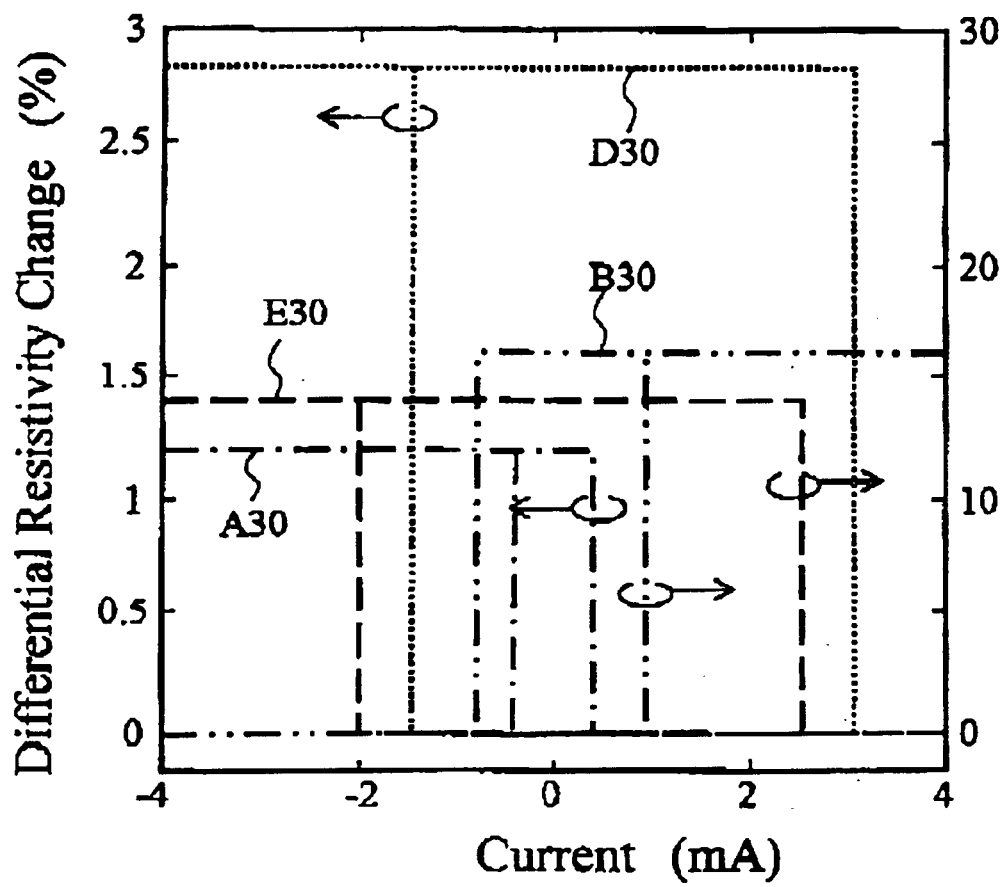
FIG. 39 is the graphical representation which expresses the relation between the differential resistivity change and the current about the samples A30, B30, D30, and E30.

FIG. 39 is a graphical representation which expresses the relation between the differential resistance changes and currents about samples A30, B30, D30, and E30. The size of the samples are 60 nm×110 nm. In addition, since the magnetic cell destroyed the sample C30 electrically before magnetization of the magnetic recording layer A was reversed, magnetization reversal was not observed.

The result shows that the critical current for the magnetization reversal (Ic) of the samples A30 and B30 are lower than those of the samples C30, D30 and E30, and the samples A30 and B30 can be write-in with lower current.

Figure 40:
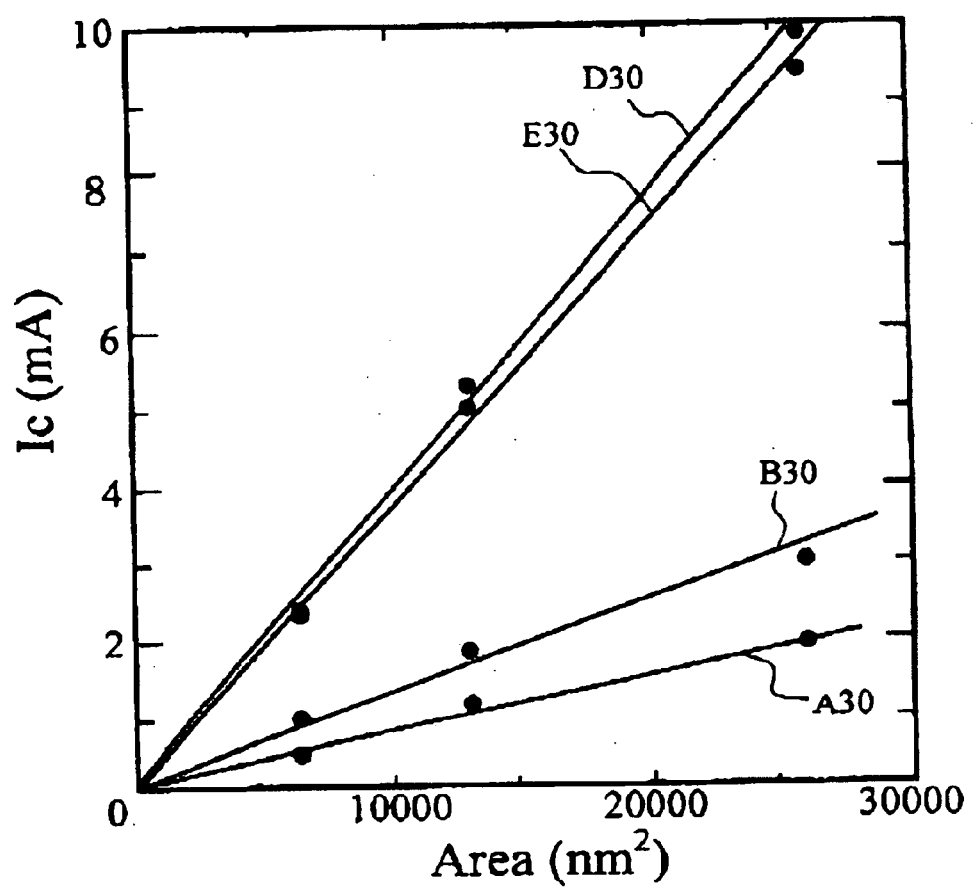
FIG. 40 is a graphical representation showing the relation between the average value of critical current Ic and cell size.

FIG. 40 is a graphical representation showing the relation between the average of the critical magnetization reversal current Ic, and the cell size. In all samples, the critical current Ic is mostly in proportion to the size of the cell. And it turned out that the samples A30 and B30 can be written-in with smaller current density than the samples C30, D30 and E30.

As explained above, it was checked that the structure expressed in FIG. 22 was suitable for the magnetic cell which can be written-in with low power consumption.

In addition, it was checked that the same tendency as the above is acquired even when MgO, $SiO_2$, Si—O—N, or $SiO_2$ or $Al_2O_3$ which has holes filled with magnetic materials or conductive metals (Cu, Ag, Au) is used for the intermediate-layer B1 of the sample A30.

The Eleventh Example

Next, the magnetic cells (samples A40 and B40) having the structure expressed in FIG. 23 and FIG. 24 were manufactured as the eleventh example of the invention.

The sample A40 (FIG. 23) has the structure where PtMn (20 nm), $Co_9Fe_1$ (4 nm)/Ru(1 nm)/$Co_9Fe_1$ (4 nm)/Ru(1 nm)/$CO_9Fe_1$ (4 nm) as the magnetically fixed structure P2, Cu (5 nm) as the intermediate-layer B2, $Co_9Fe_1$ (1 nm)/Ru (1 nm)/$Co_9Fe_1$ (1 nm)/Ru(1 nm)/$Co_9Fe_1$ (1 nm) as the magnetic recording layer A, Cu(10 nm) as the intermediate layer B1, $Co_9Fe_1$ (4 nm)/Ru(1 nm)/$Co_9Fe_1$ (4 nm) as the magnetically fixed structure P1, PtMn (15 nm) and the upper electrode are laminated in this order on the lower electrode. That is, the sample A40 has the anti-parallel dual pin structure. Three kinds of samples with element size (60 nm×110 nm, 8 nm×165 nm, and 110 nm×240 nm) were produced.

On the other hand, the sample B40 has the structure where PtMn(20 nm), $Co_9Fe_1$ (4 nm)/Ru(1 nm)/$Co_9$ $Fe_1$/(4 nm) Ru(1 nm)/Co $Fe_1$ (4 nm) as the magnetically fixed structure P2, $Al_2O_3$ (0. 8 nm) as the intermediate-layer B2, $Co_9Fe_1$ (1.25 nm)/Cu (0.3 nm)/$Co_9Fe_1$ (1.25 nm) as the magnetic recording layer A, Cu (6 nm) as the intermediate layer B1, $Co_9Fe_1$ (4 nm)/Ru(1 nm)/$Co_9Fe_1$ (4nm) as the magnetically fixed structure P1, PtMn (15 nm) and the upper electrode are laminated in this order on the lower electrode. That is, the sample B40 also had the anti-parallel dual pin structure. In this structure, both of the magnetoresistance effect (MR) through the intermediate layer B1 and that through the intermediate layer B2 were of the normal type MR although the materials of the intermediate layer B1 and the intermediate layer B2 were different from each other. The sample B40 had the same element size as the sample A30.

The sample A40 was manufactured with the same method as the sample A10. The sample B40 was manufactured with the same method as the sample B10. Furthermore, the sample C40, the sample D40 and the sample E40 were produced for comparison.

The sample C40 has the structure where PtMn (20 nm), $Co_9Fe_1$ (4 nm)/Ru (1 nm)/$Co_9Fe_1$ (4 nm)/Ru (1 nm)/$Co_9Fe_1$ (4 nm) as the magnetically fixed structure P2, Cu (5 nm) as the intermediate-layer B2, $Co_9Fe_1$ (1 nm)/Ru(1 nm)/$Co_9Fe_1$ (1 nm) as the magnetic recording layer A, Cu (10 nm) as the intermediate layer B1, $Co_9Fe_1$ (4 nm)/Ru(1 nm)/$Co_9Fe_1$ (4 nm) as the magnetically fixed structure P1, PtMn (15 nm) and the upper electrode are laminated in this order on the lower electrode. Although this structure is the anti-parallel dual pin structure, the magnetization of the magnetic recording layer A which is adjacent to the intermediate layers B1 and the magnetization of the magnetic recording layer A which is adjacent to the intermediate layers B2 are anti-parallel. Therefore, this structure is different from the structure of the invention.

The sample D40 has the single pin structure which is the structure where PtMn (20 nm), $Co_9Fe_1$ (4 nm)/Ru(1 nm)/ $Co_9Fe_1$ (4 nm)/Ru(1 nm)/$Co_9Fe_1$ (4 nm) as the magnetically fixed structure, Cu (6 nm) as the intermediate-layer B2, $Co_9Fe_1$ (1 nm)/Ru(1 nm)/$Co_9Fe_1$ (1 nm)/Ru(1 nm)/$Co_9Fe_1$ (1 nm) as the magnetic recording layer A and the upper electrode are laminated In this order on the lower electrode.

The sample E40 has the single pin structure which is the structure where PtMn (20 nm), $Co_9Fe_1$ (4 nm)/Ru(1 nm)/ $Co_9Fe_1$ (4 nm)/Ru(1)/$Co_9Fe_1$ (4 nm) as the magnetically fixed structure, $Al_2O_3$ (0.7 nm) as the intermediate-layer B2, $Co_9Fe_1$ (1.25 nm)/Cu(0.3 nm)/$Co_9Fe_1$ (1.25 nm)as the magnetic recording layer A and the upper electrode are laminated in this order on the lower electrode.

Figure 41:
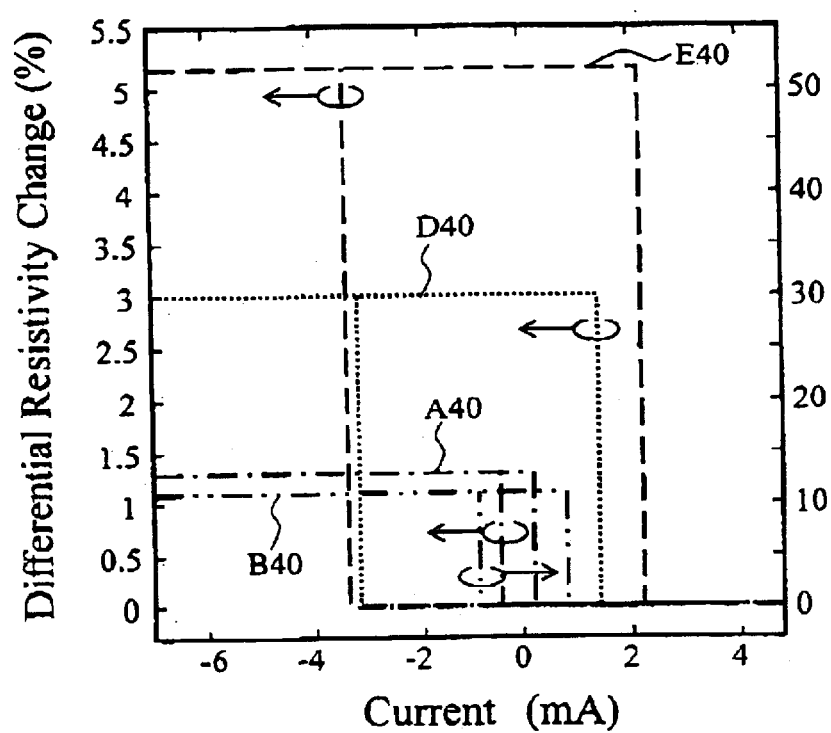
FIG. 41 is the graphical representation which expresses the relation between the differential resistivity change and the current about the samples A40, B40, D40, and E40.

FIG. 41 is a graphical representation which expresses the relations between the differential resistance changes and currents about samples A40, B40, D40, and E40. Here, the size of the cells is 60 nm×110 nm. FIG. 41 shows that the current at which the magnetizations of samples A40 and B40 are reversed are smaller than the samples D40 and E40. In the sample C40, since the cells were broken electrically before the reversal of the magnetization of the magnetic recording layer A, the magnetization reversal was not observed.

The result shows that the critical current for the magnetization reversal (Ic) of the samples A40 and B40 are lower than those of the samples C40, D40 and E40, and the samples A40 and B40 can be write-in with lower current.

Figure 42:
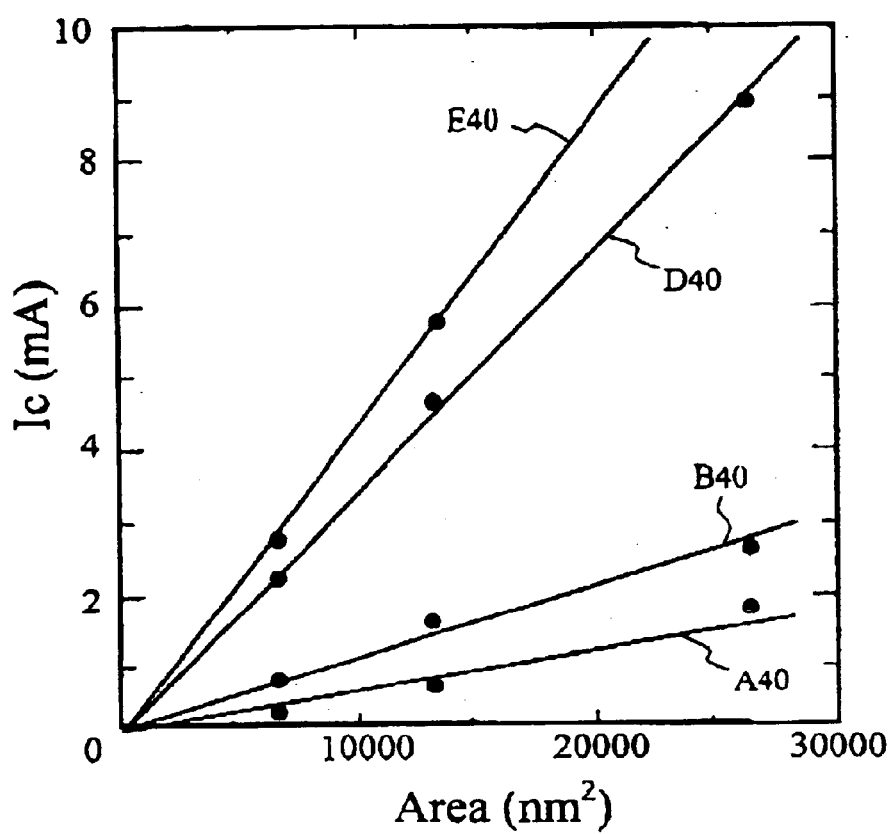
FIG. 42 is a graphical representation showing the relation between the average value of critical current Ic and cell size.

FIG. 42 is a graphical representation showing the relation between the average of the critical magnetization reversal current Ic, and the cell size. In all samples, the critical current Ic is mostly in proportion to the size of the cell. And it turned out that the samples A40 and B40 can be written-in with smaller current density than the samples C40, D40 and E40.

As explained above, it was checked that the structures expressed in FIG. 23 and FIG. 24 were suitable for the magnetic cell which can be written-in with low power consumption.

In addition, It was checked that the same tendency as the above is acquired even when MgO, $SiO_2$, Si—O—N, or $SiO_2$ or $Al_2$ $_{O3}$ which has holes filled with magnetic materials or conductive metals (Cu, Ag, Au) is used for the intermediate-layer B2 of the sample A40 and the intermediate layer B2 of the sample B40.

The Twelfth Example

Next, the magnetic cells (samples A50 and B50) having the structures expressed in FIG. 21 and FIG. 25 were manufactured as the twelfth example of the invention.

The sample A50 (FIG. 21) has the "anti-parallel dual pin structure" which is the structure where PtMn (20 nm), $Co_9Fe_1$ (20 nm) as the magnetically fixed layer, Cu (6 nm) as the intermediate-layer B2, $Co_9Fe_1$ (0.8 nm)/NiFe(0.8 nm)/$Co_9Fe_1$ (0. 8 nm) as the magnetic recording layer A, $Al_2O_3$ (1 nm) as the intermediate layer B1, Co9Fe1 (4 nm)/Ru(1 nm)/Co9Fe1 (4 nm) as the magnetically fixed structure P1, PtMn (15 nm) and the upper electrode are laminated in this order on the lower electrode. Three kinds of samples with element size (60 nm×110 nm, 80 nm×165 nm, and 110 nm×240 nm) were produced.

On the other hand, the sample B50 (FIG. 21) has the "anti-parallel dual pin structure" which is the structure where PtMn (20 nm), $Co_9Fe_1$ (4 nm)/Ru(1 nm)/$Co_9Fe_1$ (4 nm)/Ru(1 nm)/$Co_9Fe_1$ (4 nm) as the magnetically fixed layer, Cu (6 nm) as the intermediate-layer B2, $Co_9Fe_1$ (0. 8 nm)/NiFe (0. 8 nm)/$Co_9Fe_1$ (0.8 nm) as the magnetic recording layer A, $Al_2O_3$ (1 nm) as the intermediate layer B1, $Co_9Fe_1$ (4 nm)/Ru(1 nm)/$Co_9Fe_1$ (4 nm) as the magnetically fixed structure P1, PtMn (15 nm) and the upper electrode are laminated in this order on the lower electrode. The sample B50 had the same element size as the sample A50.

In this structure, both of the magnetoresistance effect (MR) through the intermediate layer B1 and that through the intermediate layer B2 were of the normal type MR although the materials of the intermediate layer B1 and the intermediate layer B2 were different from each other.

The sample A50 was manufactured with the following procedure.

First, the $SiO_2$ layer and the Ta layer were grown up on the lower electrode in this order. The resist was applied on it and the mask pattern was drawn with the EB drawing equipment. Next, the resist in this pattern was removed and the hole corresponding to the element size was made in Ta layer by the ion milling. Furthermore, the slightly bigger hole than the element size was made in $SiO_2$ layer under the Ta layer by reactive ion etching, and the surface of the lower electrode was exposed.

Then, the wafer was put in to the ultrahigh-vacuum sputtering equipment, and sputtering cleaning of the surface was carried out. Then, the multilayer film having the structure of Ru/PtMn(20 nm)/$Co_9Fe_1$ (20 nm)/Cu(6 nm)/$CoFe_1$ (0.8 nm)/NiFe (0.8 nm)/$Co_9Fe_1$ (0.8 nm)/Al was deposited. Next, oxygen was introduced in the chamber and the aluminum at the surface was oxidized. And, the air was evacuated to the ultrahigh vacuum. Then, remaining $Co_9Fe_1$(4 nm)/Ru(1 nm)/$Co_9Fe_1$ (4 nm)/PtMn (15 nm) was deposited, and the upper electrode was formed.

Next, the wafer was put in to the vacuum magnetic field furnace, and annealing in the magnetic field was performed at 270 degrees C. for 12 hours. Thus the exchange biases were given to the magnetically fixed layers. The form of the element was set up so that the lateral direction of the element might become in parallel with the direction of the exchange bias of the magnetically fixed layers C1 and C2.

The sample B50 was produced with the same method as A10.

Furthermore, the sample C50 and the sample D50 were produced for comparison.

The sample C50 has the "single-pin structure" which is the structure where $Co_9Fe_1$ (12 nm) as the magnetically fixed layer C2, Cu (6 nm) as the intermediate-layer B2, $Co_9Fe_1$ (0.8 nm)/NiFe(0.8 nm)/$Co_9Fe_1$ (0.8 nm) as the magnetic recording layer A and the upper electrode are laminated in this order on the lower electrode.

The sample D30 has the "single-pin structure" which is the structure where PtMn (20 nm), $Co_9Fe_1$ (4 nm)/Ru(1 nm)/$Co_9Fe_1$ (4 nm)/Ru(1 nm)/$Co_9Fe_1$ (4 nm) as the magnetically fixed structure P2, Cu (6 nm) as the intermediate-layer B2, $Co_9Fe_1$ (0.8 nm)/NiFe(0.8 nm)/$Co_9Fe_1$ (0.8 nm) as the magnetic recording layer A and the upper electrode are laminated in this order on the lower electrode.

Figure 43:
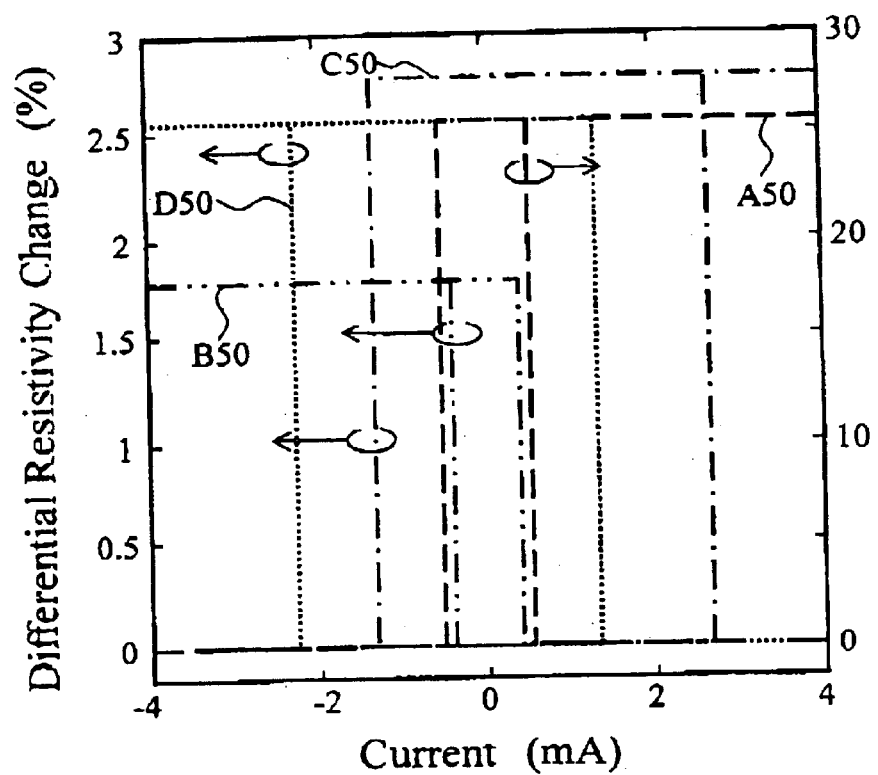
FIG. 43 is the graphical representation which expresses the relation between the differential resistivity change and the current about the samples A50, B50, C50, and D50.

FIG. 43 is a graphical representation which expresses the relations between the differential resistance changes and currents about samples A50, B50, C50, and D50. The size of the samples is 60 nm×110 nm. The result shows that the critical currents for the magnetization reversal (Ic) of the samples A50 and B50 are lower than those of the samples C50, D50 and E50, and the samples A30 and B30 can be written-in with lower current.

Figure 44:
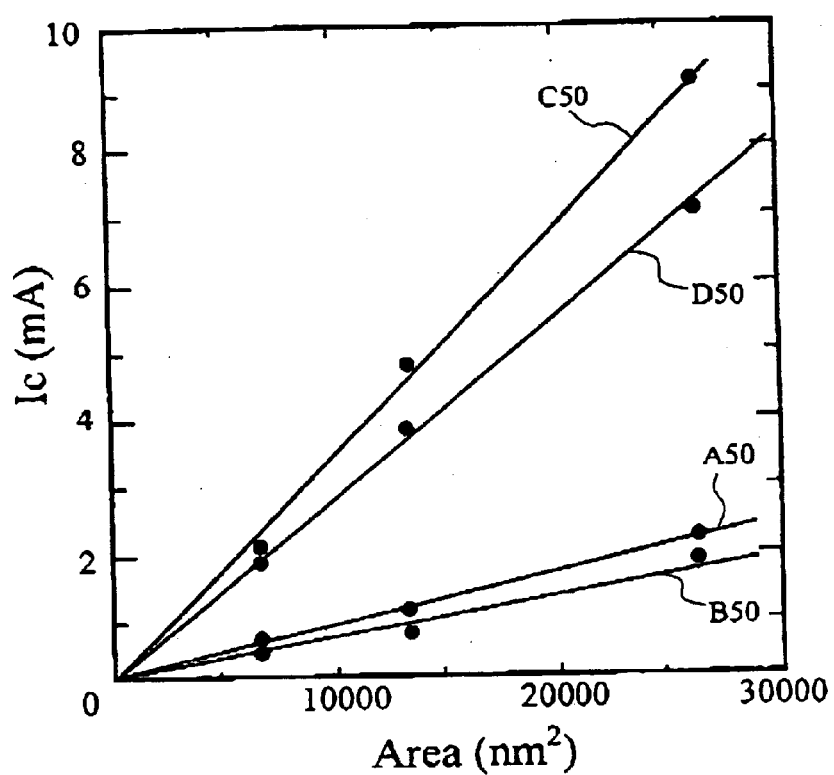
FIG. 44 is a graphical representation showing the relation between the average value of critical current Ic and cell size.

FIG. 44 is a graphical representation showing the relation between the average of the critical magnetization reversal current Ic, and the cell size. In all samples, the critical current Ic is mostly in proportion to the size of the cell. And it turns out that the samples A50 and B50 can be written-in with smaller current density than the samples D50 and E50.

As explained above, it was checked that the structures expressed in FIG. 21 and FIG. 25 was suitable for the magnetic cell which can be written-in with low power consumption.

In addition, it was checked that the same tendency as the above is acquired even when MgO, $SiO_2$, Si—O—N, or $SiO_2$ or $Al_2O_3$ which has holes filled with magnetic materials or conductive metals (Cu, Ag, Au) is used for the intermediate-layer B1 or B2 of the samples A50 and the sample B50.

The Thirteenth Example

Figure 45:
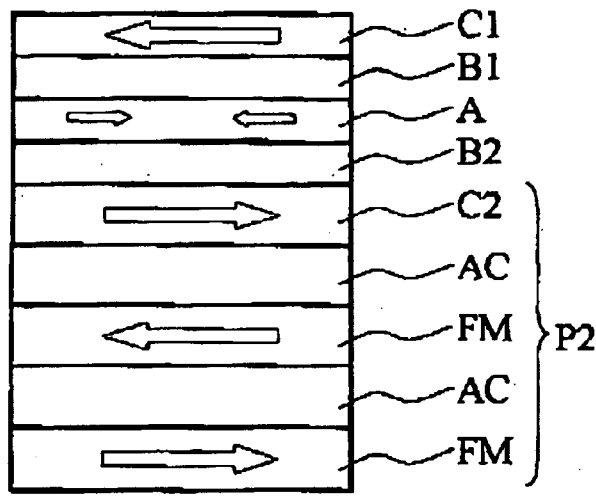
FIG. 45 is a schematic diagram showing the cross-sectional structure of the sample D60 and H60 in the thirteenth example of the invention.

Next, the samples provided the structure where three layers in which the antiferromagnetic couplings are carried out are adopted as the magnetically fixed structure were compared with the samples provided the structure where one layer is adopted as the magnetically fixed layer as the thirteenth example of the invention. That is, the magnetic cells which have the structures expressed in FIG. 15 (samples A60 and E60), FIG. 14 (samples B60 and F60), FIG. 22 (samples C60 and G60), and FIG. 45 (samples D60 and H60) were created.

The sample A60 (FIG. 15) has the "anti-parallel dual pin structure" which is the structure where PtMn (20 nm), $Co_9Fe_1$ (4 nm) as the magnetically fixed layer C2, $Al_2O_3$ (0.8 nm) as the intermediate-layer B2, $Co_9Fe_1$ (2.5 nm) as the magnetic recording layer A, Cu (6 nm) as the intermediate layer B1, $Co9Fe_1$ (4 nm)/Ru(1 nm)/$Co9Fe_1$ (4 nm) as the magnetically fixed structure P1, PtMn (15 nm) as the antiferromagnetic layer AF and the upper electrode are laminated in this order on the lower electrode.

The sample B60 (FIG. 14) has the "anti-parallel dual pin structure" which is the structure where PtMn (20 nm), $Co_9Fe_1$ (4 nm) as the magnetically fixed layer C2, $Al_2O_3$ (0.8 nm) as the intermediate-layer B2, $Co_9Fe_1$ (2.5 nm) as the magnetic recording layer A, Cu (6 nm) as the intermediate layer B1, Co9Fe1 (4 nm) as the magnetically fixed layer C1, PtMn (15 nm) as the antiferromagnetic layer AF and the upper electrode are laminated in this order on the lower electrode.

The sample C60 (FIG. 22) has the "anti-parallel dual pin structure" which is the structure where PtMn (20 nm), $Co_9Fe_1$ (4 nm)/Ru(1 nm)/$Co_9Fe_1$ (4 nm)/Ru(1 nm)/$Co_9Fe_1$ (4 nm) as the magnetically fixed structure P2, $Al_2O_3$ (0.8nm) as the intermediate-layer B2, $Co_9Fe_1$ (2.5 nm) as the magnetic recording layer A, Cu (6 nm) as the intermediate layer B1, $Co_9Fe_1$ (4 nm)/Ru(1 nm)/$Co_9Fe_1$ (4 nm) as the magnetically fixed structure P1, PtMn (15 nm) and the upper electrode are laminated in this order on the lower electrode.

The sample D60 (FIG. 45) has the "anti-parallel dual pin structure" which is the structure where PtMn (20 nm), $Co_9Fe_1$ (4 nm)/Ru (1 nm)/$Co_9Fe_1$ (4 nm)/Ru (1 nm)/$Co_9Fe_1$ (4 nm) as the magnetically fixed structure P2, $Al_2O_3$ (0.8 nm) as the intermediate-layer B2, $Co_9Fe_1$ (2.5 nm) as the magnetic recording layer A, Cu (6 nm) as the intermediate layer B1, $Co_9Fe_1$ (4 nm) as the magnetically fixed layer C1, PtMn (15 nm) and the upper electrode are laminated in this order on the lower electrode.

The sample E60 (FIG. 15) has the "anti-parallel dual pin structure" which is the structure where PtMn (20 nm), $Co_9Fe_1$ (4nm) as the magnetically fixed layer C2, $Al_2O_3$ (0.8 nm) as the intermediate-layer B2, $Co_9Fe_1$ (2.5 nm) as the magnetic recording layer A, Cu (6 nm) as the intermediate layer B1, $Co_9Fe_1$ (6 nm) as the magnetically fixed layer C1, PtMn (15 nm) as the antiferromagnetic layer AF and the upper electrode are laminated in this order on the lower electrode.

The sample F60 (FIG. 14) has the "anti-parallel dual pin structure" which is the structure where PtMn (20 nm), $Co_9Fe_1$ (4 nm) as the magnetically fixed layer C2, $Al_2O_3$ (0.8 nm) as the intermediate-layer B2, $Co_9Fe_1$ (2.5 nm) as the magnetic recording layer A, Cu (6 nm) as the intermediate layer B1, $Co_9Fe_1$ (6 nm) as the magnetically fixed layer C1, PtMn (15 nm) as the antiferromagnetic layer AF and the upper electrode are laminated in this order on the lower electrode.

The sample G60 (FIG. 22) has the "anti-parallel dual pin structure" which is the structure where PtMn (20 nm), $Co_9Fe_1$ (4 nm)/Ru(1 nm)/$Co_9Fe_1$ (4 nm)/Ru(1 nm)/$Co_9Fe_1$ (3 nm) as the magnetically fixed structure P2, $Al_2O_3$ (0.8 nm) as the intermediate-layer B2, $Co_9Fe_1$ (2.5 nm) as the magnetic recording layer A, Cu (6 nm) as the intermediate layer B1, $Co_9Fe_1$ (5 nm)/Ru(1 nm)/$Co_9Fe_1$ (6 nm) as the magnetically fixed structure P1, PtMn (15 nm) and the upper electrode are laminated in this order on the lower electrode.

The sample H60 (FIG. 45) has the "anti-parallel dual pin structure" which is the structure where PtMn (20 nm), $Co_9Fe_1$ (4 nm)/Ru(1 nm)/$Co_9Fe_1$ (4 nm)/Ru(1 nm)/$Co_9Fe_1$ (3 nm) as the magnetically fixed structure P2, $Al_2O_3$ (0.8 nm) as the intermediate-layer B2, $Co_9Fe_1$ (2.5 nm) as the magnetic recording layer A, Cu (6 nm) as the intermediate layer B1, $Co_9Fe_1$ (6 nm) as the magnetically fixed layer C1, PtMn (15 nm) and the upper electrode are laminated in this order on the lower electrode.

In all samples, the element size is 50 nm×120 nm. About samples A60 through H60, the average values of the critical current Ic obtained from the dependencies of the differential resistances on the current were calculated.

The result is as the following:

| Sample | Average of the critical current Ic (mA) |
| --- | --- |
| A60 | 0.36 |
| B60 | 0.60 |
| C60 | 0.29 |
| D60 | 0.54 |
| E60 | 0.32 |
| F60 | 0.55 |
| G60 | 0.28 |
| H60 | 0.53 |

In all samples of the invention, Ic were low. Comparing the sample A60 with the sample B60, it turns out that the critical current Ic of the cell (FIG. 15) provided the magnetically fixed structure P1 whose magnetizations are anti-parallel is smaller than that of the cell (FIG. 14) provided one layer as the upper magnetically fixed layer C1. Similarly, comparing the sample C60 (FIG. 22) with the sample D60 (FIG. 45), comparing the sample E60 (FIG. 15) with the sample F60 (FIG. 14) and comparing the sample G60 (FIG. 22) with the sample H60 (FIG. 45), it also turns out that the critical current Ic of the cell (FIG. 15 and FIG. 22) provided the magnetically fixed structure P1 whose magnetizations are anti-parallel is smaller than that of the cell (FIG. 14 and FIG. 45) provided one layer as the upper magnetically fixed layer C1.

That is, it has checked that it was effective for reducing the critical current Ic to use the laminated structure of the magnetic layer and non-magnetic layer which carried out anti-parallel couplings as the magnetically fixed structure. In addition, the same effect was acquired when the material of intermediate-layer B-2 was except an insulator. Moreover, the same effect was also acquired when the magnetic recording layer A was constituted by the three magnetic layers.

The Fourteenth Example

Next, as the fourteenth example of the invention, the cells having the structures explained below were produced. The sizes of the cells were 60 nm×130 nm. And the critical currents Ic of these cells were acquired. The laminated structures of the samples of this example from the view points of the lower electrodes, and the measurement results of critical currents Ic are expressed in the following. This result shows that the magnetic cell which can be written-in with low power consumption can be offered, according to the invention.

Sample A70:
AF2(PtMn:20 nm)/C2($Co_9Fe_1$:20 nm)/B2(MgO:1 nm)/A ($Co_9Fe_1$: 2.5 nm)/B1(Cu:6 nm)/C1($Co_9Fe_1$:5 nm)/AC (Ru:1 nm)/FM($Co_9Fe_1$:5 nm)/AF1(PtMn:15 nm)

Ic average:0.67 mA

Sample A71:
AF2(PtIrMn:17 nm)/FM($Co_9Fe_1$:4 nm)/AC(Ru:1 nm)/C2 ($Co_9Fe_1$: 4 nm)/B2(MgO:1 nm)/A3($Co_9Fe_1$:0.8 nm)/A2 (NiFe:0.8 nm)/A1($Co_9Fe_1$:0.8 nm)/B1(Cu:6 nm)/C1 ($Co_9Fe_1$:4 nm)/AF1(PtIrMn:17 nm)

Ic average:0.41 mA

Sample A72:
AF2(PtMn:20 nm)/C2($Co_9Fe_1$:20 nm)/B-2(Si—O—N:1 nm)/A3 ($Co_9Fe_1$:8 nm)/A2(NiFe:0.8 nm)/A1($Co_9Fe_1$:0.8 nm)/B1(Cu:6 nm)/C1($Co_9Fe_1$:4 nm)/AC(Ru:1 nm)/FM ($Co_9Fe_1$:4 nm)/AF2(PtMn:15 nm)

Ic average:0.67 mA

Sample A73:
AF2(PtMn:15 nm)/C2($Co_9Fe_1$:20 nm)/B-2 ($SiO_2$ with holes: 5 nm)/A($Co_9Fe_1$:3 nm)/B1(Cu:8 nm)/C1($Co_9Fe_1$:4 nm)/AC(Ru:1 nm)/FM ($Co_9Fe_1$:4 nm)/AF1(PtMn:15 nm)

Ic average:0.59 mA.

Sample A74:
AF2(IrMn: 19 nm)/C2($Co_8Fe_2$:4 nm)/B2(MgO:1 nm)/A3 ($Fe_8Co_2$: 0.8 nm)/A2(NiFeCo:0.8 nm)/A1($Co_8Fe_2$:0.8 nm)/B1(Cu:6 nm)/C1($Co_8Fe_2$:4 nm)/AC(Ru:1 nm)/FM ($Co_8Fe_2$:4 nm)/AF1(IrMn:19 nm)

Ic average:0.82 mA

Sample A75:
AF2(PtMn:20 nm)/C2($Co_9Fe_1$:20 nm)/B2(Cu:6 nm)/A3 ($Co_9Fe_1$ : 0.8 nm)/A2(NiFe:0.8 nm)/A1($Co_9Fe_1$:0.8 nm)/B1 (Cu:0.6 nm)/B1($Al_2O_3$ with holes filled with Cu:3 nm)/B1 (Cu: 0.6 nm)/C1($Co_9Fe_1$:4 nm)/AC(Ru:1 nm)/FM($Co_9Fe_1$:4 nm)AF1(PtMn:1 5 nm)

Ic average:0.57 mA

Sample A76:
AF2(PtMn:10 nm)/FM($Co_9Fe_1$:4 nm)/AC(Ru:1 nm)/C2 ($Co_9Fe_1$:2)0 nm)/B2(MgO:0.8 nm)/A($Co_9Fe_1$:3 nm)/B1 (Cu:6 nm)/C1($Co_9Fe_1$:5 nm)/AF1(PtMn:15 nm)

Ic average:0.83 mA

Sample A77:
AF2(PtMn:15 nm)/FM($Co_9Fe_1$:4 nm)/AC(Ru:1 nm)/C2 ($Co_9Fe_1$:4 nm)/B2($Al_2O_3$:0.7 nm)/A3($Co_9Fe_1$:0.6 nm)/A2(NiFe:1 nm)/A1($Co_9Fe_1$:0.6 nm)/B1(Cu:8 nm)/C1($Co_9Fe_1$:5 nm)/AF1(PtMn:15 nm)

Ic average:0.78 mA

Sample A78:

AF2(PtIrMn:15 nm)/C2Co$_9$Fe$_1$:20 nm)/B2(Al$_2$O$_3$ with holes:3 nm)/A(Co$_9$Fe$_1$:3.6 nm)B1(Cu:6 nm)/C1(Co$_9$Fe$_1$:5 nm)/AC(Ru:1 nm)/FM(Co$_9$Fe$_1$:5 nm)/AF1 (PtIrMn:15 nm)

Ic average:0.90 mA

Sample A79:

AF2(PtMn:20 nm)/FM(Co$_9$Fe$_1$:5 nm)/C(Ru:1 nm)/C2 (Co$_9$Fe$_1$:5 n m)/B2(Cu:6 nm)/A3(Co$_9$Fe$_1$:0.6 nm)/A2 (NiFe:1.2 nm)/A1(Co$_9$Fe$_1$:0. 6 nm)/B1(Si—N—O:1 nm)/C1(Co$_9$Fe$_1$:5 nm)/AF1(PtMn:15 nm)

Ic average:0.78 mA

The Fifteenth Example

Next, the magnetic cell which has the combination of the reverse type magnetoresistance effect and the reverse type magnetoresistance effect and the magnetic cell which has the combination of the reverse type magnetoresistance effect and the normal type magnetoresistance effect were created and evaluated, as the fifteenth example or the invention.

Figure 46:
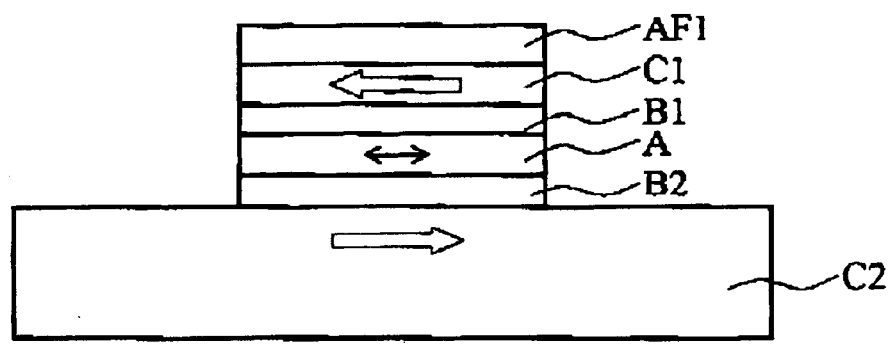
FIG. 46 is a schematic diagram showing the cross-sectional structure of the magnetic cell made in the example of the invention.

FIG. 46 is a schematic diagram showing the cross-sectional structure of the magnetic cell manufactured in this example. In this magnetic cell (sample X), the magnetoresistance effect between the magnetically fixed layer C1 and the recording layer A through the intermediate layer B1 is of the reverse type, and the magnetoresistance effect between the magnetically fixed layer C2 and the recording layer A through the intermediate layer B2 is also of the reverse type.

Figure 47:
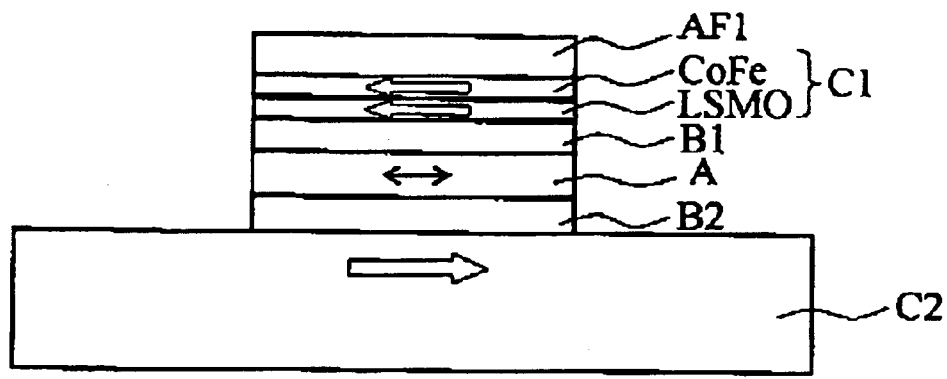
FIG. 47 is a schematic diagram showing the cross-sectional structure of the magnetic cell of the comparative example.

FIG. 47 is a schematic diagram showing the cross-sectional structure of the magnetic cell of the comparative example. In this magnetic cell (sample Y), the magnetoresistance effect between the magnetically fixed layer C1 and the recording layer A through the intermediate layer B1 is of the reverse type, and the magnetoresistance effect between the magnetically fixed layer C2 and the recording layer A through the intermediate layer B2 is of the normal type. The laminated structures of these samples are as follows:

Sample X:

Fe$_3$O$_4$/SrTiO$_3$(STO)/La$_{0.7}$Sr$_{0.3}$MnO$_3$(LSMO)/SrTiO$_3$/CoFe/PtMn

Sample Y:

Fe$_3$O$_4$/SrTiO$_3$(STO)/La$_{0.7}$Sr$_{0.03}$MnO$_3$ (LSMO)/SrTiO$_3$ (STO)/La$_{0.7}$ Sr$_{0.3}$MnO$_3$(LSMO)/CoFe/PtMn

Both resistance of Fe$_3$O$_4$/STO/LSMO and resistance of LSMO/STO/CoFe became large as the magnetic field was applied thereto.

That is, the resistance when the magnetizations of two magnetic layers are parallel became larger than that when the magnetizations of two magnetic layers are anti-parallel. That is, it has checked beforehand that the reverse type magnetoresistance effect was shown.

And, the resistance of LSMO/SrTiO$_3$/LSMO/CoFe became small as the magnetic field was applied threreto. That is, the resistance when the magnetizations of two magnetic layers are parallel became smaller than that when the magnetizations of two magnetic layers are anti-parallel. That is, it has checked beforehand that the normal type magnetoresistance effect was shown.

A single crystal substrate is used for Fe304 which constitutes the lower magnetically fixed layer C2 and is also used as the lower electrode. STO and a LSMO film were grown up on the heating substrate using pulsed laser deposition. And the sample was conveyed to the sputtering chamber without exposure to the air, the CoFe layer and the PtMn layer were formed, and Ta layer was formed as the upper electrode. The substrate was introduced into the annealing furnace in a magnetic field after forming these films. And exchange bias was introduced into the CoFe layer which was adjacent to PtMn, and magnetizations were fixed to one direction.

Next, the element was formed deleting to the lower STO layer by using micro fabrication technique. The element bonded to the Fe$_1$O$_4$ substrate was put on the one side of the magnet with picture frame shape, and the magnetization direction of Fe$_3$O$_4$ was fixed anti-parallel to the magnetization direction of the upper magnetically fixed layer C1.

Thus, the magnetoresistance was measured by passing the current at 77K between the lower electrode of and the upper electrode of sample X and sample Y. The magnetoresistance of sample X was 17% and the magnetoresistance of sample Y was 50%.

Next, the dependencies of the differential resistances on the current were measured in 77K. In the case of sample X, gentle changes in the differential resistance which corresponded to the change in the magnetoresistance were observed at around plus 60 mA and minus 55 mA, respectively.

On the other hand, in the case of sample Y, any significant change in the differential resistance was not observed in the current range from minus 100 mA to plus 100 mA.

As explained above, the magnetic cell (sample X) in which both of the magnetoresistance effect between the magnetically fixed layer C1 and the recording layer A through the intermediate layer B1 and the magnetoresistance effect between the magnetically fixed layer C2 and the recording layer A through the intermediate layer B2 are of the reverse type can be written-in with low power consumption.

On the other hand, the magnetic cell (sample Y) in which the magnetoresistance effect between the magnetically fixed layer C1 and the recording layer A through the Intermediate layer B1 is of the reverse type and the magnetoresistance effect between the magnetically fixed layer C2 and the recording layer A through the intermediate layer B2 is of the normal type can not be written-in with low power consumption. That is, the effect of reducing the writing-in current can not be obtained.

The Sixteenth Example

Next, the magnetic cells (samples XX) having the structure expressed in FIG. 14 was manufactured as the sixteenth example of the invention.

Figure 48:
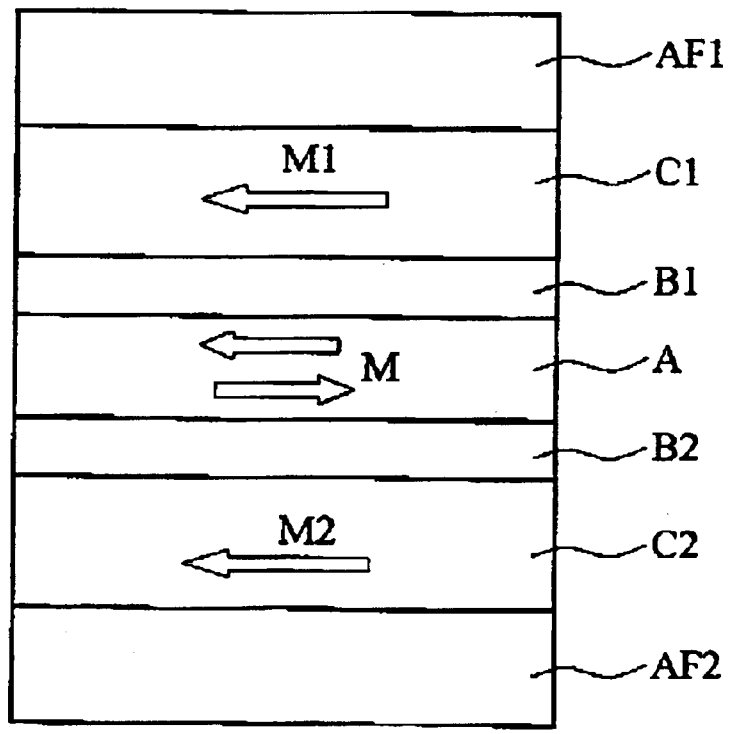
FIG. 48 is a schematic diagram showing the cross-sectional structure of the magnetic cell which has the two magnetically fixed layers C1 and C2 whose magnetizations are parallel.

Moreover, for comparison with the sample XX, the magnetic cell (sample YY) provided two magnetically fixed layers C1 and C2 whose magnetization directions are parallel was manufactured, as expressed in FIG. 48.

First, the magnetic cells (Sample XX, sample YY) manufactured in this example will be explained.

The sample XX (FIG. 14) has the "anti-parallel dual pin structure" which is the structure where PtMn (15 nm) as the antiferromagnetic layer AF2, Co$_9$Fe$_1$ (12 nm) as the magnetically fixed layer C2, Cu (3 nm) as the intermediate-layer B2, Co$_9$Fe$_1$ (2.5 nm) as the magnetic recording layer A, Cu (6 nm) as the intermediate layer B1, Co$_9$Fe$_1$ (6 nm) as the magnetically fixed layer C1, IrMn (15 nm) as the antiferromagnetic layer AF1 and the upper electrode which is not illustrated are laminated in this order on the lower electrode which is not illustrated.

On the other hand, the sample YY (FIG. 48) has the structure where PtMn (15 nm) as the antiferromagnetic layer AF2, $Co_9Fe_1$ (12 nm) as the magnetically fixed layer C2, Ca (4 nm) as the intermediate-layer B2, $Co_9Fe_1$ (2.5 nm) as the magnetic recording layer A, Cu (6 nm) as the intermediate layer B1, $Co_9Fe_1$ (6 nm) as the magnetically fixed layer C1, PtMn (15 nm) as the antiferromagnetic layer AF1 and the upper electrode which is not illustrated are laminated in this order on the lower electrode which is not illustrated.

The two magnetically fixed layers C1 and C2 of the sample XX were fixed anti-parallel, and those of the sample YY were fixed parallel with the following method.

The sample XX was produced with the following procedure.

First, the lower electrode was formed on the wafer. Then, the wafer was put in to the ultrahigh-vacuum sputtering equipment, and sputtering cleaning of the surface was carried out. Then, the multilayer film having the structure of PtMn(15 nm)/$Co_9Fe_1$(12 nm)/Cu(4 nm)/$Co_9Fe_1$(2.5 nm)/Cu(6 nm)/$Co_9F$ $e_1$(6 nm)/IrMn(15 nm) was deposited. This multilayer film was picked out from equipment.

Next, the wafer was put in to the vacuum magnetic field furnace, and annealing in the magnetic field was performed at 270 degrees C. for 10 hours. Then, the exchange biases having the same directions were given to the magnetically fixed layers C1 and C2. Then, the polarity of the magnetic field was reversed after heating down to 240 degrees C. Then, the exchange bias having the reverse direction to the magnetization direction of the magnetically fixed layers C2 were given to the magnetically fixed layers C1 by annealing in the magnetic field for one hour.

Next, the resist was applied and the electron beam exposure was carried out with EB (electron beam) drawing equipment. Then, the mask patterns corresponding to the element sizes mentioned above were formed.

The element was formed by milling these patterns to the top of the magnetically fixed layer C2 with ion-milling equipment.

The form of the element was set up so that the lateral direction of the element might become in parallel with the direction of the exchange bias of the magnetically fixed layers C1 and C2. And $SiO_2$ was embedded in the surroundings of this element, the top electrode was formed, and the magnetic cell was completed.

On the other hand, the sample YY was manufactured with the following procedure.

First, the lower electrode was formed on the wafer. Then, the wafer was put in to the ultrahigh-vacuum sputtering equipment, and sputtering cleaning of the surface was carried out. Then, the multilayer film having the structure of PtMn(15 nm)/$Co_9Fe_1$(12 nm)/Cu(4 nm)/$Co_9Fe_1$(2. 5 nm)/Cu(6 nm)/$Co_9F$ $e_1$(6 nm)/PtMn(15 nm) was deposited. This multilayer film was picked out from equipment.

Next, the wafer was put in to the vacuum magnetic field furnace, and annealing in the magnetic field was performed at 270 degrees C. for 10 hours. Then, the exchange biases were given to the magnetically fixed layers C1 and C2. Next, the resist was applied and the electron beam exposure was carried out with EB (electron beam) drawing equipment. Then, the mask patterns corresponding to the element sizes mentioned above were formed. The element was formed by milling these patterns to the top of the magnetically fixed layer C2 with ion-milling equipment.

The form of the element was set up so that the lateral direction of the element might become in parallel with the direction of the exchange bias of the magnetically fixed layers C1 and C2. And $SiO_2$ was embedded in the surroundings of this element, the top electrode was formed, and the magnetic cell was completed.

The dependencies of the differential resistances on the currents were measured by passing the current between the upper electrode and the lower electrode about two kinds element sizes 50 nm×110 nm and 80 nm×160 nm. And the average values of the critical current Ic were calculated. The result is as the following:

| Sample | Size | Average of critical current Ic (mA) |
| --- | --- | --- |
| XX | 50 nm × 110 nm | 0.70 |
| XX | 80 nm × 160 nm | 1.83 |
| YY | 50 nm × 110 nm | 9.22 |
| YY | 80 nm × 160 nm | Not reversed |

It turns out that the "anti-parallel dual pin structure" expressed in FIG. 14 can be written-in with low current, although the effect of the reduction of the reversal current can not be attained in the dual pin structure as the reference sample whose magnetization directions of the two magnetically fixed layers are parallel. In addition, it was checked that the same tendency as the above is acquired even when Mgo, $SiO_2$, Si—O—N, or $SiO_2$ or $Al_2O_3$ which has holes filled with magnetic materials or conductive metals (Cu, Ag, Au) is used for the intermediate-layer B2 of the sample XX.

The Seventeenth Example

Next, the magnetic memory (Magnetic Random Access Memory:MRAM) which has the magnetic cell of the invention and MOSFET (Metal-Semiconductor-Oxide Field Effect Transistor) will be explained as the seventeenth example of the invention.

FIG. 49A through FIG. 49D are schematic diagrams showing the cross-sectional structures of the memory cells of the magnetic memories of this example. In these figures, the cases where the magnetic cell includes a normal type MR and a normal type MR are shown. The arrows in the figures show the electron flow.

Figure 31:
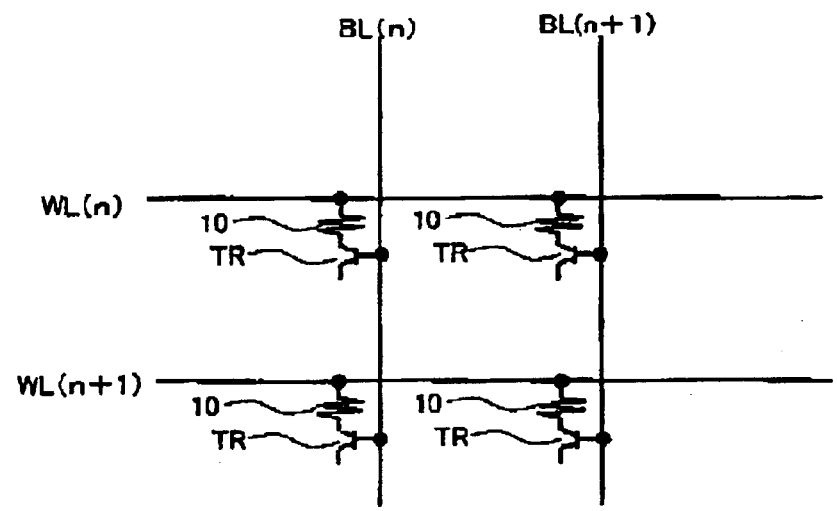
FIG. 31 is a schematic diagram showing the magnetic memory in the sixth example of the invention.

This magnetic memory has the equivalent circuit expressed in FIG. 31 except that the assignment of the bit lines and the word lines is reversed.

That is, this memory cell has the magnetic cell 10 of the invention and MOSFET (TR).

These memory cells are provided in a matrix fashion, and each cell is connected to the bit line BL and the word line WL.

The selection of a specific memory cell is performed by selecting the bit line BL connected to the memory cell, and the word line WL connected to the gate G of MOSFET (TR).

Figure 49A:
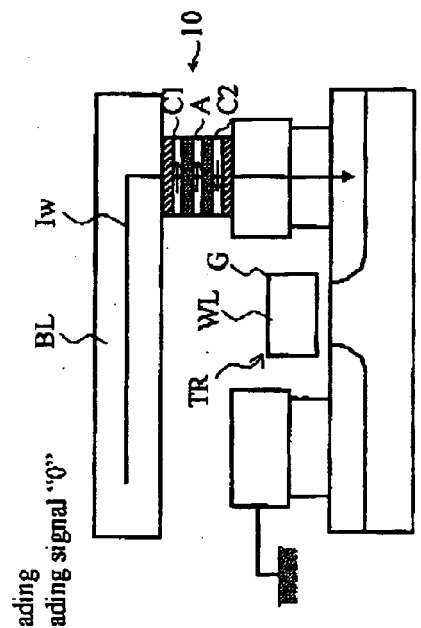
FIGS. 49A through 49D are schematic diagrams showing the cross-sectional structures of the memory cells of the magnetic memories of the example of the invention.
Figure 49B:
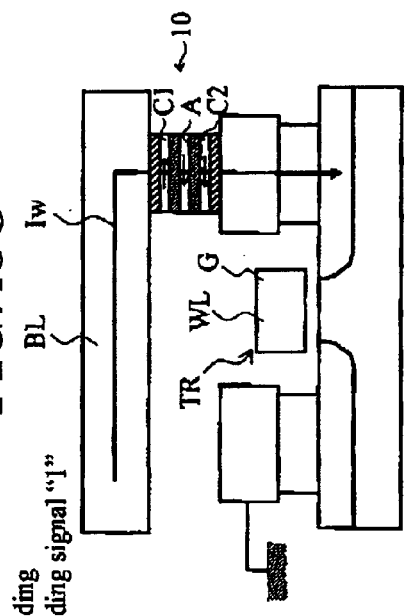

FIG. 49A and FIG. 49B are the schematic diagrams for explaining write-in operation.

That is, the writing to the magnetic cell 10 is performed by passing the current to the magnetic cell 10 through the bit line BL.

Signals are written in the Magnetic recording layer A by passing write-in current Iw larger than magnetization reversal current Ic.

The magnetization of the magnetic recording layer is written in so that the magnetization of the magnetic recording layer may be the same direction to the magnetization direction of the magnetically fixed layer though which the electron passes first.

Therefore, corresponding to the polarity of write-in current Iw, the direction of magnetization of the magnetic recording layer A changes.

With this mechanism, "0" can be written in as expressed in FIG. 49A, and "1" can be written in as expressed in FIG. 49B.

In addition, the assignment of "0" and "1" may be reversed.

Figure 49C:
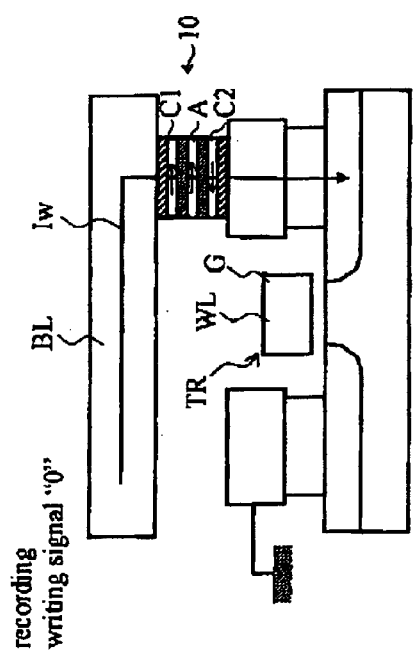
Figure 49D:
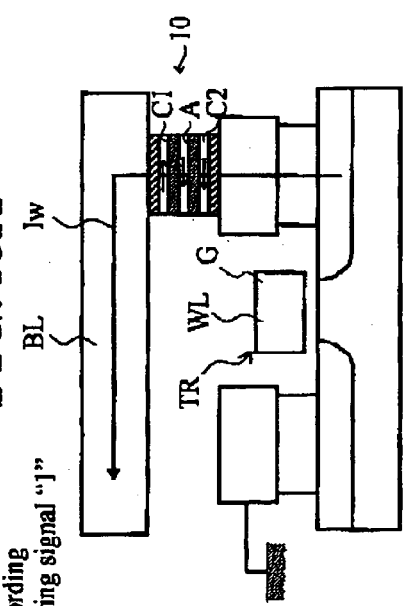

FIG. 49C and FIG. 49D are the schematic diagrams for explaining read-out operation.

The read-out is detected by the quantity of resistance of the magnetic cell 10.

Although either direction of the sense current Ir will be, the quantity of the sense current Ir needs to be made smaller than the magnetization reversal current Ic.

In the structure expressed in FIG. 49A through FIG. 49D, in the case where the resistance through the upper intermediate layer B1 is larger than that through the lower intermediate layer B2, when the sense current Ir is passed through the magnetic cel 10 shown in FIG. 49C the resistance is large and when the sense current Ir is passed through the magnetic cel 10 shown In FIG. 49D the resistance is small.

The read-out is carried out by detecting the difference between these resistances as voltage.

The case expressed in FIG. 49C may be assigned with "0" and the case expressed in FIG. 49D may be assigned with "1", for example.

However, the assignment of "0" and "1" may be reversed.

Hereafter, referring to drawings, the magnetic memory of this example will now be described in detail.

The lower wiring and the lower electrode were formed on the wafer in which MOSFET was formed.

Then, the multilayer film of Ta(5 nm)/Ru(2 nm)/PtMn (15 nm)/$Co_9Fe_1$ (15 nm)/$Al_2O_3$ (0.8 nm)/$Co_9Fe_1$(0.6 nm)/N1Fe (1.2 nm)/$Co_9Fe_1$ (0.6 nm)/Cu(6 nm)/$Co_9Fe_1$ (4 nm)/Ru(1 nm)/$Co_9Fe_1$ (4nm)/PtMn (15 nm) was grown up on it and annealed in the magnetic field in vacuum to introduce the exchange bias to fix the magnetization directions of the magnetic fixed layers.

And a micro fabrication process was performed to this multilayer film, and thus, the element was formed. In the process, the ion milling was stopped at the top of the $Al_2O_3$ layer of the intermediate-layer B2, as expressed in FIG. 50. This is because the etched material may be deposited on the side wall of the $Al_2O_3$ which is to be the intermediate layer B2 in the ion milling process, and the re-deposited material may cause a current leakage.

Figure 50:
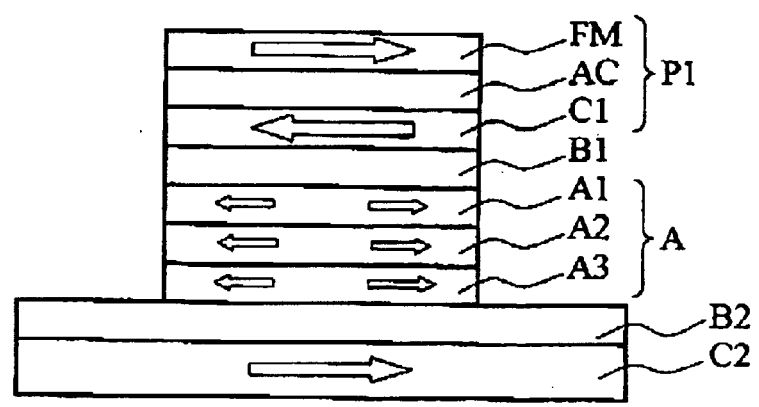
FIG. 50 is the schematic diagram which expresses the structure in which the ion milling is stopped at the top of the $Al_2O_3$ layer of the intermediate-layer B2.

In contrast, if $Al_2O_3$ layer of the intermediate layer B2 is not etched by the ion milling as shown in FIG. 50, the current leakage by the re-deposition can be prevented.

After performing a pattering process to the laminated structure of the magnetic cell, wirings were formed on the upper part thereof and the magnetic memory of the matrix fashion of 2×2 was produced.

In the obtained magnetic memory, any one of the memory cells can be selected by selecting one of the word lines WL and one of the bit lines BL.

Test was performed by setting the write-in current at three levels of (1) a pulse current of plus-or-minus 0.15 mA of 20 milliseconds, (2) a pulse current of plus-or-minus 0.5 mA of 10 milliseconds, and (3) a pulse current of plus-or-minus 2 mA of 0.8 nanoseconds Read-out was performed by passing a sense current of 0.1 mA, and by reading the voltage.

As a result, in the case of using the conditions of the above (1), the resistance change after writing was not seen and it tuned out that the recoding was not performed.

In the case of using the conditions of the above (2), when minus 0.5 mA write-in current Iw was passed first, the resistance was changed from a low resistance state to a high resistance state.

However, even if a writing was tried afterward by using a current pulse with a reversed polarity, resistance had maintained the high resistance state. Thus, it turned out that only one way signal writing could be carried out.

In the case of using the conditions of the above (3), it was possible to change the resistance according to the polarity of write-in current Iw, and thus, "0" signal and "1" signal were able to be written in.

Moreover, it became possible to write-in to the sample which was not written-in by using the condition (2) as mentioned above, by passing the 0.3 mA pulse current for 10 nanoseconds to the word line which is not shown in the figure. This is due to the assistance of magnetic field generated by the additional word line.

As explained above, it was confirmed that the magnetic memory of the invention was suitable for the recordable magnetic memory with low writing current.

In addition, there are other methods of choosing a memory cell in the magnetic memory of the invention besides using MOSFETs.

Figure 51:
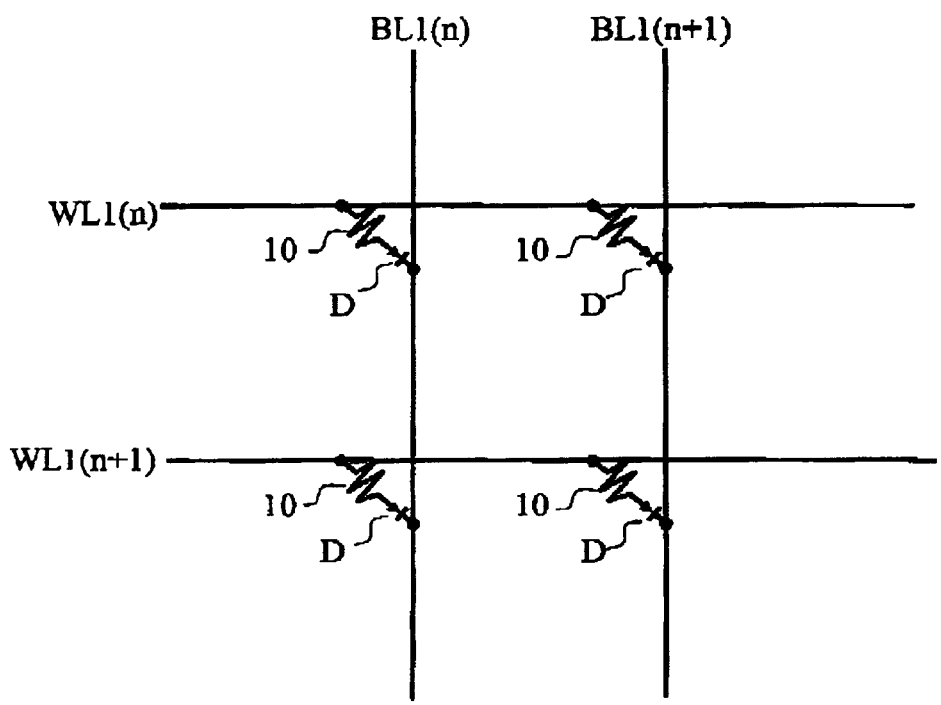
FIG. 51 is a schematic diagram showing the magnetic memory using diodes.

FIG. 51 is a schematic diagram showing the magnetic memory where the diodes are used.

That is, the diode D is connected in series with the magnetic cell 10 of the invention near the crossing of the bit line BL and the word line WL wired in a matrix fashion.

In the case of this magnetic memory, a specific memory cell can be accessed by specifying the word line WL and the bit line BL.

In this case, the diodes D have a role to intercept the current component which flows other memory cells connected to the selected word line WL and/or the selected bit line BL.

The Eighteenth Example

Next, the probe access type magnetic memory shown in FIG. 26 will be explained as the eighteenth example of the invention.

As the example, the magnetic element for recording and reproduction shown in 27 was formed on the substrate.

First, after forming lower wiring on the wafer, the bottom electrode EL2 by which common connection is made was formed. And on this wafer, the multilayer film of laminated structure of Ta(5 nm)/Ru(2 nm)/PtMn(15 nm)/$Co_9Fe_1$(15 nm)/$Al_2O_3$(0.8 nm)/$Co_9Fe_1$(2 nm)/Cu(6 nm)/$Co_9Fe_1$(4 nm)/Ru(1 nm)/$Co_9Fe_1$ (4 nm)/PtMn(15 nm)/Pt (2 nm) was formed.

The mask for cells was formed by applying and heat-treating the polymers of two-phase-separation type to this multilayer film.

Next, a patterned medium can be formed by performing an ion milling.

The ion milling was stopped at the bottom of the magnetic recording layer $Co_9Fe_1$ (2 nm), thus a structure was obtained where the intermediate layer B2 ($A_2O_3$ (0.8 nm)) and the magnetically fixed layer C2 ($Co_9Fe_1$ (15 nm)) were shared by a plurality of magnetic cells.

In this structure, since patterning of intermediate layer B2 is not carried out, a formation of an unexpected current path by re-deposition to the side wall of the intermediate layer B2 can be prevented. Moreover, the homogeneity of cell resistances can be acquired.

Thus, a plurality of magnetic cells with a diameter of about 28 nm were formed.

Figure 27:
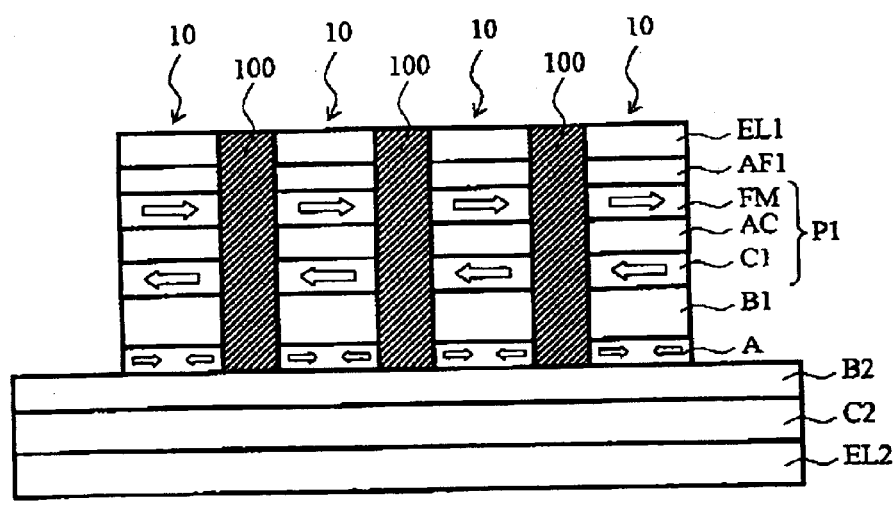
FIG. 27 is a schematic diagram showing a structure in which the cells 10 share the layers of their cells.

Next, by embedding the insulator 100 between the magnetic cells, the structure shown in FIG. 27 was completed.

To a plurality of magnetic cells 10, a probe 200 is made to scan and any one of the cells can be chosen by making the probe contact thereto.

First, a signal "1" was written in the cell 1 by passing a plus 0.2 mA current thereto, and a signal "0" was written in the cell 2 by passing a minus 0.2 mA current thereto. Here, the direction of the current where electrons flow from the upper (top) electrode to the lower (bottom) electrode is defined to correspond to the polarity of plus.

Furthermore, a signal "1" was written in the cell 3 by passing a plus 0.2 mA current thereto, and a signal "0" was written in the cell 4 by passing a minus 0.2 mA current thereto.

Next, a read-out was performed. That is, resistance of each cell was investigated by passing a sense current of plus 0.03 mA. Consequently, the detected resistances were two-valued and a high resistance, a low resistance, a high resistance, and a low resistance were observed for the cell 1 through cell 4, respectively. That is, it was confirmed that "1" or "0" signal was written in each cell.

In addition, when the write-in current was plus-or-minus 0.05 mA, a stable signal writing was not made.

As explained above, it was confirmed that the magnetic memory of this example was suitable for the recordable magnetic memory with low writing current.

Heretofore, the embodiments of the present invention have been explained, referring to the examples.

However, the present invention is not limited to these specific examples.

For example, the size and material of each element which constitutes the magnetic cell, and the form and the quality of electrodes, passivation and insulated structure may be appropriately selected by those skilled in the art with the known techniques to carry out the invention as taught in the specification and obtain equivalent effects.

Moreover, the antiferromagnetic layer, the magnetically fixed layer, the intermediate layer, the magnetic recording layer, and the insulating layer in the magnetic cell may have single layer, or two or more layers.

Further, also concerning the magnetic cell and the magnetic memory according to the invention, those skilled in the art will be able to carry out the invention appropriately selecting a material or a structure within known techniques.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetic cell comprising:
   a first ferromagnetic layer whose magnetization is substantially fixed in a first direction;
   a second ferromagnetic layer whose magnetization is substantially fixed in a second direction opposite to the first direction;
   a third ferromagnetic layer provided between the first and the second ferromagnetic layers, a direction of magnetization of the third ferromagnetic layer being variable;
   a first intermediate layer provided between the first and the third ferromagnetic layers; and
   a second intermediate layer provided between the second and the third ferromagnetic layers,
   the direction of magnetization of the third ferromagnetic layer being determined under an influence of spin-polarized electrons upon the third ferromagnetic layer by passing a current between the first and the second ferromagnetic layers.

2. The magnetic cell according to claim 1, wherein an easy axis of magnetization of the third ferromagnetic layer is substantially in parallel to the first direction.

3. The magnetic cell according to claim 1, wherein an electric resistance between the first and the third ferromagnetic layers takes a first value when the direction of magnetization of the third layer is substantially same as the first direction, the electric resistance between the first and the third ferromagnetic layers takes a second value larger than the first value when the direction of magnetization of the third layer is substantially same as the second direction,
   an electric resistance between the second and the third ferromagnetic layers takes a third value when the direction of magnetization of the third layer is substantially same as the second direction, and the electric resistance between the second and the third ferromagnetic layers takes a fourth value larger than the third value when the direction of magnetization of the third layer is substantially same as the first direction.

4. The magnetic cell according to claim 1, wherein the direction of magnetization of the third ferromagnetic layer is determined to be the first direction when an electric current is passed from the first ferromagnetic layer to the second ferromagnetic layer via the third ferromagnetic layer, and
   the direction of magnetization of the third ferromagnetic layer is determined to be the second direction when an electric current is passed from the second ferromagnetic layer to the first ferromagnetic layer via the third ferromagnetic layer.

5. The magnetic cell according to claim 1, wherein an electric resistance between the first and the third ferromagnetic layers takes a first value when the direction of magnetization of the third layer is substantially same as the first direction, the electric resistance between the first and the third ferromagnetic layers takes a second value smaller than the first value when the direction of magnetization of the third layer is substantially same as the second direction,
   an electric resistance between the second and the third ferromagnetic layers takes a third value when the direction of magnetization of the third layer is substantially same as the second direction, and the electric resistance between the second and the third ferromagnetic layers takes a fourth value smaller than the third value when the direction of magnetization of the third layer is substantially same as the first direction.

6. The magnetic cell according to claim 1, wherein an electric resistance of the first intermediate layer and an electric resistance of the second intermediate layer are different.

7. The magnetic cell according to claim 1, wherein one of the first and the second intermediate layers is made of an insulating material having a pinhole, and the pinhole is filled by at least one of materials of the adjoining ferromagnetic layers.

8. The magnetic cell according to claim 1, wherein the magnetization of at least one of the first and the second ferromagnetic layers is fixed by an adjoining antiferromagnetic layer.

9. The magnetic cell according to claim 1, wherein a nonmagnetic layer, a fourth ferromagnetic layer and an antiferromagnetic layer are laminated in this order to adjoin at least one of the first and the second ferromagnetic layers, and magnetizations of the ferromagnetic layers adjoining both sides of the nonmagnetic layer are fixed in a same direction.

10. The magnetic cell according to claim 1, wherein a nonmagnetic layer, a fourth ferromagnetic layer and an antiferromagnetic layer are laminated in this order to adjoin at least one of the first and the second ferromagnetic layers, and magnetizations of the ferromagnetic layers adjoining both sides of the nonmagnetic layer are fixed in mutually opposite directions.

11. The magnetic cell according to claim 1, wherein the third ferromagnetic layer has a laminated structure where a plurality of layers made of a ferromagnetic material are laminated.

12. The magnetic cell according to claim 1, wherein one of the first and the second intermediate layers is made of an conductive material and other of the first and the second intermediate layers is made of an insulating material.

13. A magnetic cell comprising:
a first magnetically fixed part including a first ferromagnetic layer whose magnetization is substantially fixed in a first direction;
a second magnetically fixed part including a second ferromagnetic layer whose magnetization is substantially fixed in a second direction opposite to the first direction;
a third ferromagnetic layer provided between the first and the second magnetically fixed part, a direction of magnetization of the third ferromagnetic layer being variable;
a first intermediate layer provided between the first magnetically fixed part and the third ferromagnetic layer; and
a second intermediate layer provided between the second magnetically fixed part and the third ferromagnetic layer,
an easy axis of magnetization of the third ferromagnetic layer being substantially in parallel to the first direction,
at least one of the first and the second magnetically fixed parts including a laminated structure where ferromagnetic layers and at least one nonmagnetic layer are laminated in turn and the ferromagnetic layers are antiferromagnetically coupled via the nonmagnetic layer,
the first ferromagnetic layer adjoining the first intermediate layer,
The second ferromagnetic layer adjoining the second intermediate layer, and
the direction of magnetization of the third ferromagnetic layer being determined under an influence of spin-polarized electrons upon the third ferromagnetic layer by passing a current between the first and the second magnetically fixed parts.

14. The magnetic cell according to claim 13, wherein a number of the ferromagnetic layers of one of the first and the second magnetically fixed parts is even, and a number of the ferromagnetic layers of other of the first and the second magnetically fixed parts is odd.

15. The magnetic cell according to claim 14, further comprising a substrate on which the first and the second magnetically fixed parts, the third ferromagnetic layer, and the first and the second intermediate layers are laminated,
a number of the ferromagnetic layers of one of the first and the second magnetically fixed parts which is provided remoter from the substrate than other of the first and the second magnetically fixed parts is even.

16. The magnetic cell according to claim 13, wherein the third ferromagnetic layer has a laminated structure where a plurality of layers made of a ferromagnetic material are laminated.

17. The magnetic cell according to claim 13, wherein one of the first and the second intermediate layers is mad of an conductive material and other of the first and the second intermediate layers is made of an insulating material.

18. A magnetic memory comprising a memory cell where a plurality of magnetic cells are arranged in a matrix fashion, each of the magnetic cells being separated by an insulator from other memory cells,
each of the magnetic cells having:
a first ferromagnetic layer whose magnetization is substantially fixed in a first direction;
a second ferromagnetic layer whose magnetization is substantially fixed in a second direction opposite to the first direction;
a third ferromagnetic layer provided between the first and the second ferromagnetic layers, a direction of magnetization of the third ferromagnetic layer being variable;
a first intermediate layer provided between the first and the third ferromagnetic layers; and
a second intermediate layer provided between the second and the third ferromagnetic layers,
the direction of magnetization of the third ferromagnetic layer being determined under an influence of spin-polarized electrons upon the third ferromagnetic layer by passing a current between the first and the second ferromagnetic layers.

19. The magnetic memory according to claim 18, further comprising a probe to get access to each of the magnetic cells of the memory cell.

20. The magnetic memory according to claim 18, wherein one of word lines and one of bit lines are connected to each of the magnetic cells of the memory cell, and recording or reproduction with a specific magnetic cell is made possible by selecting one of the word lines and one of the bit lines.

21. A magnetic memory comprising a memory cell where a plurality of magnetic cells are arranged in a matrix fashion, each of the magnetic cells being separated by an insulator from other memory cells,
each of the magnetic cells having:
a first magnetically fixed part including a first ferromagnetic layer whose magnetization is substantially fixed in a first direction;
a second magnetically fixed part including a second ferromagnetic layer whose magnetization is substantially fixed in a second direction opposite to the first direction;
a third ferromagnetic layer provided between the first and the second magnetically fixed part, a direction of magnetization of the third ferromagnetic layer being variable;
a first intermediate layer provided between the first magnetically fixed part and the third ferromagnetic layer; and
a second intermediate layer provided between the second magnetically fixed part and the third ferromagnetic layer, an easy axis of magnetization of the third ferromagnetic layer being substantially in parallel to the first direction, at least one of the first and the second magnetically fixed parts including a laminated structure where ferromagnetic layers and at least one nonmagnetic layer are laminated in turn and the ferromagnetic layers are antiferromagnetically coupled via the nonmagnetic layer, the first ferromagnetic layer adjoining the first intermediate layer, the second ferromagnetic layer adjoining the second intermediate layer, and the direction of magnetization of the third ferromagnetic layer being determined under an influence of spin-polarized electrons upon the third ferromagnetic layer by passing a current between the first and the second magnetically fixed parts.

22. The magnetic memory according to claim 21, farther comprising a probe to get access to each of the magnetic cells of the memory cell.

23. The magnetic memory according to claim 21, wherein one of word lines and one of bit lines are connected to each of the magnetic cells of the memory cell, and recording or reproduction with a specific magnetic cell is made possible by selecting one of the word lines and one of the bit lines.

* * * * *